United States Patent
Mirhaj et al.

(10) Patent No.: US 12,135,956 B2
(45) Date of Patent: Nov. 5, 2024

(54) ANALOG ADDERS FOR MULTI-BIT MAC ARRAYS IN RECONFIGURABLE ANALOG BASED NEURAL NETWORKS

(71) Applicant: QUALCOMM Incorporated, San Diego, CA (US)

(72) Inventors: Seyed Arash Mirhaj, Poway, CA (US); Ankit Srivastava, San Diego, CA (US); Sameer Wadhwa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 911 days.

(21) Appl. No.: 17/197,359

(22) Filed: Mar. 10, 2021

(65) Prior Publication Data
US 2022/0291900 A1  Sep. 15, 2022

(51) Int. Cl.
*G06F 7/544* (2006.01)
*G06G 7/14* (2006.01)
*G06G 7/16* (2006.01)

(52) U.S. Cl.
CPC .............. *G06F 7/5443* (2013.01); *G06G 7/14* (2013.01); *G06F 2207/4814* (2013.01); *G06G 7/16* (2013.01)

(58) Field of Classification Search
CPC .............. G06G 7/14–16; G06F 7/5443; G06F 2207/4814
See application file for complete search history.

(56) References Cited

U.S. PATENT DOCUMENTS

| 8,059,022 B2 | 11/2011 | Cho et al. |
| 2001/0000661 A1 | 5/2001 | Miyamoto |
| 2017/0220924 A1 | 8/2017 | Danjo et al. |
| 2018/0095748 A1* | 4/2018 | Buchanan ............. G06F 7/5443 |
| 2019/0213471 A1 | 7/2019 | Jeon et al. |
| 2020/0083936 A1* | 3/2020 | Gupta .................. H04B 1/1081 |
| 2020/0356620 A1* | 11/2020 | Yen ......................... G06F 17/16 |
| 2022/0113942 A1* | 4/2022 | Yen ........................ G06F 7/5443 |

FOREIGN PATENT DOCUMENTS

WO    2018119785 A1    7/2018

OTHER PUBLICATIONS

International Search Report and Written Opinion—PCT/US2022/019640—ISA/EPO—May 27, 2022; 15 pages.

* cited by examiner

*Primary Examiner* — Matthew D Sandifer
(74) *Attorney, Agent, or Firm* — QUALCOMM Incorporated

(57) ABSTRACT

Various embodiments include devices and methods for a multi-bit multiplier-accumulator (MAC). Some embodiments may include an analog adder having a first adder capacitor. The first adder capacitor may add a plurality of single-bit MAC outputs by receiving the plurality of single-bit MAC outputs from a plurality of single-bit MACs, and storing the plurality of single-bit MAC outputs. In some embodiments, the analog adder may output a multi-bit MAC output based on addition of the stored plurality of single-bit MAC outputs.

28 Claims, 13 Drawing Sheets

ANALOG ADDERS FOR MULTI-BIT MAC ARRAYS IN RECONFIGURABLE ANALOG BASED NEURAL NETWORKS

BACKGROUND

Neural networks are increasingly being used in a variety of computing devices. Power efficiency of these neural networks is an important aspect of neural network implementations in computing devices. Digital computations in neural network implementations proves to be inefficient for many applications. Analog neural networks are implemented as more power efficient alternatives. However, performance improvements have been demonstrated for analog binary neural networks, while analog multi-bit neural networks suffer from computational performance bottle necks when executing analog calculations and lack flexibility for calculations using varying bit width inputs.

SUMMARY

Various disclosed embodiments may include apparatuses and methods for multi-bit multiplication and accumulation. Embodiments include a multi-bit multiplier-accumulator (MAC) having an analog adder having a first adder capacitor, in which the first adder capacitor is configured to add a plurality of single-bit MAC outputs by receiving the plurality of single-bit MAC outputs from a plurality of single-bit MACs, and store the plurality of single-bit MAC outputs, and in which the analog adder is configured to output a multi-bit MAC output based on addition of the stored plurality of single-bit MAC outputs.

In some embodiments, the plurality of single-bit MACs are each configured to sequentially multiply individual bits of a first multi-bit value and a different single bit of a second multi-bit value, in which the first multi-bit value and the second multi-bit value are represented by digital voltages, and accumulate results of the multiplications to generate the plurality of single-bit MAC outputs, in which the plurality of single-bit MAC outputs are analog voltages.

Some embodiments may further include a plurality of single-bit MAC switches, in which a first single-bit MAC switch of the plurality of single-bit MAC switches is configured to selectively electrically connect a first single-bit MAC of the plurality of single-bit MACs and the first adder capacitor as controlled by a control device. In some embodiments, the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor, and the analog adder comprises an operational amplifier having an input end and an output end, in which the first adder capacitor is electrically connected between the input end and output end, and the operational amplifier is configured to receive the plurality of single-bit MAC outputs at the input end, add the plurality of single-bit MAC outputs producing a weighted average of the plurality of single-bit MAC outputs, and output the weighted average of the plurality of single-bit MAC outputs as an analog voltage to an analog to digital converter. In some embodiments, the analog adder is configured such that adding a plurality of single-bit MAC outputs comprises adding the plurality of single-bit MAC outputs producing the weighted average of the plurality of single-bit MAC outputs, and storing the plurality of single-bit MAC outputs comprises storing the weighted average of the plurality of single-bit MAC outputs. In some embodiments, the analog adder is configured such that outputting a multi-bit MAC output comprises outputting the weighted average of the plurality of single-bit MAC outputs.

In some embodiments, the analog adder comprises a plurality of designated capacitors in which a first designated capacitor of the plurality of designated capacitors is electrically connected between the first single-bit MAC switch and the first adder capacitor, and the first designated capacitor has a capacitor rating of $2^r$ in which r is a location in a weight value of a bit multiplied by bits of an activation value used in producing the first single-bit MAC output, and the first designated capacitor is configured to receive the first single-bit MAC output, weight the first single-bit MAC output, and output the weighted first single-bit MAC output. In some embodiments, the operational amplifier is configured such that receiving the plurality of single-bit MAC outputs comprises receiving the weighted first single-bit MAC output, and adding the plurality of single-bit MAC outputs comprises adding the weighted first single-bit MAC output.

Some embodiments may further include a plurality of single-bit MAC switches, in which a first single-bit MAC switch of the plurality of single-bit MAC switches is configured to selectively electrically connect a first single-bit MAC of the plurality of single-bit MACs and the first adder capacitor as controlled by a control device. In some embodiments, the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor, the analog adder further comprises a plurality of adder capacitors, including the first adder capacitor associated with the first single-bit MAC, in which the first adder capacitor has a capacitor rating of $2^r$, and in which r is a location in a weight value of a bit multiplied by bits of an activation value used in producing the first single-bit MAC output by the first single-bit MAC. In some embodiments, the first adder capacitor is configured to weight the first single-bit MAC output, in which the analog adder is configured such that storing the plurality of single-bit MAC outputs comprises storing the weighted first single-bit MAC output, and output the weighted first single-bit MAC output. In some embodiments, the analog adder comprises a plurality of adder switches including a first adder switch associated with the first adder capacitor, in which the first adder switch is configured to selectively electrically connect the first adder capacitor to the first single-bit MAC via the first single-bit MAC switch as controlled by the control device, and selectively electrically connect the first adder capacitor to an electrical transmission bus concurrently with a second adder switch of the plurality of adder switches selectively electrically connecting a second adder capacitor of the plurality of adder capacitors to the electrical transmission bus as controlled by the control device outputting the weighted first single-bit MAC output from the first adder capacitor and producing a weighted average of a plurality of weighted single-bit MAC outputs, including the weighted first single-bit MAC output. In some embodiments, the analog adder is configured such that outputting a multi-bit MAC output comprises outputting the weighted average of the plurality of weighted single-bit MAC outputs.

Some embodiments further comprises a buffer electrically connected between the plurality of single-bit MAC switches and the plurality of adder switches.

Some embodiments may further include a plurality of single-bit MAC switches, in which a first single-bit MAC switch of the plurality of single-bit MAC switches is configured to selectively electrically connect a first single-bit MAC of the plurality of single-bit MACs and the first adder capacitor as controlled by a control device. In some embodiments, the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor, the analog adder comprises a plurality of adder switches, including a first adder switch of the plurality of adder switches associated with the first adder capacitor, and a second adder capacitor, in which the second adder capacitor is associated with a second adder switch of the plurality of adder switches, and the first adder capacitor and the second adder capacitor have the same capacitance rating. In some embodiments, the first adder switch is configured to selectively electrically connect the first adder capacitor to the plurality of single-bit MACs via the plurality of single-bit MAC switches as controlled by the control device, and selectively electrically connect the first adder capacitor to an electrical transmission bus as controlled by the control device. In some embodiments, the second adder switch is configured to selectively electrically connect the second adder capacitor to the electrical transmission bus concurrently with the first adder capacitor as controlled by the control device sharing the plurality of single-bit MAC outputs between the first adder capacitor and the second adder capacitor, and selectively electrically connect the second adder capacitor to an analog to digital converter outputting the shared plurality of single-bit MAC outputs. In some embodiments, the analog adder is configured such that outputting a multi-bit MAC output comprises outputting the shared plurality of single-bit MAC outputs.

In some embodiments, the analog adder comprises a buffer electrically connected between the plurality of single-bit MAC switches and the plurality of adder switches.

Some embodiments may further include a plurality of single-bit MAC switches, in which a first single-bit MAC switch of the plurality of single-bit MAC switches is configured to selectively electrically connect a first single-bit MAC of the plurality of single-bit MACs and the first adder capacitor as controlled by a control device. In some embodiments, the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor, the analog adder comprises a second adder capacitor, in which the first adder capacitor and the second adder capacitor have the same capacitance rating, an adder switch configured to selectively electrically connect the first adder capacitor and the second adder capacitor as controlled by the control device sharing the plurality of single-bit MAC outputs between the first adder capacitor and the second adder capacitor, in which the second adder capacitor is configured to output the shared plurality of single-bit MAC outputs to an analog to digital converter. In some embodiments, the analog adder is configured such that outputting a multi-bit MAC output comprises outputting the shared plurality of single-bit MAC outputs.

Some embodiments include a multi-bit MAC, comprising an analog adder having a plurality of adder capacitors, including a first adder capacitor, a plurality of single-bit MAC switches, including a first single-bit MAC switch configured to selectively electrically connect a first single-bit MAC of a plurality of single-bit MACS and the first adder capacitor as controlled by a control device, in which the first adder capacitor is configured to add a first plurality of single-bit MAC outputs by receiving the first plurality of single-bit MAC outputs from the first single-bit MAC in response to the first single-bit MAC switch selectively electrically connecting the first single-bit MAC and the first adder capacitor, and storing the first plurality of single-bit MAC outputs, and in which the analog adder is configured to output a multi-bit MAC output based on addition of the stored first plurality of single-bit MAC outputs.

In some embodiments, the plurality of adder capacitors comprises a second adder capacitor and a third adder capacitor, in which the cumulative capacitance rating of a pair of the second adder capacitor and the third adder capacitor is the same as a capacitance rating of the first adder capacitor, and the analog adder further comprises a plurality of adder switches, including a first adder switch configured to selectively electrically connect the first adder capacitor and the second adder capacitor as controlled by the control device sharing the first plurality of single-bit MAC outputs between the first adder capacitor and the second adder capacitor, a second adder switch configured to selectively electrically connect the second adder capacitor and the third adder capacitor as controlled by the control device sharing the shared first plurality of single-bit MAC outputs between the second adder capacitor and the third adder capacitor, in which the third adder capacitor is configured to weight the shared first plurality of single-bit MAC outputs, and a third adder switch configured to selectively electrically connect the third adder capacitor to an analog to digital converter via an electrical transmission bus as controlled by the control device outputting the weighted shared first plurality of single-bit MAC outputs to the analog to digital converter concurrently with another third adder capacitor of the plurality of adder capacitors outputting a weighted shared second plurality of single-bit MAC outputs to the analog to digital converter via the electrical transmission bus combining the weighted shared first plurality of single-bit MAC outputs and the weighted shared second plurality of single-bit MAC outputs into a weighted average of the shared pluralities of single-bit MAC outputs. In some embodiments, the analog adder is configured such that outputting a multi-bit MAC output includes outputting the weighted average of the shared pluralities of single-bit MAC outputs.

In some embodiments, the plurality of adder capacitors further comprises a second adder capacitor, and the analog adder further comprises a plurality of adder switches, including a first adder switch configured to selectively electrically connect the first adder capacitor and the second adder capacitor as controlled by the control device sharing the first plurality of single-bit MAC outputs between the first adder capacitor and the second adder capacitor, and a second adder switch configured to selectively electrically connect the second adder capacitor to another second adder capacitor as controlled by the control device via an electrical transmission bus.

In some embodiments, the first adder switch is configured such that selectively electrically connecting the first adder capacitor and the second adder capacitor as controlled by the control device sharing the first plurality of single-bit MAC outputs between the first adder capacitor and the second adder capacitor comprises dividing the first plurality of single-bit MAC outputs in half for each of the first adder capacitor and the second adder capacitor, the analog adder is configured to clear the first adder capacitor of the half of the first plurality of single-bit MAC outputs, and the first adder switch is configured to selectively electrically connect the first adder capacitor and the second adder capacitor as controlled by the control device sharing the half of the first plurality of single-bit MAC outputs between the first adder capacitor and the second adder capacitor dividing the half of the first plurality of single-bit MAC outputs in half for each of the first adder capacitor and the second adder capacitor producing a plurality of a quarter of the first plurality of single-bit MAC.

In some embodiments, the plurality of adder switches comprises another first adder switch, in which the another first adder switch is configured to selectively electrically connect another first adder capacitor and the another second adder capacitor as controlled by the control device while the second adder switch selectively electrically connects the second adder capacitor and the another second adder capacitor.

In some embodiments, the plurality of adder switches comprises another first adder switch, in which the another first adder switch is configured to selectively electrically disconnect another first adder capacitor and the another second adder capacitor as controlled by the control device while the second adder switch selectively electrically connects the second adder capacitor and the another second adder capacitor.

Further embodiments include methods of performing operations of the device functions summarized above. Further aspects include a multi-bit MAC having means for performing functions of any of the device functions summarized above.

BRIEF DESCRIPTION OF THE DRAWINGS

The accompanying drawings, which are incorporated herein and constitute part of this specification, illustrate example aspects of various embodiments, and together with the general description given above and the detailed description given below, serve to explain the features of the claims.

DETAILED DESCRIPTION

Figure 1:
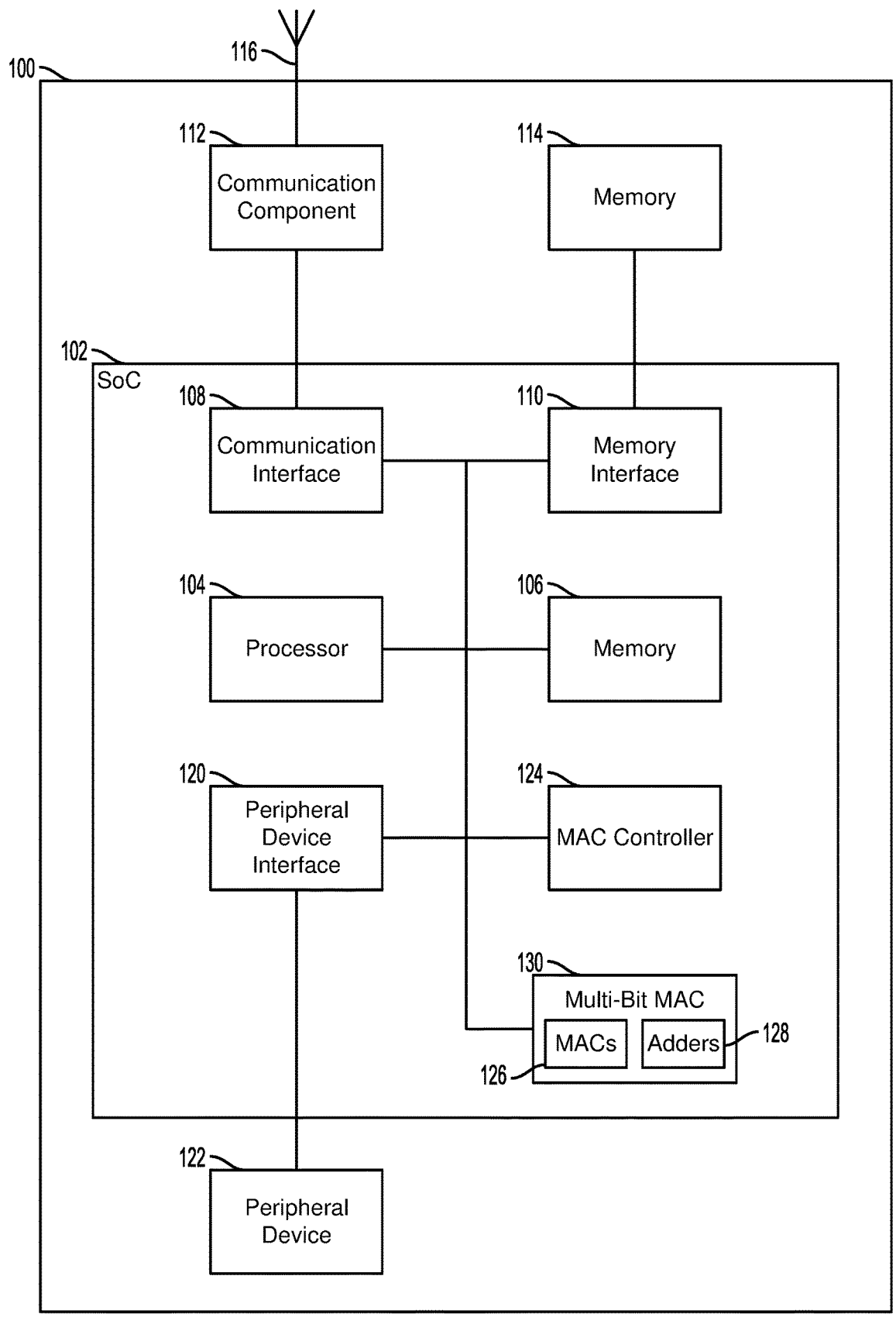
FIG. 1 is a component block diagram illustrating an example computing device suitable for implementing various embodiments.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various aspects may include devices for implementing analog adders for multiplier-accumulator ("MAC") arrays in reconfigurable analog based neural networks, and methods of operating such devices. Some embodiments may include switched capacitive accumulation of analog signals for analog MAC arrays. Some embodiments may include sequential accumulation of analog signals of weighted activation bits for analog MAC arrays. Some embodiments may include flexible analog adders for variable bit width accumulation for analog MAC arrays. Some embodiments may include analog adders using capacitive charge sharing in different combinations to achieve multi-bit MAC operations from inputs of single-bit MAC operation results.

The terms "multiplier-accumulator" and "MAC" are used interchangeably herein to refer to components of a computing device configured to implement or simulate the functions of multiplication and accumulation of any number and combination of bits. For example, a single-bit MAC may implement or simulate the functions of single-bit multiplication and accumulation. As another example, a multi-bit MAC may implement or simulate the functions of multi-bit multiplication and accumulation. As used herein, a MAC may implement or simulate the functions of multiplication and accumulation at least partially in an analog voltage domain.

The terms "store", "charge", and "load" are used interchangeably herein to refer to a voltage received by and held in a capacitor, as an analog value may be "stored" by connecting a capacitor to an input voltage thereby charging the capacitor. The terms "output", "share", and "discharge" are used interchangeably herein with reference to a voltage provided by a capacitor through discharging the capacitor by connecting it to an output line. The terms "accumulate", "add", and "sum", are used interchangeably herein with reference to voltages stored in a capacitor or capacitor array.

The terms "processor," "processor core," "controller," and "control device" are used interchangeably herein, unless otherwise noted, to refer to any one or all of a software-configured processor, a hardware-configured processor, a general purpose processor, a dedicated purpose processor, a single-core processor, a homogeneous multi-core processor, a heterogeneous multi-core processor, a core of a multi-core processor, a microprocessor, a central processing unit (CPU), a graphics processing unit (GPU), a digital signal processor (DSP), etc., a controller, a microcontroller, a field programmable gate array (FPGA), an application-specific integrated circuit (ASIC), other programmable logic devices, discrete gate logic, transistor logic, and the like. A processor may be an integrated circuit, which may be configured such that the components of the integrated circuit reside on a single piece of semiconductor material, such as silicon.

The terms "computing device" and "mobile computing device" are used interchangeably herein to refer to any one or all of cellular telephones, smartphones, personal or mobile multi-media players, personal data assistants (PDA's), laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory, and a programmable processor. The term "computing device" may further refer to stationary computing devices including personal computers, desktop computers, all-in-one computers, workstations, super computers, mainframe computers, embedded computers, servers, home theater computers, and game consoles.

Compute-in-memory (CIM) and near memory compute (NMC) systems are deployed in computing devices for fast processing of data for neural networks. A CIM or NMC system uses a memory device, such as a static random access memory (SRAM), modified to implement certain operations, such as matrix multiplication. The matricies may be activation and weight matricies for neural networks. Some CIM and NMC systems may include memory cells, each of which may be configured to store a single-bit value and to multiply an input single-bit value by the stored single-bit value. Some CIM and NMC systems may include memory cells, each of which may be configured to store a multi-bit value and to multiply an input single-bit value by the stored multi-bit value. The CIM and NMC multiplication of matricies can save energy and time compared to processor based multiplication by avoiding loading operations of values to the memory for every operation. The results of the multiplications may be output to and accumulated by an analog-to-digital converter. The combination of the CIM or NMC system and the analog-to-digital converter may function as an analog MAC.

Analog MACs have shown promising performance in binary neural networks using single bit width activation and weight values. However, analog MACs have proven inefficient for multi-bit width activation and/or weight values because of computational performance bottle necks when executing analog calculations and lack flexibility for calculations using varying bit width inputs. Implementing switched capacitive accumulation for analog MAC arrays may result in higher flexibility and efficiency for deep neural networks.

Embodiments described herein solve the foregoing issues of analog adders using analog adders that may be implemented using switched capacitive accumulation using switched capacitors. In some embodiments, the analog adders may use any number and combination of configurations of switched capacitors. The various configurations of switched capacitors may include switched capacitors as an integrator capacitor using thermal code based weight, an integrator capacitor using hardwired binary weight, a binary digital-to-analog converter (DAC), and a sequential binary accumulator. Analog adders may be configured for switched capacitive accumulation of voltage representations of outputs of analog MAC arrays.

Analog MAC arrays may be implemented by electrically connecting "m" number of single-bit MACs' outputs to "p" number of capacitors. Each of the single-bit MACs may multiply "n" number of activation value bits by one of "m" number of weight value bits, accumulate the results of the multiplication, and output the results of the multiplication and accumulation as a voltage. In some embodiments, at least one of the activation value and the weight value may be a multi-bit width value. The multiplication may be implemented so that each bit of an activation value is multiplied by a bit of a weight value. The activation values may be input to the single-bit MACs sequentially, bit-by-bit, from a least significant bit to a most significant bit, and each single-bit MAC may multiply each input bit by a weight value bit. The single-bit MAC may accumulate the results of the multiplications. Each single-bit MAC may output the result of each multiplication and accumulation, referred to herein as a single-bit MAC output. The various embodiments and examples herein are described in terms of single-bit MAC outputs resulting from each single-bit MAC multiplying multiple bits of a multi-bit activation value and a bit of a multi-bit weight value. However, the various embodiments and examples may also be implemented using single-bit MAC outputs resulting from each single-bit MAC multiplying a bit of a multi-bit activation value and multiple bits of a multi-bit weight value.

A multi-bit MAC may be implemented by electrically connecting the analog MAC array of single-bit MACs to any number and combination of analog adders. The single-bit MACs may be selectively electrically connected via switches to the capacitors, which may function as the analog adder by summing the voltage outputs of the single-bit MACs. The switches may include any type of electronically controlled switch, such as a relay and/or a transistor. The switches may control when the single-bit MAC outputs may be electrically connected to the capacitors. For example, the switches may electrically connect various single-bit MACs to the capacitors in a sequential manner. Some switches may electrically connect specific combinations of single-bit MACs and capacitors when closed. Some switches may output the analog adder result, referred to herein as a multi-bit MAC output, to ADCs when closed. Some switches may reset the capacitors when closed. A controller may control the various switches to accomplish the multiplications, summations, and outputs.

In some embodiment, analog adders may be implemented using switched capacitors as an integrator capacitor using thermal based weight. Single-bit MACs may be each electrically connected, via single-bit MAC switches, to an analog adder having an operational amplifier and a capacitor electrically connected on the operational amplifier's feedback path. The single-bit MAC switches may be controlled so that the single-bit MAC outputs may be sequentially output to and received by the operational amplifier and the capacitor. For a multi-bit activation value, the single-bit MAC switches may be controlled so that each of the single-bit MAC outputs may be output to and received by the operational amplifier $2^q$ times, where "q" may be a location of an activation value bit from a least significant bit with q=0 to a most significant bit with q=n−1. Similarly, for a multi-bit weight value, the single-bit MAC switches may be controlled so that each of the single-bit MAC outputs may be output to and received by the operational amplifier $2^r$ times, where "r" may be a location of a weight value bit from a least significant bit with r=0 to a most significant bit with r=m−1. The capacitor may be charged, and the gain and output voltage of the operational amplifier may increase. A voltage output of the operational amplifier may be the integral of voltage inputs to the operational amplifier weighted by an impedance of the capacitor over time, which may function as the addition operation for the single-bit MAC outputs.

In some embodiments, analog adders may be implemented using switched capacitors as an integrator capacitor using hardwired binary weights. In addition to the circuit described above for the integrator capacitor using thermal based weight, the integrator capacitor using hardwired binary weights may include capacitors electrically connected between the single-bit MACs and the operational amplifier with the capacitor electrically connected on the feedback path. The single-bit MACs may be paired with designated capacitors rated for different capacitances for weighting the single-bit MAC outputs.

In some embodiments, analog adders may be implemented using switched capacitors as a binary DAC. The single-bit MACs may be electrically connected to "m" number of capacitors via single-bit MAC switches to an analog adder. The analog adder may include an optional buffer and accumulator switches that may electrically connect the capacitors for receiving the single-bit MAC outputs. The single-bit MAC switches and the accumulator switches may be controlled so that the output of one single-bit MAC may be output to and received by a designated capacitor. Each capacitor may be rated for a different capacitance for weighting of the single-bit MAC outputs to generate an average output of all of the capacitors.

In some embodiments, analog adders may be configured using switched capacitors to function as a sequential binary accumulator. The single-bit MACs may be electrically connected in parallel to a pair of capacitors via a single-bit MAC switches configured to connect one single-bit MAC to the pair of capacitors. Optionally, a buffer may be electrically connected between the single-bit MAC switches and the pair of capacitors. The pair of capacitors may include a sampler capacitor and an accumulator capacitor rated for the same capacitance. A sampler reset switch may be closed to electrically connect the sampler capacitor to a ground to discharge or reset the sampler capacitor. A single-bit MAC switch may be closed to electrically connect a single-bit MAC to the sampler capacitor, charging or loading the sampler capacitor with the single-bit MAC output. An accumulator switch may be closed to charge or load the accumulator capacitor by sharing the charge or load of the sampler capacitor. This switch control process may be repeated until all of the multiplications and accumulations of the activation value bits and the weight value bits are sequentially output to the analog adder.

In some embodiments, the accumulator capacitor may include multiple capacitors that cumulatively are rated for the same capacitance as the sampler capacitor. Each single-bit MAC may be electrically connected to a pair of a sampler capacitor and an accumulator capacitor. A number of MAC array switches for each of the accumulator capacitors may be configured to electrically connect the accumulator capacitors to a MAC output in parallel. The MAC array switch for each of the accumulator capacitors may be controlled to discharge or output the charge or load of the accumulator capacitors to the MAC output in parallel. The combined output of the accumulator capacitors in this configuration may be an average of the MAC array outputs with proper weights.

FIG. 1 illustrates a system including a computing device 100 suitable for use with various embodiments. The computing device 100 may include an SoC 102 with a processor 104, a memory 106, a communication interface 108, a memory interface 110, a peripheral device interface 120, and a MAC controller 124. The computing device 100 may further include a communication component 112, such as a wired or wireless modem, a memory 114, an antenna 116 for establishing a wireless communication link, and/or a peripheral device 122. The processor 104 may include any of a variety of processing devices, for example a number of processor cores.

The term "system-on-chip" or "SoC" is used herein to refer to a set of interconnected electronic circuits typically, but not exclusively, including a processing device, a memory, and a communication interface. A processor 104 may include a variety of different types of processors and/or processor cores, such as a general purpose processor, a central processing unit (CPU), a digital signal processor (DSP), a graphics processing unit (GPU), an accelerated processing unit (APU), a secure processing unit (SPU), an intellectual property unit (IPU), a subsystem processor of specific components of the computing device, such as an image processor for a camera subsystem or a display processor for a display, an auxiliary processor, a peripheral device processor, a single-core processor, a multicore processor, a controller, and/or a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and/or time references. Integrated circuits may be configured such that the components of the integrated circuit reside on a single piece of semiconductor material, such as silicon.

An SoC 102 may include one or more processors 104. The computing device 100 may include more than one SoC 102, thereby increasing the number of processors 104 and processor cores. The computing device 100 may also include processors 104 that are not associated with an SoC 102. Individual processors 104 may be multicore processors. The processors 104 may each be configured for specific purposes that may be the same as or different from other processors 104 of the computing device 100. One or more of the processors 104 and processor cores of the same or different configurations may be grouped together. A group of processors 104 or processor cores may be referred to as a multi-processor cluster.

The memory 106 of the SoC 102 may be a volatile or non-volatile memory configured for storing data and processor-executable code for access by the processor 104 or other components of SoC 102. The computing device 100 and/or SoC 102 may include one or more memories 106, 114 configured for various purposes. One or more memories 106 may include volatile memories such as random access memory (RAM) or main memory, or cache memory. These memories 106 may be configured to temporarily hold a limited amount of data received from a data sensor or subsystem, data and/or processor-executable code instructions that are requested from non-volatile memory, loaded to the memories 106 from non-volatile memory in anticipation of future access based on a variety of factors, and/or intermediary processing data and/or processor-executable code instructions produced by the processor 104 and temporarily stored for future quick access without being stored in non-volatile memory. In some embodiments, any number and combination of memories 106 may include one-time programmable or read-only memory.

The memory 106 may be configured to store data and processor-executable code, at least temporarily, that is loaded to the memory 106 from another memory device, such as another memory 106 or memory 114, for access by one or more of the processor 104 or other components of SoC 102. The data or processor-executable code loaded to the memory 106 may be loaded in response to execution of a function by the processor 104 or other components of SoC 102. Loading the data or processor-executable code to the memory 106 in response to execution of a function may result from a memory access request to the memory 106 that is unsuccessful, or a "miss," because the requested data or processor-executable code is not located in the memory 106. In response to a miss, a memory access request to another memory 106 or memory 114 may be made to load the requested data or processor-executable code from the other memory 106 or memory 114 to the memory 106. Loading the data or processor-executable code to the memory 106 in response to execution of a function may result from a memory access request to another memory 106 or memory 114, and the data or processor-executable code may be loaded to the memory 106 for later access.

The memory interface 110 and the memory 114 may work in unison to allow the computing device 100 to store data and processor-executable code on a volatile and/or non-volatile storage medium, and retrieve data and processor-executable code from the volatile and/or non-volatile storage medium. The memory 114 may be configured much like an embodiment of the memory 106 in which the memory 114 may store the data or processor-executable code for access by one or more of the processor 104 or other components of SoC 102. In some embodiments, the memory 114, being non-volatile, may retain the information after the power of the computing device 100 has been shut off. When the power is turned back on and the computing device 100 reboots, the information stored on the memory 114 may be available to the computing device 100. In some embodiments, the memory 114, being volatile, may not retain the information after the power of the computing device 100 has been shut off. The memory interface 110 may control access to the memory 114 and allow the processor 104 or other components of the SoC 12 to read data from and write data to the memory 114.

The MAC controller 124 may be configured to control any number and combination of single-bit MACs 126 and analog adders 128 that may be configured as a multi-bit MAC 130 and may combine the outputs of the single-bit MACs 126 as described further herein. In some embodiments, the MAC controller 124 may be configured to control any number and combination of switches to selectively electrically connect the single bit MACs 126 to any number and combination of components of an analog adder 128 via control of any number and combination of switches of the analog adder 128 as described further herein. In some embodiments, the MAC controller 124 may be a processor 104 and/or may be an integral component of a processor 104. In some embodiments the single bit MACs 126 and/or analog adders 128 may be integral components of a memory 106.

Some or all of the components of the computing device 100 and/or the SoC 102 may be arranged differently and/or combined while still serving the functions of the various embodiments. The computing device 100 may not be limited to one of each of the components, and multiple instances of each component may be included in various configurations of the computing device 100.

Figure 2:
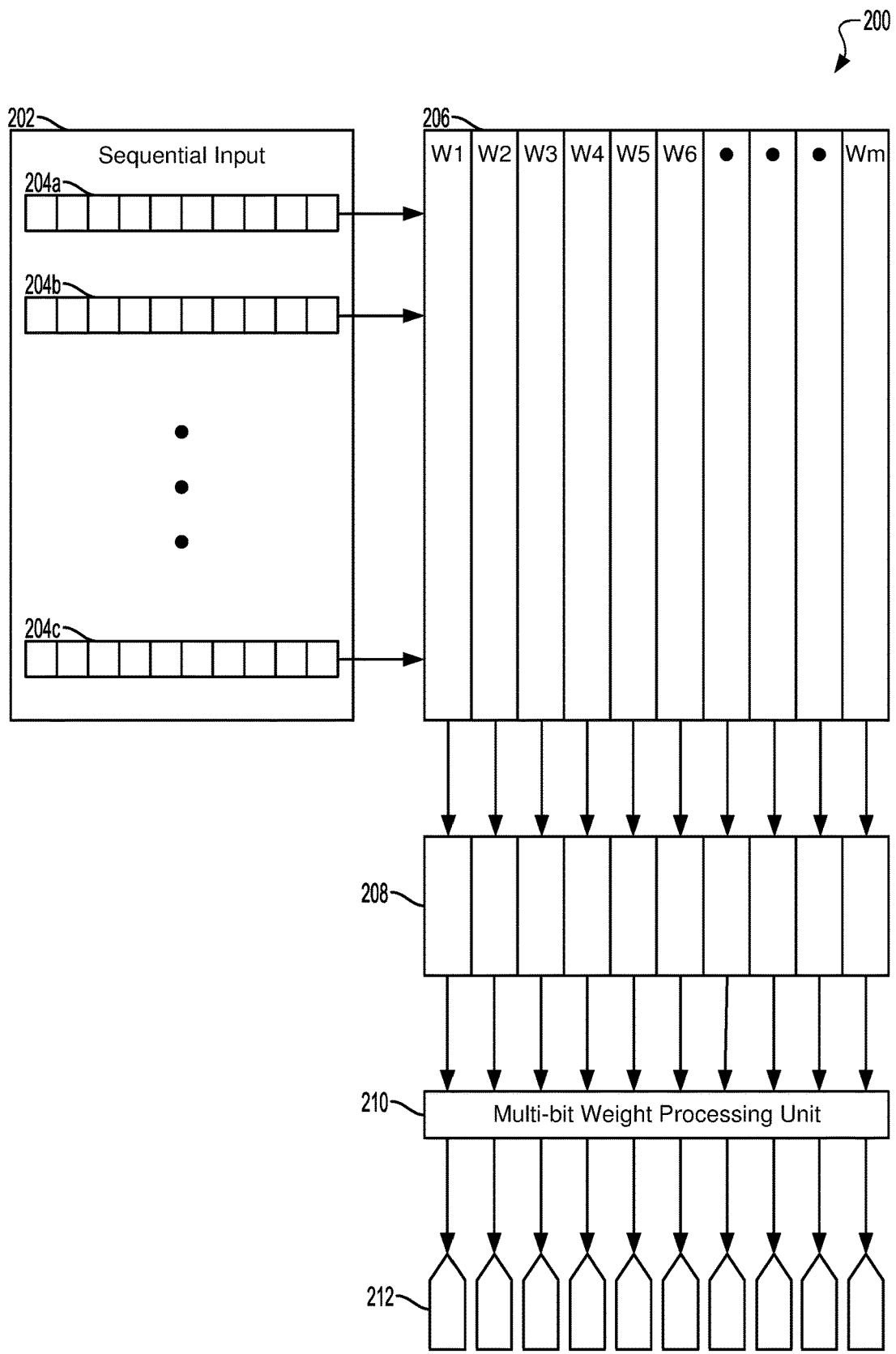
FIG. 2 is a component block diagram illustrating an example memory device configured to implement a multi-bit multiplier-accumulator ("MAC") using a compute-in-memory (CIM) and/or a near memory compute (NMC) array suitable for implementing various embodiments.

FIG. 2 illustrates an example memory device (e.g., memory 106 in FIG. 1) configured to implement a multi-bit MAC using a compute-in-memory (CIM) and/or a near memory compute (NMC) array suitable for implementing various embodiments. The multi-bit MAC 200 (e.g., multi-bit MAC 130 in FIG. 1) may include any number of single-bit MACs 206 (e.g., single-bit MACs 126 in FIG. 1), sequential integrators 208 (e.g., analog adders 128 in FIG. 1), a multi-bit weight processing unit 210, and analog-to-digital converters (ADC) 212. The single-bit MACs 206 may function to convert signals from a digital domain to an analog domain. The sequential integrators 208 and multi-bit weight processing units 210 may function using and generating signals in the analog domain. The ADCs 212 may function to convert signals from the analog domain to the digital domain. As such, the multi-bit MAC 200 may function, at least partially, in the analog domain.

The multi-bit MAC 200 may be configured as a grid of CIM and/or NMC cells of the memory device having components for multiplying bits of "n" bit activation values 204a, 204b, 204c and bits of "m" bit weight values in parallel. The bits of the "n" bit activation values 204a, 204b, 204c and the "m" bit weight values may be represented by digital voltage signals to the CIM and/or NMC cells. Each of the CIM and/or NMC cell may multiply a bit of an "n" bit activation value 204a, 204b, 204c and a bit of an "m" bit weight value. The multi-bit MAC 200 may receive the "m" bit weight values and each of the CIM and/or NMC cells may store an "m" bit weight value. For example, each row of the grid of CIM and/or NMC cells may store multiple "m" bit weight values, and each row may store the same multiple "m" bit weight values. The multi-bit MAC 200 may receive a sequential input 202 of the "n" bit activation values 204a, 204b, 204c. For example, an activation value 204a, 204b, 204c may be input to a row of the grid of CIM and/or NMC cells. The bits of the "n" bit activation values 204a, 204b, 204c may be sequentially input to each of the CIM and/or NMC cells. For example, an "n" bit activation value 204a, 204b, 204c may be sequentially input to each of the CIM and/or NMC cells of a row of the grid of CIM and/or NMC cells from a least significant bit to a most significant bit. Any bit of the "n" bit activation values 204a, 204b, 204c input to the CIM and/or NMC cells may be input to each of the CIM and/or NMC cells in parallel. For example, the least significant bit of the "n" bit activation values 204a, 204b, 204c may be input to the CIM and/or NMC cells of respective rows of the grid of CIM and/or NMC cells in parallel. In some embodiments, the "n" bit activation values 204a, 204b, 204c may be streamed from an input interface (not shown) to the CIM and/or NMC cells. In some embodiments, the "n" bit activation values 204a, 204b, 204c and/or the "m" bit weights value may be provided to the CIM and/or NMC cells from a memory (not shown), such as a register, a buffer, a cache, a random access memory (RAM), etc. The CIM and/or NMC cells may multiply each of the sequentially received bits of the "n" bit activation values 204a, 204b, 204c and the stored "m" bit weight values. The outputs of the multiplications by the cells of the CIM and/or NMC grid may be analog voltages. Each cell of the CIM and/or NMC grid may be electrically connected to any number and combination of voltage accumulators (not shown), such as capacitors, configured to accumulate the outputs of the multiplications by the cells of the CIM and/or NMC grid.

The combination of a cell of the CIM and/or NMC grid and the electrically connected voltage accumulators may be referred to herein as single-bit MACs 206. Single-bit MAC outputs, resulting from the multiplication and accumulation executed by the single-bit MACs 206, may be output by the single-bit MACs 206 to sequential integrators 208. The single-bit MAC outputs may be represented by analog voltage signals to the sequential integrators 208.

The sequential integrators 208 may receive the single-bit MAC outputs of the single-bit MACs 206, and may combine the single-bit MAC outputs through addition, or accumulation. Various embodiments include analog adders that may be used to implement the sequential integrators 208. In some embodiments, each sequential integrator 208 may add the single-bit MAC outputs from a single single-bit MAC 206. The addition of the single-bit MAC outputs by the sequential integrators 208 may be implemented in various manners overtime as described further herein, for example, with reference to FIGS. 3-10. The addition of the single-bit MAC outputs by the sequential integrators 208 may convert the single-bit MAC outputs, representing bit-by-bit multiplication and accumulation results, to accumulated single-bit MAC outputs as analog voltage signals with proper weights corresponding to the significance of each bit. The accumulated single-bit MAC outputs, resulting from the addition of the single-bit MAC output by the sequential integrators 208, may be output by the sequential integrators 208 to the multi-bit weight processing unit 210.

The multi-bit weight processing unit 210 may receive the accumulated single-bit MAC outputs from the sequential integrators 208, and may perform a weighted addition of the accumulated single-bit MAC outputs to produce a binary weighted average voltage of the accumulated single-bit MAC outputs, also referred to herein in as the multi-bit MAC output. The binary weighted average voltage may be a voltage representing the multiplication of the "n" bit activation value 204a, 204b, 204c and the "m" bit weight value. The binary weighted average voltage may also be an analog signal. The binary weighted average voltage may be output by the multi-bit weight processing unit 210 to an ADC 212, which may convert the binary weighted average voltage to a digital signal.

Figure 3:
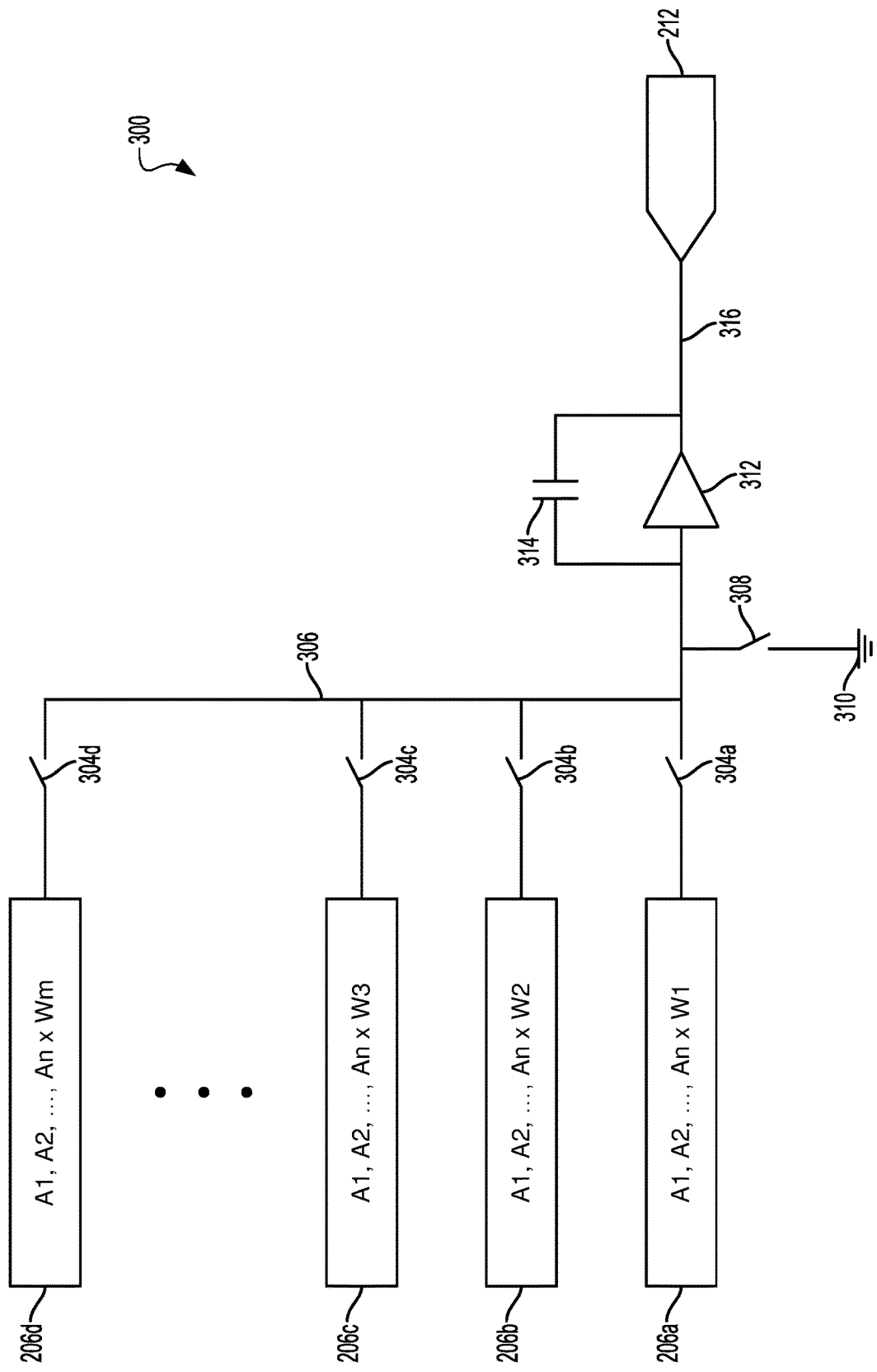
FIG. 3 is a circuit diagram illustrating an example multi-bit MAC using active integrator based thermal weight suitable for implementing various embodiments.

FIGS. 3-7, 9, and 10 illustrate examples of multi-bit MACs suitable for implementing various embodiments. Referring to FIG. 3 and with reference to FIGS. 1 and 2, a multi-bit MAC 300, 400, 500, 600, 700, 900, 1000 (e.g., multi-bit MAC 130 in FIG. 1, multi-bit MAC 200 in FIG. 2) may be an electrical circuit having any number of single-bit MACs 206a, 206b, 206c, 206d (e.g., single-bit MACs 126 in FIG. 1, single-bit MACs 206 in FIG. 2), single-bit MAC switches 304a, 304b, 304c, 304d, electrical transmission busses 306, 316, and/or ADCs 212 (e.g., ADC 212 in FIG. 2).

Each of the single-bit MACs 206a, 206b, 206c, 206d may store a bit of an "m" bit weight value (W1, W2, W3, ..., Wm). Each single-bit MAC 206a, 206b, 206c, 206d may receive a sequential input (e.g., sequential input 202 in FIG. 2) of an "n" bit activation value (A1, A2, ..., An) (e.g., "n" bit activation value 204a, 204b, 204c in FIG. 2). Each bit of the "n" bit activation value may be sequentially input to each of the single-bit MACs 206a, 206b, 206c, 206d. For example, the "n" bit activation value may be sequentially input to each of the single-bit MACs 206a, 206b, 206c, 206d from a least significant bit to a most significant bit. Any bit of the "n" bit activation value may be input to each of the single-bit MACs 206a, 206b, 206c, 206d in parallel. The bits of the "n" bit activation value and the "m" bit weight value may be represented by digital voltage signals to the single-bit MACs 206a, 206b, 206c, 206d. In some embodiments, the "n" bit activation value may be streamed from an input interface (not shown) to the single-bit MACs 206a, 206b, 206c, 206d. In some embodiments, the "n" bit activation value and/or the "m" bit weight value may be provided to the single-bit MACs 206a, 206b, 206c, 206d from a memory (not shown), such as a register, a buffer, a cache, a RAM, etc. The single-bit MACs 206a, 206b, 206c, 206d may multiply each of the sequentially received bits of the "n" bit activation value and the received and/or stored bit of the "m" bit weight value (A1, A2, ..., AnxW1; A1, A2, ..., AnxW2; A1, A2, ..., AnxW3; ... A1, A2, ..., AnxWm), and accumulate the results of the multiplications. Single-bit MAC outputs, resulting from the multiplication and accumulation executed by the single-bit MACs 206a, 206b, 206c, 206d, may be output by the single-bit MACs 206a, 206b, 206c, 206d to analog adders (e.g., analog adders 128, sequential integrators 208, multi-bit weight processing unit 210 in FIGS. 1 and 2) of the a multi-bit MAC 300, 400, 500, 600, 700, 900, 1000, described further herein. The single-bit MAC outputs may be represented by analog voltage signals to the analog adders of the multi-bit MAC 300, 400, 500, 600, 700, 900, 1000.

The single-bit MACs 206a, 206b, 206c, 206d may be electrically connected to an analog adder via an electrical transmission bus 306. Any number of single-bit MAC switches 304a, 304b, 304c, 304d may be controlled by a MAC controller (e.g., processor 104, MAC controller 124 in FIG. 1) to selectively electrically connect the single-bit MACs 206a, 206b, 206c, 206d to the analog adder via the electrical transmission bus 306. For example, each single-bit MAC 206a, 206b, 206c, 206d may be selectively electrically connected to the analog adder via a designated single-bit MAC switch 304a, 304b, 304c, 304d. Selectively electrically connecting a single-bit MAC 206a, 206b, 206c, 206d to the analog adder, by controlling the designated single-bit MAC switch 304a, 304b, 304c, 304d to close an electrical circuit electrically connecting the single-bit MAC 206a, 206b, 206c, 206d and the analog adder, may output the single-bit MAC output, generated by the single-bit MAC 206a, 206b, 206c, 206d, to the analog adder.

The single-bit MAC switches 304a, 304b, 304c, 304d may be controlled so that the single-bit MAC outputs may be sequentially output by the single-bit MACs 206a, 206b, 206c, 206d to and received by the analog adder. For example, the single-bit MAC switches 304a, 304b, 304c, 304d may be controlled to electrically connect the single-bit MACs 206a, 206b, 206c, 206d following multiplication of a least significant bit of the "n" bit activation value (A1) and the bits of the "m" bit weight value (W1, W2, W3, ..., Wm) and accumulation of the multiplication results. The single-bit MAC switches 304a, 304b, 304c, 304d may be further controlled to successively electrically connect the single-bit MACs 206a, 206b, 206c, 206d following multiplication and accumulation of a next more significant bit of the "n" bit activation value (A2) and the bits of the "m" bit weight value (W1, W2, W3, . . . , Wm). Such sequential control of the single-bit MAC switches 304a, 304b, 304c, 304d may continue for successive multiplications and accumulations of successively more significant bit of the "n" bit activation value through a most significant bit of the "n" bit activation value (An). The single-bit MAC switches 304a, 304b, 304c, 304d may be further controlled to repetitively electrically connect the single-bit MACs 206a, 206b, 206c, 206d following multiplication and accumulation of a bit of the "n" bit activation value and the bits of the "m" bit weight value before a successive multiplication and accumulation of a more significant bit of the "n" bit activation value and the bits of the "m" bit weight value as described further herein.

Figure 9:
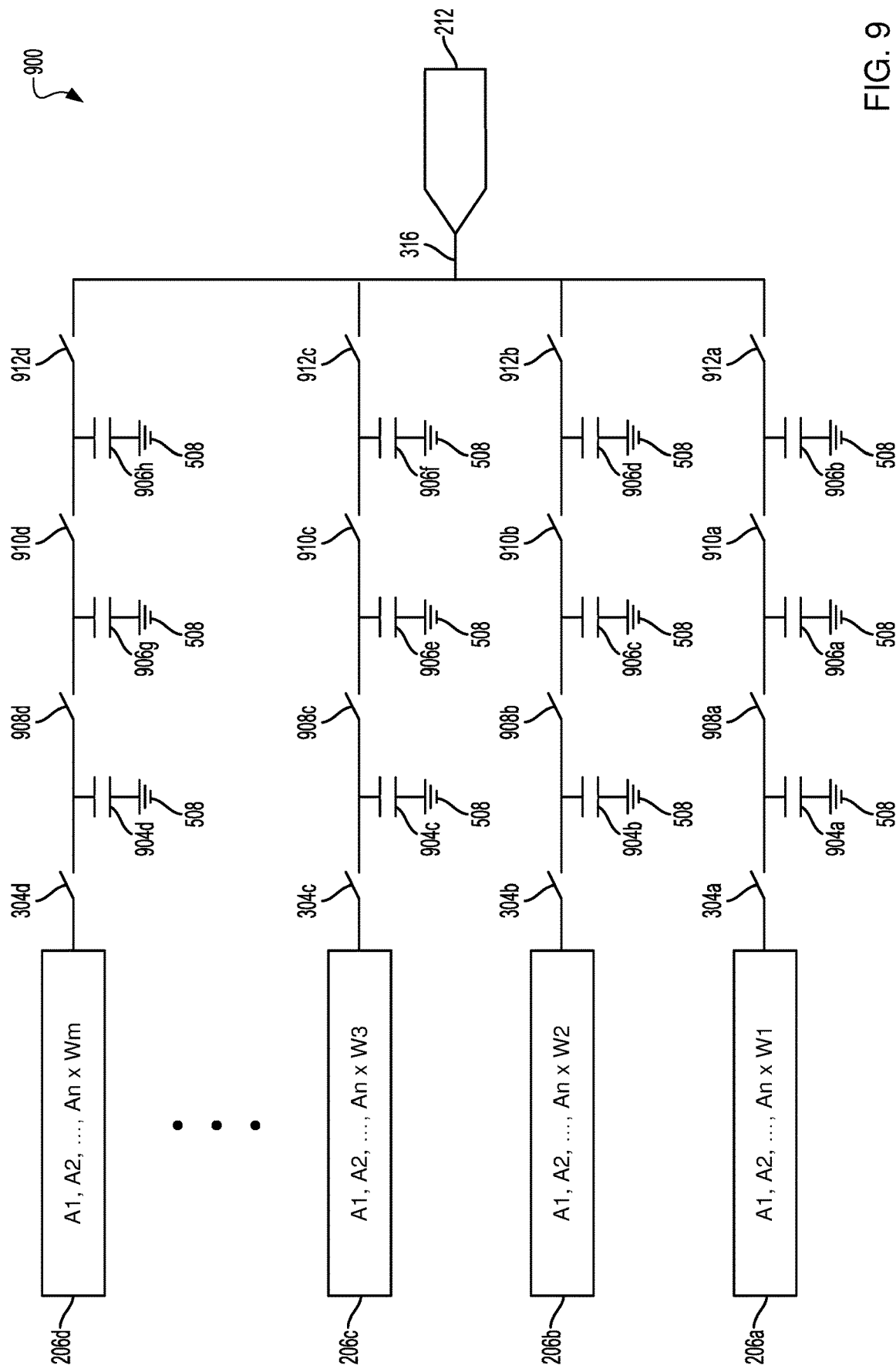
FIG. 9 is a circuit diagram illustrating an example single-bit MAC output adder for multi-bit activation values and multi-bit weight values suitable for implementing various embodiments.
Figure 10:
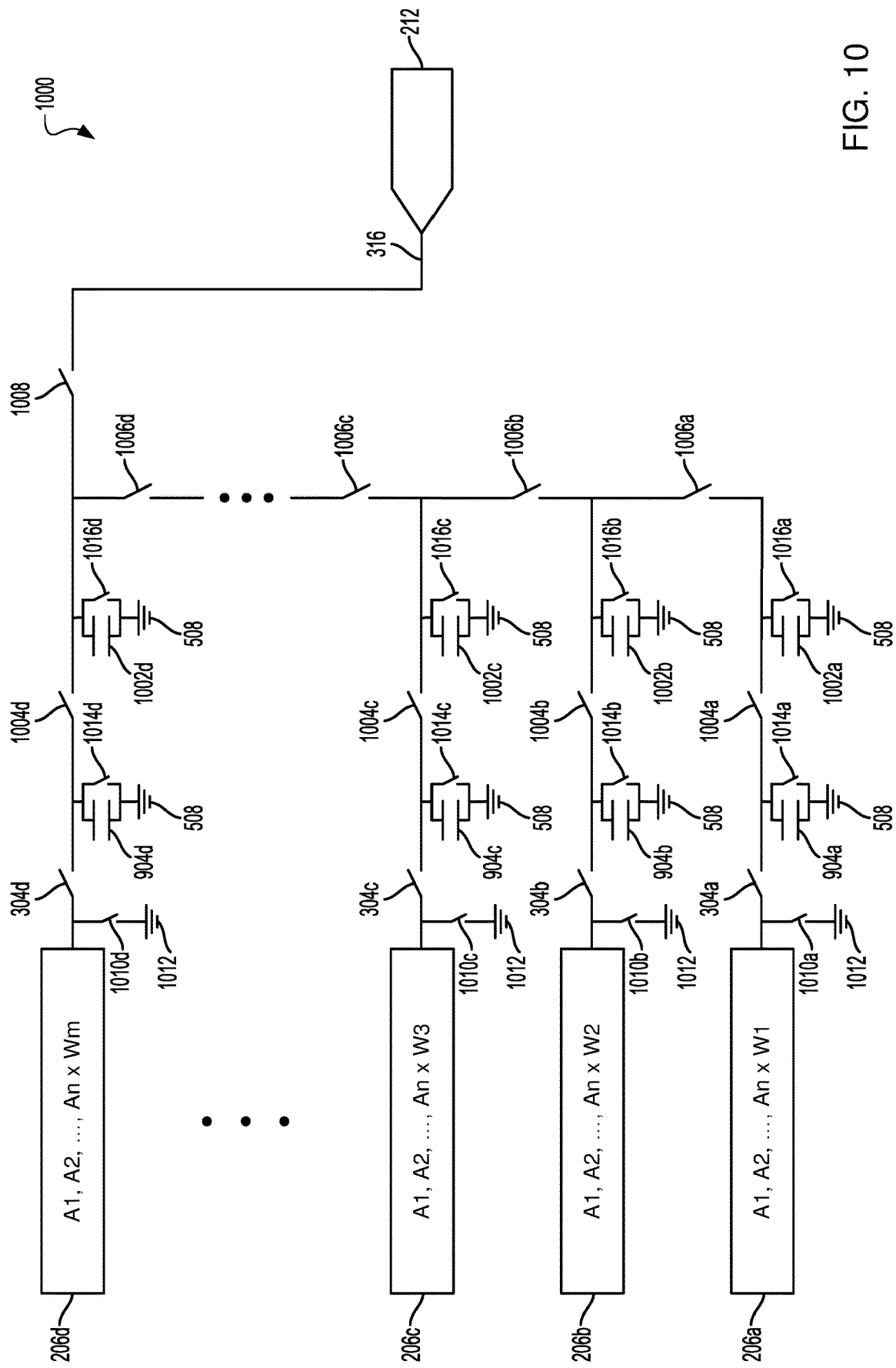
FIG. 10 is a circuit diagram illustrating an example single-bit MAC output adder for multi-bit activation values and multi-bit weight values suitable for implementing various embodiments.

FIGS. 3-7 illustrate example embodiments of multi-bit MACs 300, 400, 500, 600, 700 each having a single analog adder. The example of a single analog adder is for purposes of simplifying the figures and the descriptions and are not intended to be limiting. The claims are not limited to single analog adders and other embodiments of the multi-bit MACs 300, 400, 500, 600, 700 may each use a plurality of analog adders. In such embodiments, the outputs of the plurality of analog adders of a multi-bit MAC 300, 400, 500, 600, 700 may be combined. Similarly, FIGS. 9 and 10 illustrate example embodiments of multi-bit MACs 900, 1000 each having a single analog adder. In some embodiments, the single analog adder of the multi-bit MACs 900, 1000 illustrated in the examples in FIGS. 9 and 10 may each include a plurality of analog adders.

FIG. 3 illustrates an example multi-bit MAC using integrator based thermal weight suitable for implementing various embodiments. With reference to FIGS. 1-3, a multi-bit MAC 300 may include any number of analog adders. In some embodiments, an analog adder may include any number of operational amplifiers 312 and integrator capacitors 314 (also referred to as adder capacitors). In some embodiments, an analog adder may further include any number and combination of clear switches 308 and/or electrical grounds 310. An integrator capacitor 314 of an analog adder may be electrically connected on a feedback path of an operational amplifier 312. The integrator capacitor 314 and an input end of the operational amplifier 312 may be selectively electrically connected to the single-bit MACs 206a, 206b, 206c, 206d via the electrical transmission bus 306 and the designated single-bit MAC switches 304a, 304b, 304c, 304d. The integrator capacitor 314 and the input end of the operational amplifier 312 may be selectively electrically connected to an electrical ground 310 via a clear switch 308. The integrator capacitor 314 and an output end of the operational amplifier 312 may be electrically connected to an ADC 212 via an electrical transmission bus 316.

The analog adder may receive single-bit MAC outputs from the single-bit MACs 206a, 206b, 206c, 206d at an input end of the operational amplifier 312 and at the integrator capacitor 314. The integrator capacitor 314 may store a single-bit MAC output and store the sum of the single-bit MAC outputs as further single-bit MAC outputs are received. For a multi-bit "n" bit activation value, the single-bit MAC switches 304a, 304b, 304c, 304d may be controlled so that each of the single-bit MAC outputs may be output to and received by the operational amplifier 312 and integrator capacitor 314 $2^q$ times, where "q" may be a location of an activation value bit from a least significant bit with q=0 to a most significant bit with q=n−1. Similarly, for a multi-bit "m" bit weight value, the single-bit MAC switches 304a, 304b, 304c, 304d may be controlled so that each of the single-bit MAC outputs may be output to and received by the operational amplifier 312 and integrator capacitor 314 $2^r$ times, where "r" may be a location of a weight value bit from a least significant bit with r=0 to a most significant bit with r=m−1. In some embodiments, it may take $2^q \times 2^r$ cycles to output and receive all of the single-bit MAC outputs. The integrator capacitor 314 may be charged, and the gain and output voltage of the operational amplifier 312 may increase. An analog voltage output of the operational amplifier 312, also referred to herein as the multi-bit MAC output, may be an integral of the voltage inputs to the operational amplifier 312 weighted by an impedance of the integrator capacitor 314 over time, which may function as a weighted addition operation for the single-bit MAC outputs. The analog voltage output by the operational amplifier 312 may output to and be received by the ADC 212 via the electrical transmission bus 316, and converted by the ADC 212 to a digital signal.

After completing the multiplication and addition of all of the bits of the "n" bit activation value and the "m" bit weight value, the multi-bit MAC 300 may be reset or cleared. The clear switch 308 may be controlled by the MAC controller (e.g., processor 104, MAC controller 124 in FIG. 1) to selectively electrically connect the analog adder, including the input end of the operational amplifier 312 and the integrator capacitor 314, to the electrical ground 310. Electrically connecting components of the multi-bit MAC 300 to the electrical ground 310 may discharge any residual voltage in the multi-bit MAC 300 so that a next multiply and add of different combinations of "n" bit activation values and/or "m" bit weight values may be implemented by the multi-bit MAC 300.

The multi-bit MAC 300 using integrator based thermal weight may take $2^n \times 2^m$ cycles to complete multiplication and addition of all of the bits of the "n" bit activation value and the "m" bit weight value. The multi-bit MAC 300 may be suitable for scenarios where at least one of the "n" bit activation value and the "m" bit weight value has a low dynamic range. The multi-bit MAC 300 may be particularly useful for use with binary weight multi-bit activation.

Figure 4:
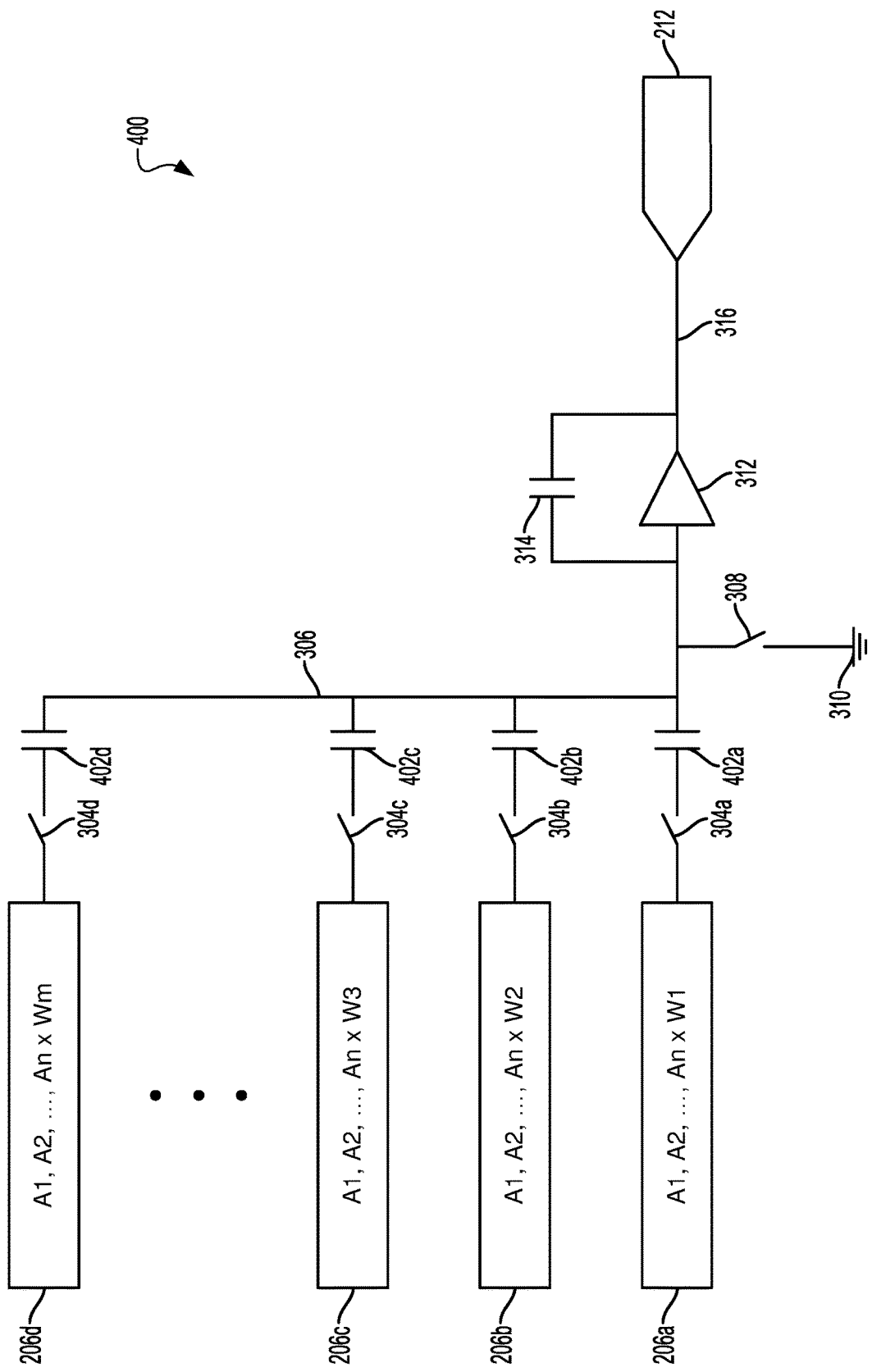
FIG. 4 is a circuit block diagram illustrating an example multi-bit MAC using active integrator based hardwired binary weights suitable for implementing various embodiments.

FIG. 4 illustrates an example multi-bit MAC using integrator based hardwired binary weights suitable for implementing various embodiments. With reference to FIGS. 1-4, a multi-bit MAC 400 may include any number of analog adders. In some embodiments, an analog adder may include any number of operational amplifiers 312, integrator capacitors 314 (also referred to as adder capacitors), and designated capacitors 402a, 402b, 402c, 402d. In some embodiments, an analog adder may further include any number and combination of clear switches 308 and/or electrical grounds 310. Designated capacitors 402a, 402b, 402c, 402d of an analog adder may be selectively electrically connected to the single-bit MACs 206a, 206b, 206c, 206d via associated single-bit MAC switches 304a, 304b, 304c, 304d. An integrator capacitor 314 of the analog adder may be electrically connected on a feedback path of an operational amplifier 312. The integrator capacitor 314 and an input end of the operational amplifier 312 may be electrically connected to the designated capacitors 402a, 402b, 402c, 402d via the electrical transmission bus 306. The designated capacitors 402a, 402b, 402c, 402d, the integrator capacitor 314, and the input end of the operational amplifier 312 may be selectively electrically connected to an electrical ground 310 via a clear switch 308. The integrator capacitor 314 and an output end of the operational amplifier 312 may be electrically connected to an ADC 212 via an electrical transmission bus 316.

The analog adder may receive single-bit MAC outputs from the single-bit MACs 206a, 206b, 206c, 206d at the designated capacitor 402a, 402b, 402c, 402d. Each designated capacitor 402a, 402b, 402c, 402d may be associated with and selectively electrically connected to a specific single-bit MAC 206a, 206b, 206c, 206d. The designated capacitors 402a, 402b, 402c, 402d may be associated with the specific single-bit MACs 206a, 206b, 206c, 206d based on relationships between capacitance ratings ("C") of the designated capacitors 402a, 402b, 402c, 402d and a location of a bit of the "n" bit activation values and/or the "m" bit activation values in the range from least significant bit to most significant bit multiplied by the specific single-bit MACs 206a, 206b, 206c, 206d. For a multi-bit "n" bit activation value, the designated capacitors 402a, 402b, 402c, 402d may be rated with capacitance ratings of $2^qC$, where "q" may be a location of an activation value bit from a least significant bit with q=0 to a most significant bit with q=n−1. Similarly, for a multi-bit "m" bit weight value, the designated capacitors 402a, 402b, 402c, 402d may be rated with capacitance ratings of $2^rC$, where "r" may be a location of a weight value bit from a least significant bit with r=0 to a most significant bit with r=m−1. In some embodiments, each designated capacitor 402a, 402b, 402c, 402d may be a single capacitor having the appropriate capacitance rating for the associated specific single-bit MAC 206a, 206b, 206c, 206d. In some embodiments, each designated capacitor 402a, 402b, 402c, 402d may be multiple capacitors, electrically connected in series and/or parallel, that cumulatively have the appropriate capacitance rating for the associated specific single-bit MAC 206a, 206b, 206c, 206d. The capacitance ratings of the designated capacitor 402a, 402b, 402c, 402d may function as hardwired binary weights for the single-bit MAC outputs received by the designated capacitor 402a, 402b, 402c, 402d from the associated specific single-bit MAC 206a, 206b, 206c, 206d.

The designated capacitors 402a, 402b, 402c, 402d may receive and store the single-bit MAC outputs from the associated single-bit MACs 206a, 206b, 206c, 206d when selectively electrically connected to the associated single-bit MACs 206a, 206b, 206c, 206d via the associated single-bit MAC switches 304a, 304b, 304c, 304d. The designated capacitors 402a, 402b, 402c, 402d may charge by receiving the single-bit MAC outputs when selectively electrically connected to the associated single-bit MACs 206a, 206b, 206c, 206d. The designated capacitors 402a, 402b, 402c, 402d may output or discharge the single-bit MAC outputs weighted in relation to the capacitance rating of the designated capacitors 402a, 402b, 402c, 402d when selectively electrically disconnected from the associated single-bit MACs 206a, 206b, 206c, 206d.

The weighted single-bit MAC outputs may be received at the input end of the operational amplifier 312 and at the integrator capacitor 314. The integrator capacitor 314 may store a single-bit MAC output, for example, in the form of a weighted single-bit MAC output, and store the sum of the single-bit MAC outputs as further single-bit MAC outputs are received, for example, in the form of a sum of weighted single-bit MAC outputs as further weighted single-bit MAC outputs are received. The integrator capacitor 314 may be charged, and the gain and output voltage of the operational amplifier 312 may increase. An analog voltage output of the operational amplifier 312, also referred to herein as the multi-bit MAC output, may be an integral of the voltage inputs to the operational amplifier 312 weighted by an impedance of the integrator capacitor 314 over time, which may function as a weighted addition operation for the single-bit MAC outputs. The analog voltage output by the operational amplifier 312 may output to and be received by the ADC 212 via the electrical transmission bus 316, and converted by the ADC 212 to a digital signal.

After completing the multiplication and addition of all of the bits of the "n" bit activation value and the "m" bit weight value, the multi-bit MAC 400 may be reset or cleared. The clear switch 308 may be controlled to selectively electrically connect the analog adder, including the designated capacitors 402a, 402b, 402c, 402d, the input end of the operational amplifier 312, and the integrator capacitor 314, to the electrical ground 310. Electrically connecting components of the multi-bit MAC 400 to the electrical ground 310 may discharge any residual voltage in the multi-bit MAC 400 so that a next multiply and add of different combinations of "n" bit activation values and/or "m" bit weight values may be implemented by the multi-bit MAC 400.

The multi-bit MAC 400 using integrator based hardwired binary weights may be similarly configured as the multi-bit MAC using integrator based thermal weight functions (e.g., multi-bit MAC 300 in FIG. 3), both including adders having an operational amplifier 312 with an integrator capacitor 314 electrically connected on the feedback path of the operational amplifier 312. However, the multi-bit MAC using integrator based thermal weight functions relies on the operational amplifier 312 and integrator capacitor 314 to weight the received single-bit MAC outputs. Alternatively, the multi-bit MAC 400 uses the capacitance ratings of hardwired designated capacitors 402a, 402b, 402c, 402d to weight the single-bit MAC outputs prior to the operational amplifier 312 and integrator capacitor 314 receiving the weighted single-bit MAC outputs. As such, the multi-bit MAC 400 may perform the accumulation of the single-bit MAC outputs more quickly than the multi-bit MAC using integrator based thermal weight functions. For example, rather than having to wait for the integrator capacitor 314 to charge from the sequentially received single-bit MAC outputs, the multi-bit MAC 400 may charge the designated capacitors 402a, 402b, 402c, 402d in parallel and output the weighted single-bit MAC outputs to the operational amplifier 312 and integrator capacitor 314.

Figure 5:
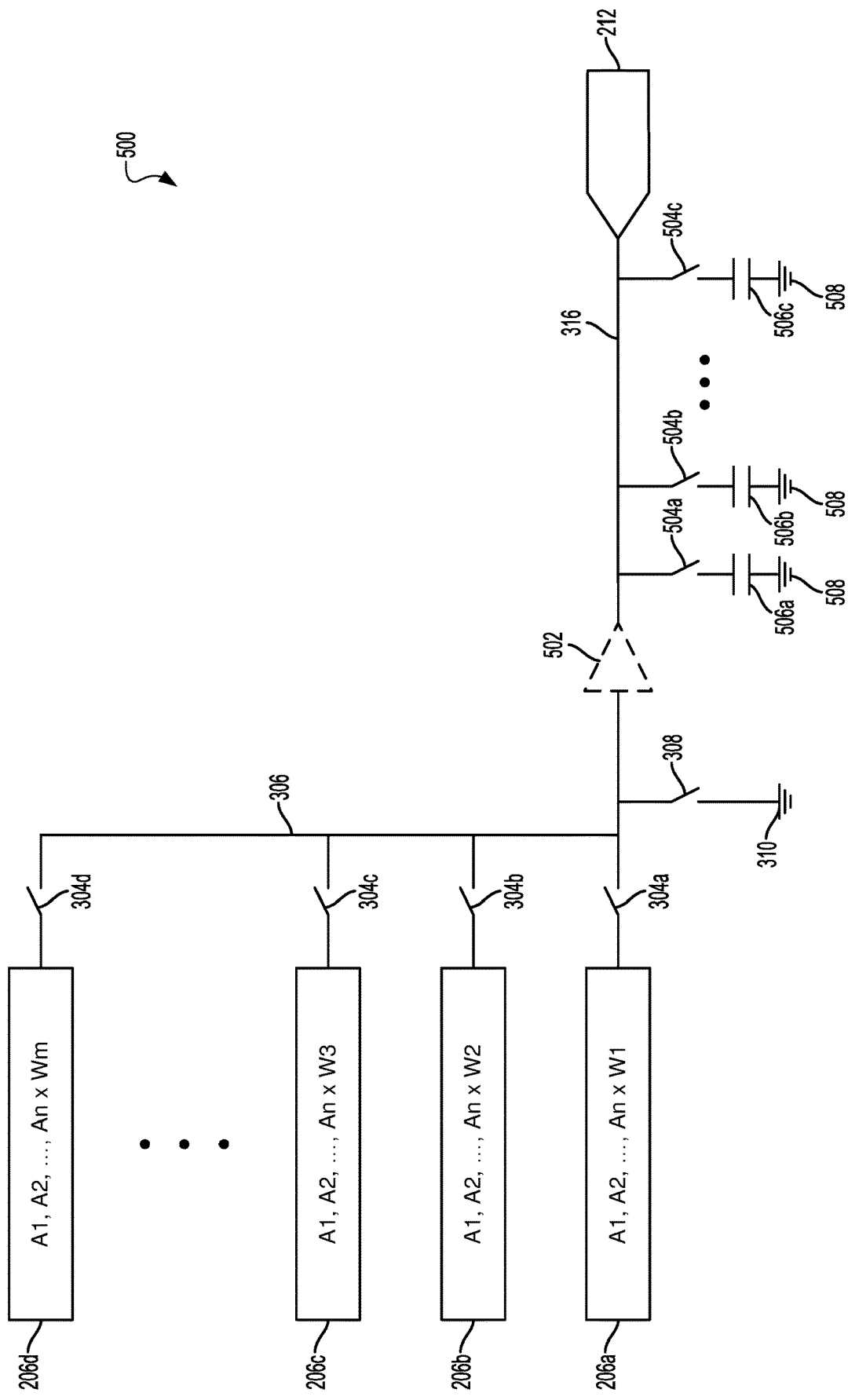
FIG. 5 is a circuit block diagram illustrating an example multi-bit MAC using a binary capacitive digital-to-analog converter (DAC) as a load suitable for implementing various embodiments.

FIG. 5 illustrates an example multi-bit MAC using a binary DAC as a load suitable for implementing various embodiments. With reference to FIGS. 1-5, a multi-bit MAC 500 may include any number of analog adders. In some embodiments, an analog adder may include any number of adder switches 504a, 504b, 504c and adder capacitors 506a, 506b, 506c. In some embodiments, an analog adder may further include any number of optional buffers 502. In some embodiments, an analog adder may further include any number and combination of clear switches 308, electrical grounds 310, and/or designated electrical grounds 508. Adder capacitors 506a, 506b, 506c of an analog adder may be selectively electrically connected to the single-bit MACs 206a, 206b, 206c, 206d via associated single-bit MAC switches 304a, 304b, 304c, 304d, associated adder switches 504a, 504b, 504c, and the electrical transmission bus 306. The adder capacitors 506a, 506b, 506c may be electrically connected between the associated adder switches 504a, 504b, 504c and the electrical ground 508. The adder capacitors 506a, 506b, 506c may be selectively electrically connected to an electrical ground 310 via the adder switches 504a, 504b, 504c and a clear switch 308. The adder capacitors 506a, 506b, 506c may be electrically connected to an ADC 212 via an electrical transmission bus 316. The adder switches 504a, 504b, 504c may be controlled to selectively electrically connect the adder capacitors 506a, 506b, 506c to the electrical transmission bus 306, 316 by the MAC controller (e.g., processor 104, MAC controller 124 in FIG. 1).

The analog adder may receive single-bit MAC outputs from the single-bit MACs 206a, 206b, 206c, 206d at the adder capacitors 506a, 506b, 506c. Each adder capacitor 506a, 506b, 506c may be selectively and sequentially electrically connected to the single-bit MACs 206a, 206b, 206c, 206d. The adder capacitors 506a, 506b, 506c may have different sequential capacitance ratings ("C") that may correspond to a number of bits of the "n" bit activation values and/or the "m" bit weight values. For a multi-bit "n" bit activation value the adder capacitors 506a, 506b, 506c may be rated with capacitance ratings of $2^q C$, where "q" may be values from 0 to n−1. Similarly, for a multi-bit "m" bit weight value, the adder capacitors 506a, 506b, 506c may be rated with capacitance ratings of $2^r C$, where "r" may be values from 0 to m−1. In some embodiments, each adder capacitor 506a, 506b, 506c may be a single capacitor having the appropriate capacitance rating for a position of the adder capacitor 506a, 506b, 506c in the sequence of capacitance ratings. In some embodiments, each adder capacitor 506a, 506b, 506c may be multiple capacitors electrically connected in series and/or parallel, that cumulatively have the appropriate capacitance rating for a position of the adder capacitor 506a, 506b, 506c in the sequence of capacitance ratings. The capacitance ratings of the adder capacitor 506a, 506b, 506c may function as hardwired binary weights for the single-bit MAC outputs received by the adder capacitor 506a, 506b, 506c from the single-bit MACs 206a, 206b, 206c, 206d.

The adder capacitors 506a, 506b, 506c may receive and store the single-bit MAC outputs from the single-bit MACs 206a, 206b, 206c, 206d when selectively electrically connected to the single-bit MACs 206a, 206b, 206c, 206d via the associated single-bit MAC switches 304a, 304b, 304c, 304d and the associated adder switches 504a, 504b, 504c. The single-bit MAC switches 304a, 304b, 304c, 304d and the adder switches 504a, 504b, 504c may be controlled to output the single-bit MAC outputs from a single-bit MAC 206a, 206b, 206c, 206d so that each adder capacitor 506a, 506b, 506c receives the single-bit MAC outputs. For example, the single-bit MAC switches 304a, 304b, 304c, 304d may be controlled to close a circuit electrically connecting a single-bit MAC 206a, 206b, 206c, 206d and the analog adder to output the single-bit MAC outputs to the analog adder. The adder switches 504a, 504b, 504c associated with each adder capacitor 506a, 506b, 506c may be controlled to sequentially load the single-bit MAC outputs to each of the adder capacitors 506a, 506b, 506c by closing a circuit electrically connecting a single-bit MAC 206a, 206b, 206c, 206d and an associated adder capacitor 506a, 506b, 506c. In other words, each adder capacitor 506a, 506b, 506c may receive the single-bit MAC outputs from each of the single-bit MACs 206a, 206b, 206c, 206d. In some embodiments, the adder switches 504a, 504b, 504c may be controlled in a manner that a single-bit MAC output is loaded to the adder capacitors 506a, 506b, 506c in an order based on the capacitance ratings of the adder capacitors 506a, 506b, 506c. The adder capacitors 506a, 506b, 506c may charge by receiving the single-bit MAC outputs when selectively electrically connected to the single-bit MACs 206a, 206b, 206c, 206d.

The adder capacitors 506a, 506b, 506c may output or discharge the single-bit MAC outputs weighted in relation to the capacitance rating of the adder capacitor 506a, 506b, 506c when selectively electrically disconnected from the single-bit MACs 206a, 206b, 206c, 206d by the single-bit MAC switches 304a, 304b, 304c, 304d, and selectively electrically connected to the ADC 212 by the adder switches 504a, 504b, 504c. The adder capacitors 506a, 506b, 506c may output or discharge the weighted single-bit MAC outputs when selectively electrically disconnected from all of the associated single-bit MACs 206a, 206b, 206c, 206d by the single-bit MAC switches 304a, 304b, 304c, 304d, and selectively electrically connected to the ADC 212 by all of the adder switches 504a, 504b, 504c.

The weighted single-bit MAC outputs may be output as analog voltages to the electrical transmission bus 316 and to the ADC 212. The weighted single-bit MAC outputs may be combined by addition of the analog voltages on the electrical transmission bus 316 resulting in a weighted average of the analog voltages, also referred to herein as the multi-bit MAC output, and converted by the ADC 212 to a digital signal.

After completing the multiplication and addition of all of the bits of the "n" bit activation value and the "m" bit weight value, the multi-bit MAC 500 may be reset or cleared. The clear switch 308 may be controlled to selectively electrically connect the analog adder, including the adder capacitors 506a, 506b, 506c, to the electrical ground 310. The adder switches 504a, 504b, 504c may also be controlled to electrically connect adder capacitors 506a, 506b, 506c to the electrical ground 310 via the clear switch 308. Electrically connecting components of the multi-bit MAC 500 to the electrical ground 310 may discharge any residual voltage in the multi-bit MAC 500 so that a next multiply and add of different combinations of "n" bit activation values and/or "m" bit weight values may be implemented by the multi-bit MAC 500.

In some embodiments, a buffer 502 may be electrically connected between the single-bit MACs 206a, 206b, 206c, 206d and the adder capacitors 506a, 506b, 506c. The buffer 502 may be an analog buffer configured to reduce the voltage and/or current loading effects of the adder capacitors 506a, 506b, 506c on the single-bit MACs 206a, 206b, 206c, 206d. In some embodiments, the buffer 502 may reduce the loading effects in comparison to the loading effects without the buffer 502. For example, the buffer 502 may reduce the voltage drop caused by mismatched relative impedances of the adder capacitors 506a, 506b, 506c and the single-bit MACs 206a, 206b, 206c, 206d. The buffer 502 may also be configured to improve the linearity of the single-bit MAC outputs from the single-bit MACs 206a, 206b, 206c, 206d to the adder capacitors 506a, 506b, 506c. In some embodiments, the buffer 502 may improve the linearity in comparison to the linearity without the buffer 502. For example, the buffer 502 may improve the linearity of the single-bit MAC outputs by linearly amplifying the single-bit MAC outputs when loss occurs in the transmission of the single-bit MAC outputs between the single-bit MACs 206a, 206b, 206c, 206d and the adder capacitors 506a, 506b, 506c.

Figure 6:
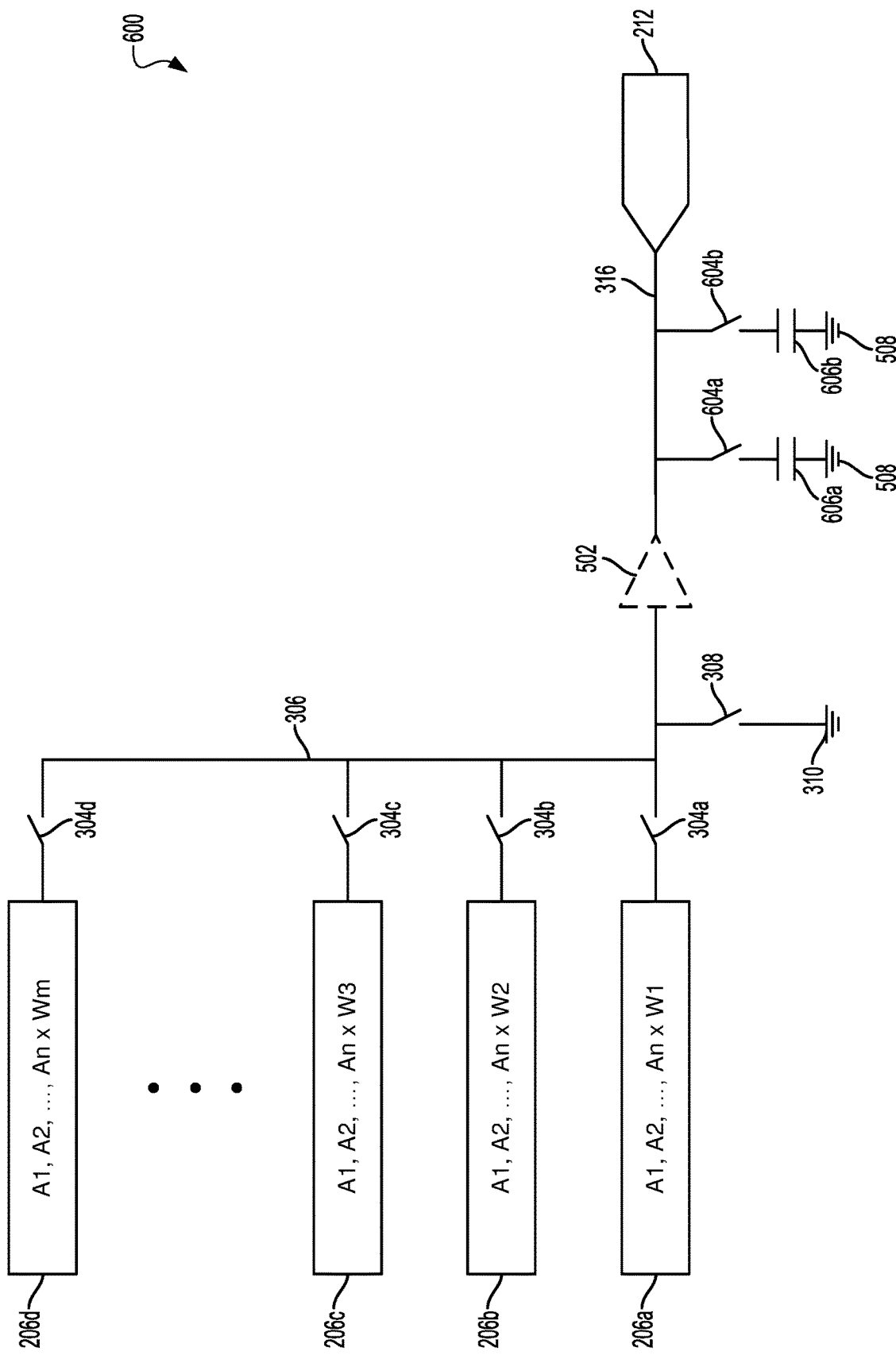
FIG. 6 is a circuit diagram illustrating an example multi-bit MAC using a sequential binary accumulator as a load suitable for implementing various embodiments.

FIG. 6 illustrates an example multi-bit MAC using a sequential binary accumulator as a load suitable for implementing various embodiments. With reference to FIGS. 1-6, a multi-bit MAC 600 may include any number of analog adders. In some embodiments, an analog adder may include any number of adder switches 604a, 604b and adder capacitors 606a, 606b. In some embodiments, an analog adder may further include any number of optional buffers 502. In some embodiments, an analog adder may further include any number and combination of clear switches 308, electrical grounds 310, and/or designated electrical grounds 508. Adder capacitors 606a, 606b of an analog adder may be selectively electrically connected to the single-bit MACs 206a, 206b, 206c, 206d via associated single-bit MAC switches 304a, 304b, 304c, 304d, associated adder switches 604a, 604b, and the electrical transmission bus 306. The adder capacitors 606a, 606b may be selectively electrically connected to each other via the adder switches 604a, 604b and an electrical transmission bus 316. The adder capacitors 606a, 606b may be electrically connected between the associated adder switches 604a, 604b and the electrical ground 508. The adder capacitors 606a, 606b may be selectively electrically connected to an electrical ground 310 via the adder switches 604a, 604b and a clear switch 308. The adder capacitors 606a, 606b may be electrically connected to an ADC 212 via the electrical transmission bus 316. The adder switches 604a, 604b may be controlled to selectively electrically connect the adder capacitors 606a, 606b to the electrical transmission bus 306, 316 by the MAC controller (e.g., processor 104, MAC controller 124 in FIG. 1).

The analog adder may receive single-bit MAC outputs from the single-bit MACs 206a, 206b, 206c, 206d at the adder capacitors 606a, 606b. The adder capacitors 606a, 606b may include a sampler capacitor 606a and an accumulator capacitor 606b. The sampler capacitor 606a may be selectively electrically connected to the single-bit MACs 206a, 206b, 206c, 206d. The accumulator capacitor 606b may be selectively electrically connected to the sampler capacitor 606a. The adder capacitors 606a, 606b may have the same capacitance ratings ("C"). In some embodiments, each adder capacitor 606a, 606b may be a single capacitor having the capacitance rating. In some embodiments, each adder capacitor 606a, 606b may be multiple capacitors electrically connected in series and/or parallel, that cumulatively have the capacitance rating. The capacitance ratings of the adder capacitor 606a, 606b may function as hardwired binary weights for the single-bit MAC outputs received by the adder capacitor 606a, 606b from the single-bit MACs 206a, 206b, 206c, 206d.

The sampler capacitor 606a may receive and store the single-bit MAC outputs from the single-bit MACs 206a, 206b, 206c, 206d when selectively electrically connected to the single-bit MACs 206a, 206b, 206c, 206d via the associated single-bit MAC switches 304a, 304b, 304c, 304d and the associated adder switches 604a, 604b, namely a sampler switch 604a. The single-bit MAC switches 304a, 304b, 304c, 304d and the sampler switch 604a may be controlled to output the single-bit MAC outputs from a single-bit MAC 206a, 206b, 206c, 206d so that sampler capacitor 606a receives the single-bit MAC outputs in a specific order. In some embodiments, the order may be sequential starting with the multiplication and accumulation of the least significant bits of an "n" bit activation value and of an "m" bit weight value to the most significant bits of the "n" bit activation value and of an "m" bit weight value. For example, the single-bit MAC switches 304a, 304b, 304c, 304d may be controlled to sequentially close circuits electrically connecting the single-bit MACs 206a, 206b, 206c, 206d and the analog adder to output the single-bit MAC outputs to the analog adder. The sampler switch 604a, associated with the sampler capacitor 606a, may be controlled to sequentially load the single-bit MAC outputs to the sampler capacitor 606a by closing a circuit electrically connecting the single-bit MACs 206a, 206b, 206c, 206d and the sampler capacitor 606a. In other words, the sampler capacitor 606a may receive the single-bit MAC outputs from each of the single-bit MACs 206a, 206b, 206c, 206d. In some embodiments, the sampler switch 604a may be controlled in a manner that a single-bit MAC output is loaded to the sampler capacitor 606a in an order based on the significance of the bits of the "n" bit activation value and of the "m" bit weight value multiplied to produce the single-bit MAC output. The sampler capacitor 606a may charge by receiving the single-bit MAC outputs when selectively electrically connected to the single-bit MACs 206a, 206b, 206c, 206d. The sampler capacitor 606a may store a sample of the single-bit MAC outputs, which may include a combination of the received single-bit MAC outputs modified by sharing the sample of the single-bit MAC outputs with the accumulator capacitor 606b. The sample of the single-bit MAC outputs is referred to herein as a single-bit MAC output sample. The sampler capacitor 606a may store and output the single-bit MAC output sample in response to receiving each single-bit MAC output.

The accumulator capacitor 606b may receive and store the single-bit MAC output sample from the sampler capacitor 606a when selectively electrically connected to the sampler capacitor 606a via the adder switches 604a, 604b, namely the sampler switch 604a and the accumulator switch 604b. The sampler capacitor 606a may share or output the single-bit MAC output sample to the accumulator capacitor 606b when the sampler capacitor 606a is selectively disconnected from the single-bit MACs 206a, 206b, 206c, 206d and selectively connected to the accumulator capacitor 606b by the adder switches 604a, 604b. The accumulator capacitor 606b may receive and store the single-bit MAC output sample. For example, the single-bit MAC switches 304a, 304b, 304c, 304d may be controlled to selectively disconnect the sampler capacitor 606a from the single-bit MACs 206a, 206b, 206c, 206d. The sampler switch 604a may be controlled to electrically connect the sampler capacitor 606a to the electrical transmission bus 316 and the accumulator switch 604b may be controlled to electrically connect the accumulator capacitor 606b to the electrical transmission bus 316. The sampler capacitor 606a may output the single-bit MAC output sample to the accumulator capacitor 606b. After receiving a single-bit MAC output, the single-bit MAC output sample may be shared by the sampler capacitor 606a and the accumulator capacitor 606b (as is described further herein with reference to FIG. 8). The process of receiving each single-bit MAC output by the sampler capacitor 606a, and outputting the single-bit MAC output sample by the sampler capacitor 606a and receiving the single-bit MAC output sample by the accumulator capacitor 606b may continue for each multiplication and addition of all of the bits of the "n" bit activation value and the "m" bit weight value.

After completing the multiplication and addition of a bit of the "n" bit activation value and the "m" bit weight value, the sampler capacitor 606a may be reset or cleared. The clear switch 308 may be controlled to selectively electrically connect the sampler capacitor 606a to an electrical ground 310. The sampler switch 604a may be controlled to selectively electrically connect the sampler capacitor 606a to the electrical ground 310. The accumulator switch 604b may be controlled to selectively electrically disconnect the accumulator capacitor 606b from the electrical ground 310. Electrically connecting components of the multi-bit MAC 600 to the electrical ground 310 may discharge any residual voltage in the components so that a next multiply and add of different combinations the "n" bit activation values and/or the "m" bit weight values may be implemented by the multi-bit MAC 600.

The accumulator capacitor 606b may output or discharge the single-bit MAC output sample when selectively electrically disconnected from the single-bit MACs 206a, 206b, 206c, 206d by the single-bit MAC switches 304a, 304b, 304c, 304d, selectively electrically disconnected from the sampler capacitor 606a by the sampler switch 604a, and selectively electrically connected to the ADC 212 by the accumulator switch 604b. The output of the accumulator capacitor 606b is also referred to herein as the multi-bit MAC output. The single-bit MAC output sample may be output as an analog voltage to the electrical transmission bus 316 and to the ADC 212. The analog voltage on the electrical transmission bus 316 may be converted by the ADC 212 to a digital signal.

After completing the multiplication and addition of all of the bits of the "n" bit activation value and the "m" bit weight value, the multi-bit MAC 600 may be reset or cleared. The clear switch 308 may be controlled to selectively electrically connect the analog adder, including the adder capacitors 606a, 606b, to the electrical ground 310. The adder switches 604a, 604b, may also be controlled to electrically connect the adder capacitors 606a, 606b to the electrical ground 310 via the clear switch 308. Electrically connecting components of the multi-bit MAC 600 to the electrical ground 310 may discharge any residual voltage in the multi-bit MAC 600 so that a next multiply and add of different combinations of "n" bit activation values and/or "m" bit weight values may be implemented by the multi-bit MAC 600.

In some embodiments, a buffer 502 may be electrically connected between the single-bit MACs 206a, 206b, 206c, 206d and the adder capacitors 606a, 606b. The buffer 502 may be an analog buffer configured to reduce the voltage and/or current loading effects of the adder capacitors 606a, 606b on the single-bit MACs 206a, 206b, 206c, 206d. In some embodiments, the buffer 502 may reduce the loading effects in comparison to the loading effects without the buffer 502. For example, the buffer 502 may reduce the voltage drop caused by mismatched relative impedances of the adder capacitors 606a, 606b and the single-bit MACs 206a, 206b, 206c, 206d. The buffer 502 may also be configured to improve the linearity of the single-bit MAC outputs from the single-bit MACs 206a, 206b, 206c, 206d to the adder capacitors 606a, 606b. In some embodiments, the buffer 502 may improve the linearity in comparison to the linearity without the buffer 502. For example, the buffer 502 may improve the linearity of the single-bit MAC outputs by linearly amplifying the single-bit MAC outputs when loss occurs in the transmission of the single-bit MAC outputs between the single-bit MACs 206a, 206b, 206c, 206d and the adder capacitors 606a, 606b. The buffer 502 may be omitted for implementations for large "n" bit activation value and/or "m" bit weight value, for which the single-bit MAC outputs of the single-bit MACs 206a, 206b, 206c, 206d are large, as sharing the single-bit MAC outputs may not cause much loss between the single-bit MACs 206a, 206b, 206c, 206d and the sampler capacitor 606a. The loss between the single-bit MACs 206a, 206b, 206c, 206d and the sampler capacitor 606a may be a linear loss and may not result in nonlinearity.

Figure 7:
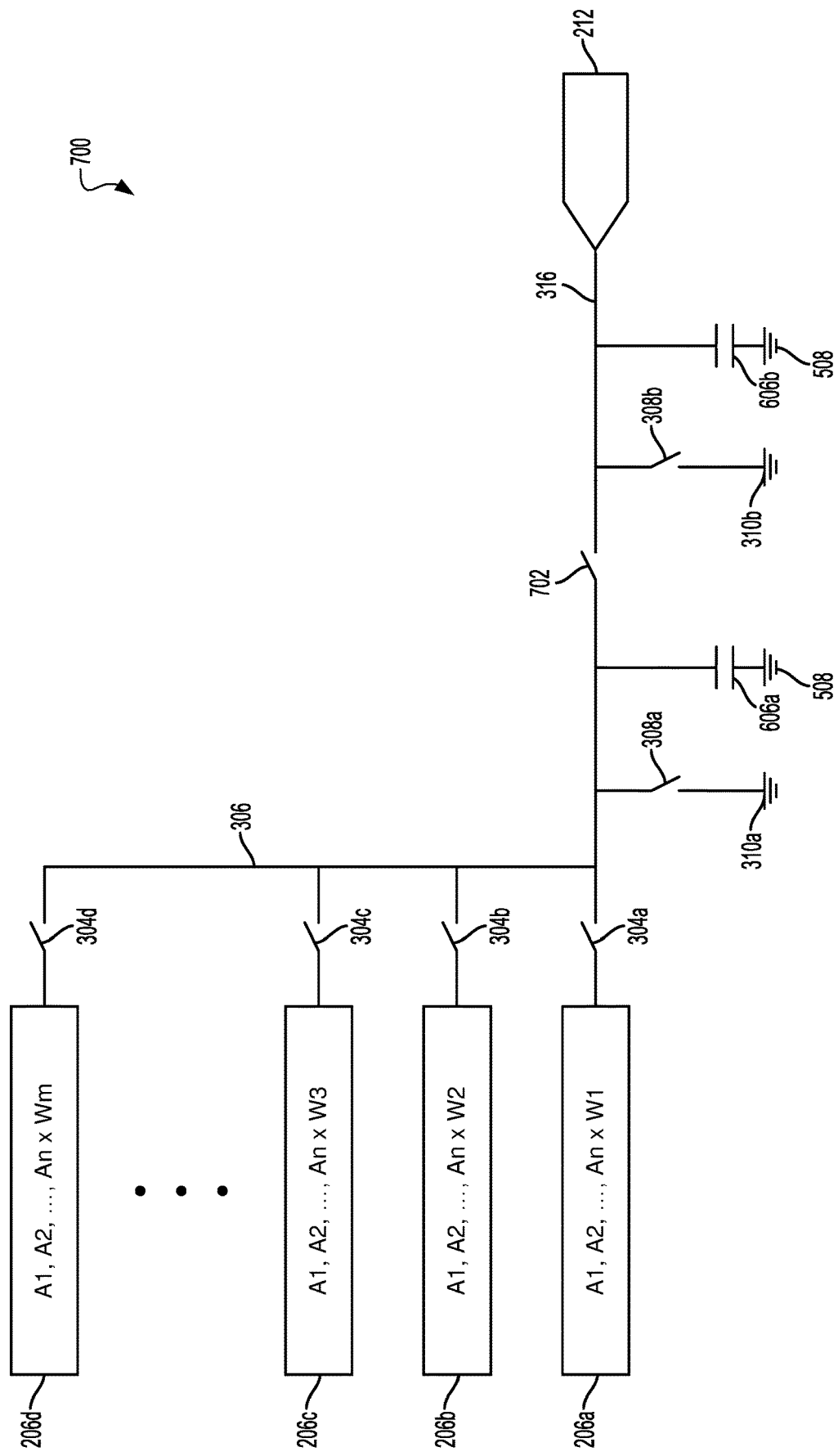
FIG. 7 is a circuit diagram illustrating an example multi-bit MAC using a sequential binary accumulator as a load suitable for implementing various embodiments.

FIG. 7 illustrates an example multi-bit MAC using a sequential binary accumulator as a load suitable for implementing various embodiments. With reference to FIGS. 1-7, a multi-bit MAC 700 may include any number of analog adders. In some embodiments, an analog adder may include any number of adder switches 702 and adder capacitors 606a, 606b. In some embodiments, an analog adder may further include any number and combination of clear switches 308a, 308b, electrical grounds 310a, 310b, and/or designated electrical grounds 508. Adder capacitors 606a, 606b of an analog adder may be selectively electrically connected to the single-bit MACs 206a, 206b, 206c, 206d via associated single-bit MAC switches 304a, 304b, 304c, 304d, associated adder switch 702, and the electrical transmission bus 306. The adder capacitors 606a, 606b may be selectively electrically connected to each other via the adder switch 702 and an electrical transmission bus 316. The adder capacitors 606a, 606b may be electrically connected between the electrical transmission bus 316 and the electrical ground 508. The adder capacitors 606a, 606b may be selectively electrically connected to electrical grounds 310a, 310b via clear switches 308a, 308b. The adder capacitors 606a, 606b may be electrically connected to an ADC 212 via the electrical transmission bus 316. The adder switch 702 may be controlled to selectively electrically connect the adder capacitors 606a, 606b to each other by the MAC controller (e.g., processor 104, MAC controller 124 in FIG. 1).

The analog adder may receive single-bit MAC outputs from the single-bit MACs 206a, 206b, 206c, 206d at the adder capacitors 606a, 606b. The adder capacitors 606a, 606b may include a sampler capacitor 606a and an accumulator capacitor 606b. The sampler capacitor 606a may be selectively electrically connected to the single-bit MACs 206a, 206b, 206c, 206d. The accumulator capacitor 606b may be selectively electrically connected to the sampler capacitor 606a. The adder capacitors 606a, 606b may have the same capacitance ratings ("C"). In some embodiments, each adder capacitor 606a, 606b may be a single capacitor having the capacitance rating. In some embodiments, each adder capacitor 606a, 606b may be multiple capacitors electrically connected in series and/or parallel, that cumulatively have the capacitance rating. The capacitance ratings of the adder capacitor 606a, 606b may function as hardwired binary weights for the single-bit MAC outputs received by the adder capacitor 606a, 606b from the single-bit MACs 206a, 206b, 206c, 206d.

The sampler capacitor 606a may receive and store the single-bit MAC outputs from the single-bit MACs 206a, 206b, 206c, 206d when selectively electrically connected to the single-bit MACs 206a, 206b, 206c, 206d via the associated single-bit MAC switches 304a, 304b, 304c, 304d. The single-bit MAC switches 304a, 304b, 304c, 304d may be controlled to output the single-bit MAC outputs from a single-bit MAC 206a, 206b, 206c, 206d so that sampler capacitor 606a receives the single-bit MAC outputs in a specific order. In some embodiments, the order may be sequential starting with the multiplication and accumulation of the least significant bits of an "n" bit activation value and of an "m" bit weight value to the most significant bits of the "n" bit activation value and of an "m" bit weight value. For example, the single-bit MAC switches 304a, 304b, 304c, 304d may be controlled to sequentially close circuits electrically connecting the single-bit MACs 206a, 206b, 206c, 206d and the analog adder to output the single-bit MAC outputs to the analog adder. The sampler capacitor 606a may be sequentially loaded with the single-bit MAC outputs by closing a circuit electrically connecting the single-bit MACs 206a, 206b, 206c, 206d and the sampler capacitor 606a. In other words, the sampler capacitor 606a may receive the single-bit MAC outputs from each of the single-bit MACs 206a, 206b, 206c, 206d. In some embodiments, the single-bit MAC switches 304a, 304b, 304c, 304d may be controlled in a manner that a single-bit MAC output is loaded to the sampler capacitor 606a in an order based on the significance of the bits of the "n" bit activation value and of the "m" bit weight value multiplied and accumulated to produce the single-bit MAC output. The sampler capacitor 606a may charge by receiving the single-bit MAC outputs when selectively electrically connected to the single-bit MACs 206a, 206b, 206c, 206d. The sampler capacitor 606a may store a sample of the single-bit MAC outputs, which may include a combination of the received single-bit MAC outputs modified by sharing the sample of the single-bit MAC outputs with the accumulator capacitor 606b. The sample of the single-bit MAC outputs is referred to herein as a single-bit MAC output sample. The sampler capacitor 606a may store and output the single-bit MAC output sample in response to receiving each single-bit MAC output.

The accumulator capacitor 606b may receive and store the single-bit MAC output sample from the sampler capacitor 606a when selectively electrically connected to the sampler capacitor 606a via the adder switch 702. The sampler capacitor 606a may discharge or output the single-bit MAC output sample to the accumulator capacitor 606b when the sampler capacitor 606a is selectively disconnected from the single-bit MACs 206a, 206b, 206c, 206d and selectively connected to the accumulator capacitor 606b by the adder switch 702. The accumulator capacitor 606b may receive and store the single-bit MAC output sample. For example, the single-bit MAC switches 304a, 304b, 304c, 304d may be controlled to selectively disconnect the sampler capacitor 606a from the single-bit MACs 206a, 206b, 206c, 206d. The adder switch 702 may be controlled to electrically connect the sampler capacitor 606a to the accumulator capacitor 606b via the electrical transmission bus 316. The sampler capacitor 606a may output the single-bit MAC output sample to the accumulator capacitor 606b. After receiving a single-bit MAC output, the single-bit MAC output sample may be shared by the sampler capacitor 606a and the accumulator capacitor 606b, as described further herein with reference to FIG. 8. The process of receiving each single-bit MAC output by the sampler capacitor 606a, and outputting the single-bit MAC output sample by the sampler capacitor 606a and receiving the single-bit MAC output sample by the accumulator capacitor 606b may continue for each multiplication and addition of all of the bits of the "n" bit activation value and the "m" bit weight value.

After completing the multiplication and addition of a bit of the "n" bit activation value and the "m" bit weight value, the sampler capacitor 606a may be reset or cleared. The clear switch 308a may be controlled to selectively electrically connect the sampler capacitor 606a to an electrical ground 310a. The clear switch 308b and the adder switch 702 may be controlled to selectively electrically disconnect the accumulator capacitor 606b from the electrical grounds 310a, 310b. Electrically connecting components of the multi-bit MAC 700 to the electrical ground 310a may discharge any residual voltage in the components so that a next multiply and add of different combinations of the "n" bit activation values and/or the "m" bit weight values may be implemented by the multi-bit MAC 700.

The accumulator capacitor 606b may output or discharge the single-bit MAC output sample when selectively electrically disconnected from the single-bit MACS 206a, 206b, 206c, 206d and the sampler capacitor 606a by the adder switch 702, and selectively electrically connected to the ADC 212 by the electrical transmission bus 316. The output of the accumulator capacitor 606b is also referred to herein as the multi-bit MAC output. The single-bit MAC output sample may be output as an analog voltage to the electrical transmission bus 316 and to the ADC 212. The analog voltage on the electrical transmission bus 316 may be converted by the ADC 212 to a digital signal.

After completing the multiplication and addition of all of the bits of the "n" bit activation value and the "m" bit weight value, the multi-bit MAC 700 may be reset or cleared. The clear switches 308a, 308b may be controlled to selectively electrically connect the analog adder, including the adder capacitors 606a, 606b, to the electrical grounds 310a, 310b. Electrically connecting components of the multi-bit MAC 700 to the electrical grounds 310a, 310b may discharge any residual voltage in the multi-bit MAC 700 so that a next multiply and add of different combinations of "n" bit activation values and/or "m" bit weight values may be implemented by the multi-bit MAC 700.

Figure 8:
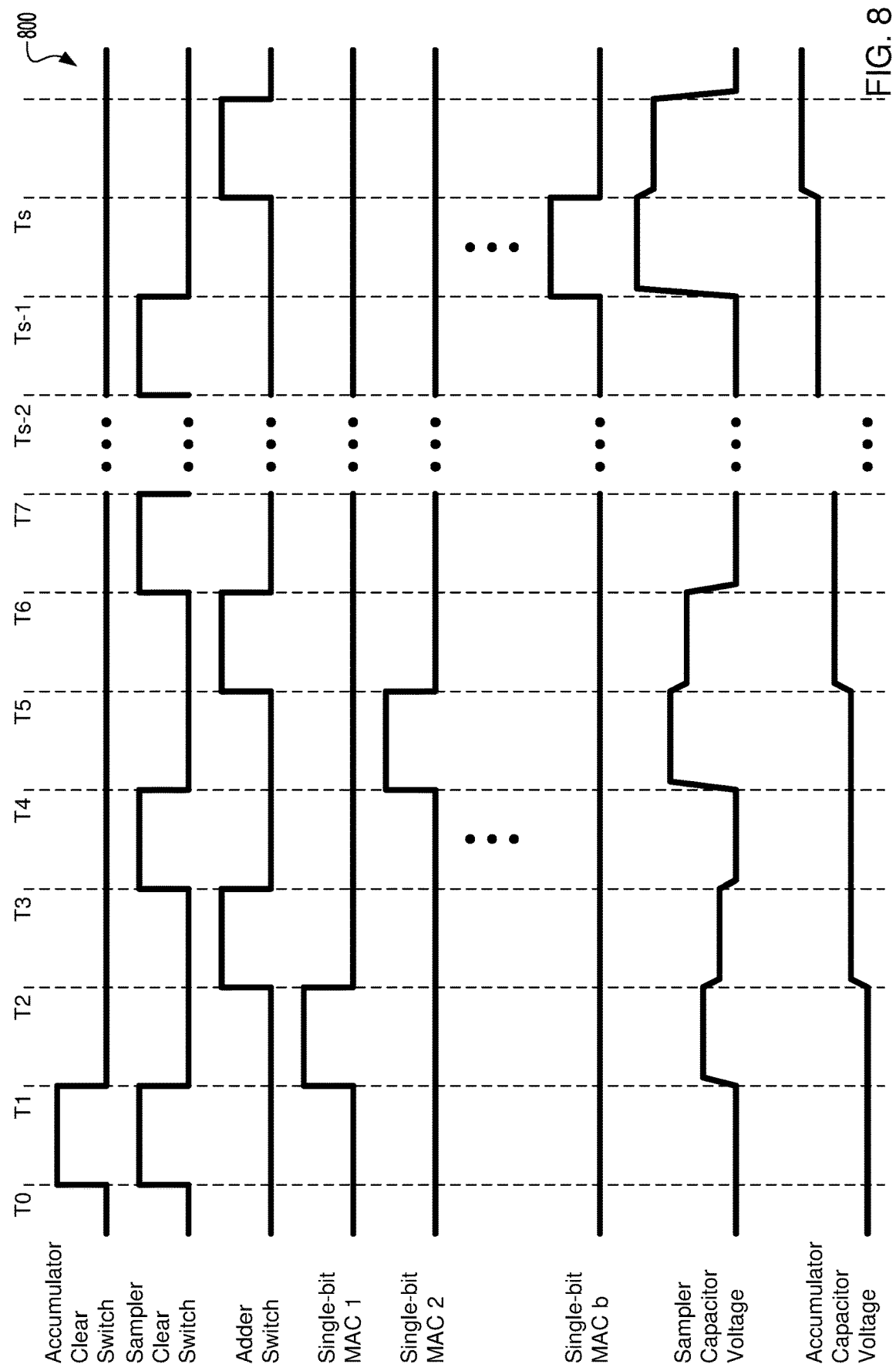
FIG. 8 is a timing diagram illustrating signal flow of an example multi-bit MAC using a sequential binary accumulator as a load suitable for implementing various embodiments.

FIG. 8 illustrates an example signal flow of an example multi-bit MAC using a sequential binary accumulator suitable for implementing various embodiments. With reference to FIGS. 1-8, a signal timing diagram 800 for a multi-bit MAC (e.g., multi-bit MAC 700 in FIG. 7) using a sequential binary accumulator may include an accumulator clear switch control signal ("accumulator clear switch"), a sampler clear switch control signal ("sampler clear switch"), and an adder switch control signal ("adder switch"), multiple single-bit MAC output signals (e.g., "single-bit MAC 1", "single-bit MAC 2", ... "single-bit MAC b"), and a sampler capacitor voltage measurement ("sampler capacitor voltage") and an accumulator capacitor voltage measurement ("accumulator capacitor voltage"). The accumulator clear switch control signal, the sampler clear switch control signal, and the adder switch control signal may be control signals issued by the control device (not shown) for controlling an accumulator clear switch (e.g., clear switch 308b in FIG. 7), a sampler clear switch (e.g., clear switch 308a in FIG. 7), and an adder switch (e.g., adder switch 702 in FIG. 7). The single-bit MAC output signals may be single-bit MAC outputs output by single-bit MACs (e.g., single-bit MACs 206a, 206b, 206c, 206d in FIG. 7). The sampler capacitor voltage measurement may be a voltage of a sampler capacitor (e.g., sampler capacitor 606a in FIG. 7) and an accumulator capacitor voltage measurement may be a voltage of an accumulator capacitor (e.g., accumulator capacitor 606b in FIG. 7). The example illustrated in FIG. 8 may be related to the multi-bit MAC 700 described herein with reference to FIG. 7. However, the example illustrated in FIG. 8 is not meant to limit the scope of the claims or specification, as it is clear that similar control signals, single-bit MAC outputs, and capacitor voltage measurements may be implemented for the various multi-bit MACs 200, 300, 400, 500, 600 described herein with reference to FIGS. 2-6.

In the signal timing diagram 800, at time T0, the accumulator clear switch control signal and the sampler clear switch control signal may be asserted by the control device. The accumulator clear switch control signal and the sampler clear switch control signal may be asserted to selectively electrically connect the sampler capacitor and the accumulator capacitor to electrical grounds (e.g., electrical grounds 310a, 310b in FIG. 7) via the clear switches, such as a sampler clear switch and an accumulator clear switch. As the sampler capacitor and the accumulator capacitor to electrical grounds may be electrically connected to electrical grounds, the sampler capacitor voltage measurement and the accumulator capacitor voltage measurement may exhibit little to no voltage. As described herein, single-bit MAC switches (e.g., single-bit MAC switches 304a, 304b, 304c, 304d in FIG. 7) may be controlled to selectively electrically disconnect the single-bit MACs from the sampler capacitor and the accumulator capacitor. Therefore, at time T0, the single-bit MAC output signals may not have any value. The adder switch control signal may be deasserted by the control device at time T0.

At time T1, the accumulator clear switch control signal and the sampler clear switch control signal may be deasserted by the control device, which may selectively electrically disconnect the sampler capacitor and the accumulator capacitor from the electrical grounds via the clear switches. A first single-bit MAC may multiply the "n" bit activation value and the least significant bit of the "m" bit weight value, accumulate the result of the multiplication, and output a first single-bit MAC output (e.g., single-bit MAC 1). The first single-bit MAC may be electrically connected to the sampler capacitor via a first single-bit MAC switch, and output the single-bit MAC output to the sampler capacitor. The sampler capacitor may receive the first single-bit MAC output and exhibit a first sampler capacitor voltage measurement (Vmult1). The adder switch control signal may be deasserted by the control device at time T0, and no voltage may be shared between the sampler capacitor and the accumulator capacitor. Thus, the accumulator capacitor voltage measurement may remain at the previous voltage from time T0.

At time T2, the adder switch control signal may be asserted by the control device. In response, the adder switch may selectively electrically connect the sampler capacitor and the accumulator capacitor. The first sampler capacitor voltage measurement may be shared between the sampler capacitor and the accumulator capacitor. Each time the sampler capacitor and the accumulator capacitor share a sampler capacitor voltage measurement, the voltage of the sampler capacitor voltage measurement may be divided by half at the sampler capacitor and half the voltage may be provided to the accumulator capacitor. Thus, the first sampler capacitor voltage measurement may become (Vmult1)/2 and a first accumulator capacitor voltage measurement (e.g., first single-bit MAC output sample) may become (Vmult1)/2.

At time T3, the adder switch control signal may be deasserted and the sampler clear switch control signal may be asserted by the control device. Deasserting the adder switch control signal may trigger the adder switch to selectively electrically disconnect the sampler capacitor and the accumulator capacitor. Asserting the sampler clear switch control signal may trigger a clear switch to selectively electrically connect the sampler capacitor to an electrical ground, which may draw the first sampler capacitor voltage measurement down to or near zero volts. The first accumulator capacitor voltage measurement may remain at (Vmult1)/2.

At time T4, the sampler clear switch control signal may be deasserted by the control device and a second single-bit MAC may multiply the "n" bit activation value and the next most significant bit of the "m" bit weight value, accumulate the result of the multiplication, and output a second single-bit MAC output (e.g., single-bit MAC 2). Deasserting the sampler clear switch control signal may trigger the clear switch to selectively electrically disconnect the sampler capacitor from the electrical ground. The sampler capacitor may receive the second single-bit MAC output and exhibit a second sampler capacitor voltage measurement (Vmult2).

At time T5, the adder switch control signal may be asserted by the control device. In response, the adder switch may selectively electrically connect the sampler capacitor and the accumulator capacitor. The second sampler capacitor voltage measurement and the first accumulator capacitor voltage measurement may be shared between the sampler capacitor and the accumulator capacitor. Each time the sampler capacitor and the accumulator capacitor share an accumulator capacitor voltage measurement, the voltage of the accumulator capacitor voltage measurement may be divided by half at the accumulator capacitor and half the voltage may be provided to the sampler capacitor. Thus, the second sampler capacitor voltage measurement may become (Vmult1)/4+(Vmult2)/2 and a second accumulator capacitor voltage measurement (e.g., second single-bit MAC output sample) may become (Vmult1)/4+(Vmult2)/2.

At time T6, the adder switch control signal may be deasserted and the sampler clear switch control signal may be asserted by the control device. Deasserting the adder switch control signal may trigger the adder switch to selectively electrically disconnect the sampler capacitor and the accumulator capacitor. Asserting the sampler clear switch control signal may trigger the clear switch to selectively electrically connect the sampler capacitor to an electrical ground, which may draw the second sampler capacitor voltage measurement down to or near zero volts. The second accumulator capacitor voltage measurement may remain at (Vmult1)/4+(Vmult2)/2.

Over various periods, the adder switch control signal and the sampler clear switch control signal may repeat the pattern exhibited at times T1-T6, and various single-bit MACs may repeatedly multiply the "n" bit activation value and the next most significant bit of the "m" bit weight value, accumulate the results to the multiplications, and output an additional single-bit MAC outputs. The sampler capacitor voltage measurement and the accumulator capacitor voltage measurement may fluctuate accordingly.

At time Ts−2, the adder switch control signal may be deasserted and the sampler clear switch control signal may be asserted by the control device. Deasserting the adder switch control signal may trigger the adder switch to selectively electrically disconnect the sampler capacitor and the accumulator capacitor. Asserting the sampler clear switch control signal may trigger the clear switch to selectively electrically connect the sampler capacitor to an electrical ground, which may draw a $(b-1)^{th}$ sampler capacitor voltage measurement down to or near zero volts. The second accumulator capacitor voltage measurement may remain at $(Vmult1)/2^{b-1}+(Vmult2)/2^{b-2}+\ldots+(Vmultb-1)/2$.

At time Ts−1, the sampler clear switch control signal may be deasserted by the control device and a $b^{th}$ single-bit MAC may multiply the "n" bit activation value and the most significant bit of the "m" bit weight value, accumulate the result of the multiplication, and output a $b^{th}$ single-bit MAC output (e.g., single-bit MAC b). Deasserting the sampler clear switch control signal may trigger the clear switch to selectively electrically disconnect the sampler capacitor from the electrical ground. The sampler capacitor may receive the second single-bit MAC output and exhibit a second sampler capacitor voltage measurement (Vmultb).

At time Ts, the adder switch control signal may be asserted by the control device. In response, the adder switch may selectively electrically connect the sampler capacitor and the accumulator capacitor. The $b^{th}$ sampler capacitor voltage measurement and the $(b-1)^{th}$ accumulator capacitor voltage measurement may be shared between the sampler capacitor and the accumulator capacitor. The $b^{th}$ sampler capacitor voltage measurement may become $(Vmult1)/2^b+(Vmult2)/2^{b-1}+\ldots+(Vmultb-1)/4+(Vmultb)/2$ and a $b^{th}$ accumulator capacitor voltage measurement (e.g., second single-bit MAC output sample) may become $(Vmult1)/2^b+(Vmult2)/2^{b-1}+\ldots+(Vmultb-1)/4+(Vmultb)/2$.

FIG. 9 illustrates an example of single-bit MAC output adders for multi-bit activation values and multi-bit weight suitable for implementing various embodiments. With reference to FIGS. 1-9, a multi-bit MAC 900 may include any number of analog adders. In some embodiments, an analog adder may include any number of adder switches 908a, 908b, 908c, 908d, 910a, 910b, 910c, 910d, 912a, 912b, 912c, 912d and adder capacitors 904a, 904b, 904c, 904d, 906a, 906b, 906c, 906d, 906e, 906f, 906g, 906h. In some embodiments, an analog adder may further include any number of designated electrical grounds 508. Adder capacitors 904a, 904b, 904c, 904d, referred to herein as sampler capacitors, of an analog adder may be selectively electrically connected to single-bit MACS 206, 206a, 206b, 206c, 206d via associated single-bit MAC switches 304a, 304b, 304c, 304d. The adder capacitors 904a, 904b, 904c, 904d, 906a, 906b, 906c, 906d, 906e, 906f, 906g, 906h may be selectively electrically connected to each other via the adder switches 908a, 908b, 908c, 908d, 910a, 910b, 910c, 910d. The adder capacitors 904a, 904b, 904c, 904d, 906a, 906b, 906c, 906d, 906e, 906f, 906g, 906h may be electrically connected between the electrical transmission bus 316 and the electrical grounds 508. The adder capacitors 904a, 904b, 904c, 904d, 906a, 906b, 906c, 906d, 906e, 906f, 906g, 906h may be electrically connected to an ADC 212 via the electrical transmission bus 316 and the adder switches 912a, 912b, 912c, 912d. The adder switches 908a, 908b, 908c, 908d, 910a, 910b, 910c, 910d, 912a, 912b, 912c, 912d may be controlled to selectively electrically connect the adder capacitors 904a, 904b, 904c, 904d, 906a, 906b, 906c, 906d, 906e, 906f, 906g, 906h to each other and the ADC 212 by the MAC controller (e.g., processor 104, MAC controller 124 in FIG. 1). Further, some embodiments of a multi-bit MAC 900 may include any number and combination of clear switches and electrical grounds as illustrated in and described with reference to FIG. 10.

The analog adder may receive single-bit MAC outputs from the single-bit MACs 206, 206a, 206b, 206c, 206d at the sampler capacitors 904a, 904b, 904c, 904d. The sampler capacitors 904a, 904b, 904c, 904d may be selectively electrically connected to a single-bit MAC 206, 206a, 206b, 206c, 206d. The adder capacitors 906a, 906c, 906e, 906g referred to herein as first accumulator capacitors, may be selectively electrically connected to the sampler capacitors 904a, 904b, 904c, 904d. The adder capacitors 906b, 906d, 906f, 906h, referred to herein as second accumulator capacitors, may be selectively electrically connected to the first accumulator capacitors 906a, 906c, 906e, 906g. The sampler capacitors 904a, 904b, 904c, 904d and pairs of first and second accumulator capacitors 906a, 906b, 906c, 906d, 906e, 906f, 906g, 906h, cumulatively, may have the same capacitance ratings ("C"). The capacitance rating of the second accumulator capacitors 906b, 906d, 906f, 906h may be proportional to the significance of the bit of the "n" bit activation value by which the bits of the "m" bit weight value are multiplied or the "m" bit weight value by which the bits of the "n" bit activation value are multiplied. For example, the capacitance rating of the second accumulator capacitors 906b, 906d, 906f, 906h may be lowest for a least significant bit and highest for a most significant bit. As another example, the capacitance rating of the first accumulator capacitors 906a, 906c, 906e, 906g may be highest for a least significant bit and lowest for a most significant bit. The cumulative capacitance of a pair of a first accumulator capacitor 906a, 906c, 906e, 906g and a second accumulator capacitors 906b, 906d, 906f, 906h may equal the capacitance of a sampler capacitor 904a, 904b, 904c, 904d. In some embodiments, each adder capacitors 904a, 904b, 904c, 904d, 906a, 906b, 906c, 906d, 906e, 906f, 906g, 906h may be a single capacitor. In some embodiments, each adder capacitors 904a, 904b, 904c, 904d, 906a, 906b, 906c, 906d, 906e, 906f, 906g, 906h may be multiple capacitors electrically connected in series and/or parallel. The capacitance ratings of the adder capacitors 904a, 904b, 904c, 904d, 906a, 906b, 906c, 906d, 906e, 906f, 906g, 906h may function as hardwired binary weights for the single-bit MAC outputs received by the analog adder from the single-bit MACs 206, 206a, 206b, 206c, 206d.

The sampler capacitors 904a, 904b, 904c, 904d may receive and store the single-bit MAC outputs from the single-bit MACs 206, 206a, 206b, 206c, 206d when selectively electrically connected to the single-bit MACs 206, 206a, 206b, 206c, 206d via the associated single-bit MAC switches 304a, 304b, 304c, 304d. The single-bit MAC switches 304a, 304b, 304c, 304d may be controlled to output the single-bit MAC outputs from the single-bit MACs 206, 206a, 206b, 206c, 206d so that the sampler capacitors 904a, 904b, 904c, 904d receive the single-bit MAC outputs in a specific order. In some embodiments, the order may be sequential starting with the multiplication of the least significant bits of an "n" bit activation value and of an "m" bit weight value to the most significant bits of the "n" bit activation value and of an "m" bit weight value. For example, the single-bit MAC switches 304a, 304b, 304c, 304d may be controlled to sequentially close circuits electrically connecting single-bit MACs 206, 206a, 206b, 206c, 206d and the analog adder to output the single-bit MAC outputs to the analog adder. The sampler capacitors 904a, 904b, 904c, 904d may be sequentially loaded with the single-bit MAC outputs by closing a circuit electrically connecting the single-bit MACs 206, 206a, 206b, 206c, 206d and the sampler capacitors 904a, 904b, 904c, 904d. In other words, the sampler capacitors 904a, 904b, 904c, 904d may receive the single-bit MAC outputs for each multiplication and accumulation of bit of the "n" bit activation value and the "m" bit weight value from the single-bit MACs 206, 206a, 206b, 206c, 206d. In some embodiments, the single-bit MAC switches 304a, 304b, 304c, 304d may be controlled in a manner that a single-bit MAC outputs are loaded to the sampler capacitors 904a, 904b, 904c, 904d in an order based on the significance of the bits of the "n" bit activation value and of the "m" bit weight value multiplied to produce the single-bit MAC output. The sampler capacitors 904a, 904b, 904c, 904d may charge by receiving the single-bit MAC outputs when selectively electrically connected to the single-bit MACs 206, 206a, 206b, 206c, 206d. The sampler capacitors 904a, 904b, 904c, 904d may store a sample of the single-bit MAC outputs, which may include a combination of the received single-bit MAC outputs modified by sharing the sample of the single-bit MAC outputs with the accumulator capacitors 906a, 906b, 906c, 906d, 906e, 906f, 906g, 906h. The sample of the single-bit MAC outputs is referred to herein as a single-bit MAC output sample. The sampler capacitors 904a, 904b, 904c, 904d may store and output the single-bit MAC output samples in response to receiving each single-bit MAC output.

The accumulator capacitors 906a, 906b, 906c, 906d, 906e, 906f, 906g, 906h may receive and store the single-bit MAC output samples from the sampler capacitors 904a, 904b, 904c, 904d when selectively electrically connected to the sampler capacitors 904a, 904b, 904c, 904d via the adder switches 908a, 908b, 908c, 908d and/or the adder switches 910a, 910b, 910c, 910d. The sampler capacitors 904a, 904b, 904c, 904d may discharge or output the single-bit MAC output samples to the accumulator capacitors 906a, 906b, 906c, 906d, 906e, 906f, 906g, 906h when the sampler capacitors 904a, 904b, 904c, 904d are selectively disconnected from the single-bit MACs 206, 206a, 206b, 206c, 206d and selectively connected to the accumulator capacitors 906a, 906b, 906c, 906d, 906e, 906f, 906g, 906h by the adder switches 908a, 908b, 908c, 908d and/or the adder switches 910a, 910b, 910c, 910d. The accumulator capacitors 906a, 906b, 906c, 906d, 906e, 906f, 906g, 906h may receive and store the single-bit MAC output samples. For example, the single-bit MAC switches 304a, 304b, 304c, 304d may be controlled to selectively disconnect the sampler capacitors 904a, 904b, 904c, 904d from the single-bit MACs 206, 206a, 206b, 206c, 206d. The adder switches 908a, 908b, 908c, 908d may be controlled to electrically connect the sampler capacitors 904a, 904b, 904c, 904d to the accumulator capacitors 906a, 906b, 906c, 906d, 906e, 906f, 906g, 906h via the electrical transmission bus 316. The adder switches 910a, 910b, 910c, 910d may also be controlled to electrically connect the sampler capacitors 904a, 904b, 904c, 904d to the second accumulator capacitors 906b, 906d, 906f, 906h via the electrical transmission bus 316. The sampler capacitors 904a, 904b, 904c, 904d may output the single-bit MAC output samples to the accumulator capacitors 906a, 906b, 906c, 906d, 906e, 906f, 906g, 906h. After receiving the single-bit MAC output samples, the single-bit MAC output sample may be shared by the sampler capacitors 904a, 904b, 904c, 904d and the accumulator capacitors 906a, 906b, 906c, 906d, 906e, 906f, 906g, 906h as described further herein with reference to FIG. 8, for which pairs of accumulator capacitors 906a and 906b, 906c and 906d, 906e and 906f, 906g and 906h may be represented as a single accumulator capacitor. The process of receiving each single-bit MAC output by the sampler capacitors 904a, 904b, 904c, 904d, and outputting the single-bit MAC output sample by the sampler capacitors 904a, 904b, 904c, 904d and receiving the single-bit MAC output sample by the accumulator capacitors 906a, 906b, 906c, 906d, 906e, 906f, 906g, 906h may continue for each multiplication and addition of all of the bits of the "n" bit activation value and the "m" bit weight value.

The second accumulator capacitors 906b, 906d, 906f, 906h may output or discharge the single-bit MAC output sample when selectively electrically disconnected from the single-bit MACs 206, 206a, 206b, 206c, 206d, the sampler capacitors 904a, 904b, 904c, 904d, and the first accumulator capacitors 906a, 906c, 906e, 906g by the adder switches 910a, 910b, 910c, 910d, and selectively electrically connected to the ADC 212 by the adder switches 912a, 912b, 912c, 912d. The adder switches 910a, 910b, 910c, 910d may be controlled to selectively electrically disconnect the second accumulator capacitors 906b, 906d, 906f, 906h from the single-bit MACs 206, 206a, 206b, 206c, 206d, the sampler capacitors 904a, 904b, 904c, 904d, and the first accumulator capacitors 906a, 906c, 906e, 906g. The adder switches 912a, 912b, 912c, 912d may be controlled to selectively electrically connect the second accumulator capacitors 906b, 906d, 906f, 906h to the ADC 212 via the electrical transmission conduit 316. The single-bit MAC output samples may be output as weighted analog voltages to the electrical transmission bus 316 and to the ADC 212. The weights of each of the analog voltages may be based on the capacitance ratings of the second accumulator capacitors 906b, 906d, 906f, 906h that outputs an analog voltage. The combination of the weighted analog voltages on the transmission bus 316, also be referred to herein as the multi-bit MAC output, may be an addition of the weighted analog voltages resulting in weighted average analog voltage of the weighted analog voltages. The combination may result in a weighted average analog voltage by virtue of the accumulator capacitors 906b, 906d, 906f, 906h being electrically connected to the electrical transmission bus 316 in parallel. The weighted average analog voltage on the electrical transmission bus 316 may be converted by the ADC 212 to a digital signal.

FIG. 10 illustrates an example of single-bit MAC output adders for multi-bit activation values and multi-bit weight suitable for implementing various embodiments. With reference to FIGS. 1-10, a multi-bit MAC 1000 may include any number of analog adders. In some embodiments, an analog adder may include any number of adder switches 1004a, 1004b, 1004c, 1004d, 1006a, 1006b, 1006c, 1006d, and adder capacitors 904a, 904b, 904c, 904d, 1002a, 1002b, 1002c, 1002d. In some embodiments, an analog adder may further include an output switch 1008. In some embodiments, an analog adder may further include any number of designated electrical grounds 508. In some embodiments, an analog adder may further include any number and combination of clear switches 1010a, 1010b, 1010c, 1010d, 1014a, 1014b, 1014c, 1014d, 1016a, 1016b, 1016c, 1016d and electrical grounds 1012. Adder capacitors 904a, 904b, 904c, 904d, referred to herein as sampler capacitors, of an analog adder may be selectively electrically connected to single-bit MACs 206, 206a, 206b, 206c, 206d via associated single-bit MAC switches 304a, 304b, 304c, 304d. The adder capacitors 904a, 904b, 904c, 904d, 1002a, 1002b, 1002c, 1002d may be selectively electrically connected to each other via the adder switches 1004a, 1004b, 1004c, 1004d, 1006a, 1006b, 1006c, 1006d. The adder capacitors 904a, 904b, 904c, 904d, 1002a, 1002b, 1002c, 1002d may be electrically connected between the electrical transmission bus 316 and the electrical grounds 508. The adder capacitors 904a, 904b, 904c, 904d, 1002a, 1002b, 1002c, 1002d may be may be selectively electrically connected to electrical grounds 508 via clear switches 1014a, 1014b, 1014c, 1014d, 1016a, 1016b, 1016c, 1016d. For example, a pair of an adder capacitor 904a, 904b, 904c, 904d, 1002a, 1002b, 1002c, 1002d and a clear switch 1014a, 1014b, 1014c, 1014d, 1016a, 1016b, 1016c, 1016d may be electrically connected to an electrical ground 508 in parallel. The adder capacitors 904d, 1002d may be electrically connected to an ADC 212 via the electrical transmission bus 316 and the output switch 1008. The single bit MACs 206a, 206b, 206c, 206d may be selectively electrically connected to electrical grounds 1012 via clear switches 1010a, 1010b, 1010c, 1010d. The adder switches 1004a, 1004b, 1004c, 1004d, 1006a, 1006b, 1006c, 1006d may be controlled to selectively electrically connect the adder capacitors 904a, 904b, 904c, 904d, 1002a, 1002b, 1002c, 1002d to each other and the output switch 1008 may be controlled to selectively electrically connect the adder capacitors 904a, 904b, 904c, 904d, 1002a, 1002b, 1002c, 1002d to the ADC 212 by the MAC controller (e.g., processor 104, MAC controller 124 in FIG. 1). The clear switches clear switches 1010a, 1010b, 1010c, 1010d, 1014a, 1014b, 1014c, 1014d, 1016a, 1016b, 1016c, 1016d may also be controlled by the MAC controller.

The analog adder may receive single-bit MAC outputs from the single-bit MACs 206, 206a, 206b, 206c, 206d at the sampler capacitors 904a, 904b, 904c, 904d. The sampler capacitors 904a, 904b, 904c, 904d may be selectively electrically connected to a single-bit MAC 206, 206a, 206b, 206c, 206d. The adder capacitors 1002a, 1002b, 1002c, 1002d referred to herein as accumulator capacitors, may be selectively electrically connected to the sampler capacitors 904a, 904b, 904c, 904d. The sampler capacitors 904a, 904b, 904c, 904d and the accumulator capacitors 1002a, 1002b, 1002c, 1002d may have the same capacitance ratings ("C"). In some embodiments, each adder capacitors 904a, 904b, 904c, 904d, 1002a, 1002b, 1002c, 1002d may be a single capacitor. In some embodiments, each adder capacitors 904*a*, 904*b*, 904*c*, 904*d*, 1002*a*, 1002*b*, 1002*c*, 1002*d* may be multiple capacitors electrically connected in series and/or parallel. The capacitance ratings of the adder capacitors 904*a*, 904*b*, 904*c*, 904*d*, 1002*a*, 1002*b*, 1002*c*, 1002*d* may function as hardwired binary weights for the single-bit MAC outputs received by the analog adder from the single-bit MACs 206, 206*a*, 206*b*, 206*c*, 206*d*.

The sampler capacitors 904*a*, 904*b*, 904*c*, 904*d* may receive and store the single-bit MAC outputs from the single-bit MACs 206, 206*a*, 206*b*, 206*c*, 206*d* when selectively electrically connected to the single-bit MACs 206, 206*a*, 206*b*, 206*c*, 206*d* via the associated single-bit MAC switches 304*a*, 304*b*, 304*c*, 304*d*. The single-bit MAC switches 304*a*, 304*b*, 304*c*, 304*d* may be controlled to output the single-bit MAC outputs from the single-bit MACs 206, 206*a*, 206*b*, 206*c*, 206*d* so that the sampler capacitors 904*a*, 904*b*, 904*c*, 904*d* receive the single-bit MAC outputs in a specific order. In some embodiments, the order may be sequential starting with the multiplication of the least significant bits of an "n" bit activation value and of an "m" bit weight value to the most significant bits of the "n" bit activation value and of an "m" bit weight value. For example, the single-bit MAC switches 304*a*, 304*b*, 304*c*, 304*d* may be controlled to sequentially close circuits electrically connecting single-bit MACs 206, 206*a*, 206*b*, 206*c*, 206*d* and the analog adder to output the single-bit MAC outputs to the analog adder. The sampler capacitors 904*a*, 904*b*, 904*c*, 904*d* may be sequentially loaded with the single-bit MAC outputs by closing a circuit electrically connecting the single-bit MACs 206, 206*a*, 206*b*, 206*c*, 206*d* and the sampler capacitors 904*a*, 904*b*, 904*c*, 904*d*. In other words, the sampler capacitors 904*a*, 904*b*, 904*c*, 904*d* may receive the single-bit MAC outputs for each multiplication and accumulation of bit of the "n" bit activation value and the "m" bit weight value from the single-bit MACs 206, 206*a*, 206*b*, 206*c*, 206*d*. In some embodiments, the single-bit MAC switches 304*a*, 304*b*, 304*c*, 304*d* may be controlled in a manner that a single-bit MAC outputs are loaded to the sampler capacitors 904*a*, 904*b*, 904*c*, 904*d* in an order based on the significance of the bits of the "n" bit activation value and of the "m" bit weight value multiplied to produce the single-bit MAC output. The sampler capacitors 904*a*, 904*b*, 904*c*, 904*d* may charge by receiving the single-bit MAC outputs when selectively electrically connected to the single-bit MACs 206, 206*a*, 206*b*, 206*c*, 206*d*. The sampler capacitors 904*a*, 904*b*, 904*c*, 904*d* may store a sample of the single-bit MAC outputs, which may include a combination of the received single-bit MAC outputs modified by sharing the sample of the single-bit MAC outputs with the accumulator capacitors 1002*a*, 1002*b*, 1002*c*, 1002*d*. The sample of the single-bit MAC outputs is referred to herein as a single-bit MAC output sample. The sampler capacitors 904*a*, 904*b*, 904*c*, 904*d* may store and output the single-bit MAC output samples in response to receiving each single-bit MAC output.

The accumulator capacitors 1002*a*, 1002*b*, 1002*c*, 1002*d* may receive and store the single-bit MAC output samples from the sampler capacitors 904*a*, 904*b*, 904*c*, 904*d* when selectively electrically connected to the sampler capacitors 904*a*, 904*b*, 904*c*, 904*d* via the adder switches 1004*a*, 1004*b*, 1004*c*, 1004*d*. The sampler capacitors 904*a*, 904*b*, 904*c*, 904*d* may discharge or output the single-bit MAC output samples to the accumulator capacitors 1002*a*, 1002*b*, 1002*c*, 1002*d* when the sampler capacitors 904*a*, 904*b*, 904*c*, 904*d* are selectively disconnected from the single-bit MACs 206, 206*a*, 206*b*, 206*c*, 206*d* and selectively connected to the accumulator capacitors 1002*a*, 1002*b*, 1002*c*, 1002*d* by the adder switches 1004*a*, 1004*b*, 1004*c*, 1004*d*. The accumulator capacitors 1002*a*, 1002*b*, 1002*c*, 1002*d* may receive and store the single-bit MAC output samples. For example, the single-bit MAC switches 304*a*, 304*b*, 304*c*, 304*d* may be controlled to selectively disconnect the sampler capacitors 904*a*, 904*b*, 904*c*, 904*d* from the single-bit MACs 206, 206*a*, 206*b*, 206*c*, 206*d*. The adder switches 1004*a*, 1004*b*, 1004*c*, 1004*d* may be controlled to electrically connect the sampler capacitors 904*a*, 904*b*, 904*c*, 904*d* to the accumulator capacitors 1002*a*, 1002*b*, 1002*c*, 1002*d* via the electrical transmission bus 316. The sampler capacitors 904*a*, 904*b*, 904*c*, 904*d* may output the single-bit MAC output samples to the accumulator capacitors 1002*a*, 1002*b*, 1002*c*, 1002*d*. After receiving the single-bit MAC output samples, the single-bit MAC output sample may be shared by the sampler capacitors 904*a*, 904*b*, 904*c*, 904*d* and the accumulator capacitors 1002*a*, 1002*b*, 1002*c*, 1002*d* as described further herein with reference to FIG. 8. The process of receiving each single-bit MAC output by the sampler capacitors 904*a*, 904*b*, 904*c*, 904*d*, and outputting the single-bit MAC output sample by the sampler capacitors 904*a*, 904*b*, 904*c*, 904*d* and receiving the single-bit MAC output sample by the accumulator capacitors 1002*a*, 1002*b*, 1002*c*, 1002*d* may continue for each multiplication and addition of all of the bits of the "n" bit activation value and the "m" bit weight value.

In some embodiments, the accumulator capacitors 1002*a*, 1002*b*, 1002*c*, 1002*d* may output or discharge the single-bit MAC output sample when selectively electrically disconnected from the single-bit MACs 206*a*, 206*b*, 206*c*, 206*d* and from the sampler capacitors 904*a*, 904*b*, 904*c*, 904*d* by the adder switches 1004*a*, 1004*b*, 1004*c*, 1004*d*, and selectively electrically connected to the accumulator capacitors 1002*a*, 1002*b*, 1002*c*, 1002*d* by the adder switches 1006*a*, 1006*b*, 1006*c*, 1006*d* and to the ADC 212 by the output switch 1008. The accumulator capacitors 1002*a*, 1002*b*, 1002*c*, 1002*d* may be charged with a single-bit MAC output sample and the adder switches 1004*a*, 1004*b*, 1004*c*, 1004*d* may be controlled to selectively electrically disconnect the accumulator capacitors 1002*a*, 1002*b*, 1002*c*, 1002*d* from the sampler capacitors 904*a*, 904*b*, 904*c*, 904*d*. For the least significant bit of the "m" bit weight value, such as the single-bit MAC output of the single-bit MAC 206*a*, the analog adder may divide the charge of the single-bit MAC output sample of the accumulator capacitor 1002*a* by half. For example, the analog adder may reset the sampler capacitor 904*a* while adder switch 1004*a* is controlled to selectively electrically disconnect the accumulator capacitor 1002*a* from the sampler capacitor 904*a*. The adder switch 1004*a* may be controlled to selectively electrically connect the accumulator capacitor 1002*a* and the reset sampler capacitor 904*a*, splitting the single-bit MAC output sample of the accumulator capacitor 1002*a* with the sampler capacitor 904*a*. The adder switch 1004*a* may be controlled to selectively electrically disconnect the accumulator capacitor 1002*a* from the sampler capacitor 904*a*.

The adder switches 1006*a*, 1006*b*, 1006*c*, 1006*d* may be controlled to sequentially electrically connect the accumulator capacitors 1002*a*, 1002*b*, 1002*c*, 1002*d* from least significant bit to most significant bit. For example, the adder switch 1006*a* may be controlled to selectively electrically connect the accumulator capacitors 1002*a*, 1002*b* while the adder switch 1006*b* may be controlled to selectively electrically disconnect the accumulator capacitors 1002*a*, 1002*b* from the accumulator capacitors 1002*c*, 1002*d*. The accumulator capacitors 1002*a*, 1002*b* may share their single-bit MAC output samples, which may include sharing half the single-bit MAC output samples of each of the accumulator capacitors 1002a, 1002b. For example, the accumulator capacitors 1002a, 1002b may share a quarter of the original single-bit MAC output sample of the accumulator capacitor 1002a, since the single-bit MAC output sample was previously halved when split with the sampler capacitor 904a, and half of the original single-bit MAC output sample of the accumulator capacitor 1002b. The shared single-bit MAC output sample may be the new single-bit MAC output sample of the accumulator capacitor 1002b. Sequentially, the adder switch 1006b may be controlled to selectively electrically connect the accumulator capacitors 1002b, 1002c while the adder switches 1006a, 1006c may be controlled to selectively electrically disconnect the accumulator capacitors 1002b, 1002c from the accumulator capacitors 1002a, 1002d. The accumulator capacitors 1002b, 1002c may share their single-bit MAC output samples. For example, the accumulator capacitors 1002b, 1002c may share half of the new single-bit MAC output sample of the accumulator capacitor 1002b, which may be an eight of the original single-bit MAC output sample of the accumulator capacitor 1002a and a quarter of the original single-bit MAC output sample of the accumulator capacitor 1002b, and half of the original single-bit MAC output sample of the accumulator capacitor 1002c. The adder switches 1006a, 1006b, 1006c, 1006d may be similarly sequentially controlled to selectively electrically connect and disconnect the accumulator capacitors 1002a, 1002b, 1002c, 1002d until all of the accumulator capacitors 1002a, 1002b, 1002c, 1002d have shared their single-bit MAC output samples.

The output switch 1008 may be controlled to selectively electrically connect the accumulator capacitor 1006d to the ADC 212 via the electrical transmission conduit 316. The single-bit MAC output sample on the accumulator capacitor 1006d may be a weighted analog voltage of the combination of the shared single-bit MAC output sample of all of the accumulator capacitors 1002a, 1002b, 1002c, 1002d that may be output to the electrical transmission bus 316 and to the ADC 212. The weighted average analog voltage on the electrical transmission bus 316 may be converted by the ADC 212 to a digital signal.

In some embodiments, the sampler capacitors 904a, 904b, 904c, 904d and the accumulator capacitors 1002a, 1002b, 1002c, 1002d may output or discharge the single-bit MAC output sample when selectively electrically disconnected from the single-bit MACs 206, 206a, 206b, 206c, 206d by the single-bit MAC switches 304a, 304b, 304c, 304d, and selectively electrically connected to the sampler capacitors 904a, 904b, 904c, 904d and the accumulator capacitors 1002a, 1002b, 1002c, 1002d by the adder switches 1004a, 1004b, 1004c, 1004d, 1006a, 1006b, 1006c, 1006d and to the ADC 212 by the output switch 1008. The adder switches 1004a, 1004b, 1004c, 1004d may be controlled to selectively electrically connect pairs of the sampler capacitors 904a, 904b, 904c, 904d and the accumulator capacitors 1002a, 1002b, 1002c, 1002d so that the pairs may be charged with a single-bit MAC output sample. The single-bit MAC switches 304a, 304b, 304c, 304d may be controlled to selectively electrically disconnect the pairs of the sampler capacitors 904a, 904b, 904c, 904d and the accumulator capacitors 1002a, 1002b, 1002c, 1002d from the single-bit MACs 206, 206a, 206b, 206c, 206d. For the least significant bit of the "m" bit weight value, such as the single-bit MAC output of the for single-bit MAC 206a, the analog adder may divide the charge of the single-bit MAC output sample of pair of the sampler capacitor 904a and the accumulator capacitor 1002a by half. For example, the analog adder may reset the sampler capacitor 904a while adder switch 1004a is controlled to selectively electrically disconnect the accumulator capacitor 1002a from the sampler capacitor 904a. The adder switch 1004a may be controlled to selectively electrically connect the accumulator capacitor 1002a and the reset sampler capacitor 904a, splitting the single-bit MAC output sample of the accumulator capacitor 1002a with the sampler capacitor 904a. The adder switch 1004a may be controlled to maintain the selective electrical connection of pair of the sampler capacitor 904a and the accumulator capacitor 1002a.

The adder switches 1006a, 1006b, 1006c, 1006d may be controlled to sequentially electrically connect pairs of the sampler capacitors 904a, 904b, 904c, 904d and the accumulator capacitors 1002a, 1002b, 1002c, 1002d from least significant bit to most significant bit. For example, the adder switch 1006a may be controlled to selectively electrically connect the pair of the sampler capacitor 904a and the accumulator capacitor 1002a and the pair of the sampler capacitor 904b and the accumulator capacitor 1002b. While the adder switch 1006a is controlled for selective electrical connection, the adder switch 1006b may be controlled to selectively electrically disconnect the pairs of the sampler capacitors 904a, 904b and the accumulator capacitors 1002a, 1002b from the pairs of the sampler capacitors 904c, 904d and the accumulator capacitors 1002c, 1002d. The pairs of the sampler capacitors 904a, 904b and the accumulator capacitors 1002a, 1002b may share their single-bit MAC output samples, which may include sharing half the single-bit MAC output samples of each of the pairs of the sampler capacitors 904a, 904b and the accumulator capacitors 1002a, 1002b. For example, the pairs of the sampler capacitors 904a, 904b and the accumulator capacitors 1002a, 1002b may share a quarter of the original single-bit MAC output sample of the pair of the sampler capacitor 904a and the accumulator capacitor 1002a, since the single-bit MAC output sample was previously halved when split between the accumulator capacitor 1002a and the sampler capacitor 904a, and half of the original single-bit MAC output sample of the pair of the sampler capacitor 904b and the accumulator capacitor 1002b. The shared single-bit MAC output sample may be the new single-bit MAC output sample of the pair of the sampler capacitor 904b and the accumulator capacitor 1002b. Sequentially, the adder switch 1006b may be controlled to selectively electrically connect pairs of the sampler capacitors 904b, 904c and the accumulator capacitors 1002b, 1002c. While the adder switch 1006b is controlled for selective electrical connection, the adder switches 1006a, 1006c may be controlled to selectively electrically disconnect pairs of the sampler capacitors 904b, 904c and the accumulator capacitors 1002b, 1002c from pairs of the sampler capacitors 904a, 904d and the accumulator capacitors 1002a, 1002d. The pairs of the sampler capacitors 904b, 904c and the accumulator capacitors 1002b, 1002c may share their single-bit MAC output samples. For example, pairs of the sampler capacitors 904b, 904c and the accumulator capacitors 1002b, 1002c may share half of the new single-bit MAC output sample of pair of the sampler capacitor 904b and the accumulator capacitor 1002b, which may be an eight of the original single-bit MAC output sample of the pair of the sampler capacitor 904a and the accumulator capacitor 1002a and a quarter of the original single-bit MAC output sample of the pair of the sampler capacitor 904b and the accumulator capacitor 1002b, and half of the original single-bit MAC output sample of the pair of the sampler capacitor 904c and the accumulator capacitors 1002c. The adder switches 1006a, 1006*b*, 1006*c*, 1006*d* may be similarly sequentially controlled to selectively electrically connect and disconnect the pairs of the sampler capacitors 904*a*, 904*b*, 904*c*, 904*d* and the accumulator capacitors 1002*a*, 1002*b*, 1002*c*, 1002*d* until all of the pairs of the sampler capacitors 904*a*, 904*b*, 904*c*, 904*d* and the accumulator capacitors 1002*a*, 1002*b*, 1002*c*, 1002*d* have shared their single-bit MAC output samples.

The output switch 1008 may be controlled to selectively electrically connect the pair of the sampler capacitor 904*d* and the accumulator capacitor 1002*d* to the ADC 212 via the electrical transmission conduit 316. The single-bit MAC output sample on the pair of the sampler capacitor 904*d* and the accumulator capacitor 1002*d* may be a weighted analog voltage of the combination of the shared single-bit MAC output sample of all of the pairs of the sampler capacitors 904*a*, 904*b*, 904*c*, 904*d* and the accumulator capacitors 1002*a*, 1002*b*, 1002*c*, 1002*d* that may be output to the electrical transmission bus 316 and to the ADC 212. The weighted average analog voltage on the electrical transmission bus 316 may be converted by the ADC 212 to a digital signal.

After completing the multiplication and addition of all of the bits of the "n" bit activation value and the "m" bit weight value, the multi-bit MAC 1000 may be reset or cleared. The clear switches 1014*a*, 1014*b*, 1014*c*, 1014*d*, 1016*a*, 1016*b*, 1016*c*, 1016*d* may be controlled by the MAC controller to selectively electrically connect the analog adder, including the adder capacitors 904*a*, 904*b*, 904*c*, 904*d*, 1002*a*, 1002*b*, 1002*c*, 1002*d* to the electrical grounds 508. The clear switches 1010*a*, 1010*b*, 1010*c*, 1010*d* may be controlled by the MAC controller to selectively electrically connect the single bit MACs 206*a*, 206*b*, 206*c*, 206*d* to the electrical grounds 1012. Electrically connecting components of the multi-bit MAC 1000 to the electrical grounds 508, 1012 may discharge any residual voltage in the multi-bit MAC 1000 so that a next multiply and add of different combinations of "n" bit activation values and/or "m" bit weight values may be implemented by the multi-bit MAC 1000.

Figure 11:
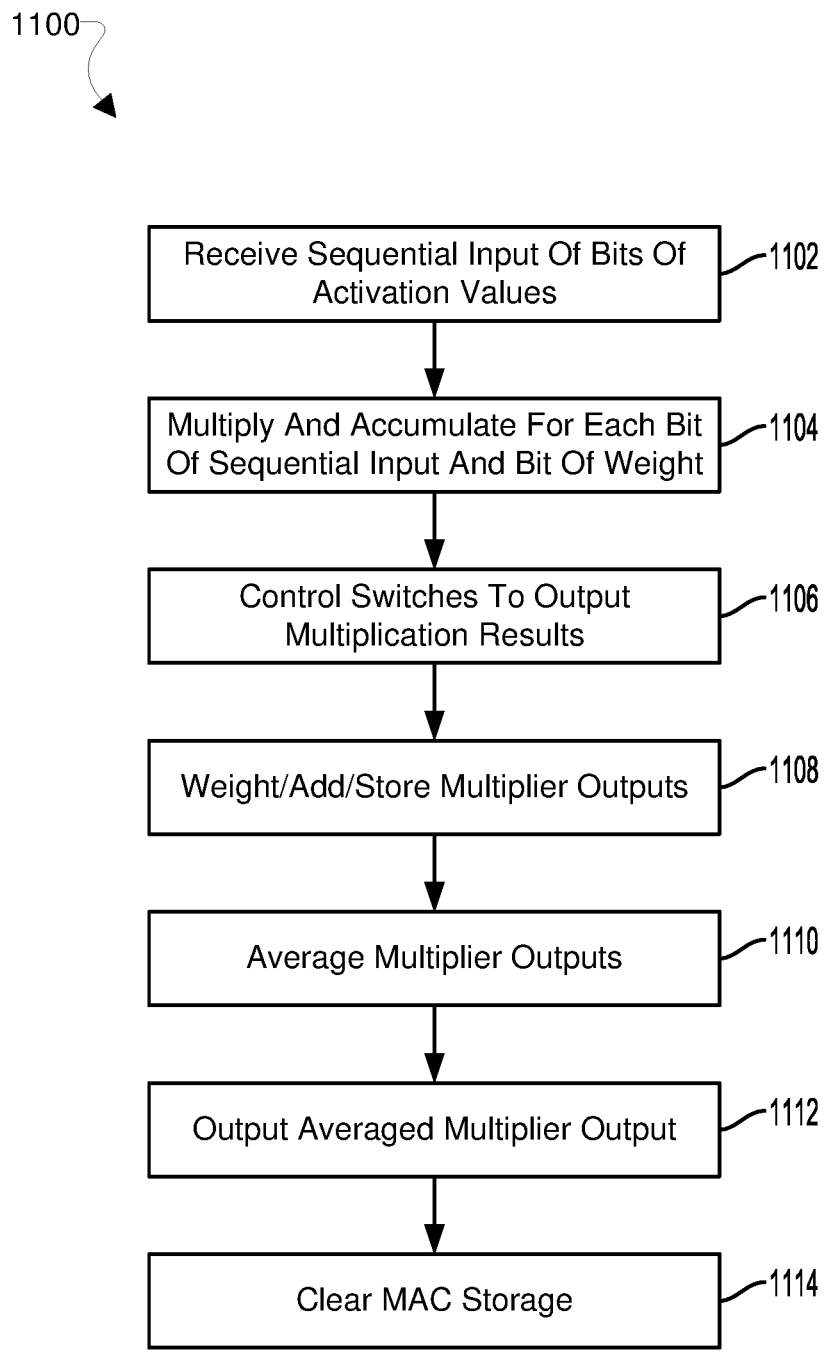
FIG. 11 is a process flow diagram illustrating a method for control of a multi-bit MAC according to an embodiment.

FIG. 11 illustrates a method 1100 for control of a multi-bit MAC according to an embodiment. With reference to FIGS. 1-11, the method 1100 may be implemented in a computing device (e.g., mobile computing device 100 in FIG. 1), in software executing in a processor (e.g., processor 104, MAC controller 124 in FIG. 1), in general purpose hardware, in dedicated hardware (e.g., multi-bit MAC 130, 200, 300, 400, 500, 600, 700, 900, 1000 in FIGS. 1-7, 9, and 10), or in a combination of a software-configured processor and dedicated hardware, such as a processor executing software within a multi-bit MAC control system that includes other individual components (e.g., memory 106, 114 illustrated in FIG. 1), and various memory/cache controllers. In order to encompass the alternative configurations enabled in various embodiments, the hardware implementing the method 1100 is referred to herein as a "MAC device."

In block 1102, the MAC device may receive a sequential input of bits of activation values. The sequential input of bits of activation values may include a bit-by-bit input, from least significant bit to most significant bit, of an "n" bit activation value.

In block 1104, the MAC device may execute a multiply and accumulate operation for each bit of the sequential input and a bit of a weight value. The MAC device may multiply each bit of the "n" bit activation value by a bit of an "m" bit weight value. The MAC device may sequentially multiply each bit of the "n" bit activation value by a bit of an "m" bit weight value in an order from least significant bit to most significant bit of the "n" bit activation value. In some embodiments, the MAC device may multiply each bit of the "n" bit activation value by all of the bits of the "m" bit weight value sequentially. For example, the MAC device may multiply each bit of the "n" bit activation value, from least significant bit to most significant bit, by a bit of an "m" bit weight value before multiplying each bit of the "n" bit activation value, from least significant bit to most significant bit, by another bit of the "m" bit weight value. In some embodiments, the MAC device may multiply each bit of the "n" bit activation value by all of the bits of the "m" bit weight value in parallel. For example, the MAC device may multiply each bit of the "n" bit activation value, from least significant bit to most significant bit, by a bit of an "m" bit weight value concurrently with multiplying each bit of the "n" bit activation value, from least significant bit to most significant bit, by another bit of the "m" bit weight value. The MAC device may accumulate the result of each multiplication.

In block 1106, the MAC device may control switches (e.g., single-bit MAC switches 304*a*, 304*b*, 304*c*, 304*d* in FIGS. 3-7, 9, and 10) to output the multiplication and accumulation results, referred to herein as single-bit MAC outputs. In some embodiments, the single-bit MAC output may include the result of the multiplication and accumulation of each bit of each bit of the "n" bit activation value and a bit of the "m" bit weight value individually. In some embodiments, the single-bit MAC output may include the result of the multiplication and accumulation of each bit of each bit of the "n" bit activation value and a bit of the "m" bit weight value cumulatively. The single-bit MAC outputs may be formatted as analog voltage signals. The MAC device may control the switches to output the single-bit MAC outputs in various patterns. For example, in some embodiments, the MAC device may control the switches to output each single-bit MAC output sequentially, such as in an order of increasing significance of the bits of the "n" activation value and then the "m" bit weight value used in the multiplication. For example, in some embodiments, the MAC device may control the switches to output each single-bit MAC output once. For another example, in some embodiments, the MAC device may control the switches to output each single-bit MAC output $2^q$ times, where "q" may be a location of an activation value bit from a least significant bit with q=0 to a most significant bit with q=n−1. Similarly, for a multi-bit "m" bit weight value, the MAC device may control the switches to output each single-bit MAC output $2^r$ times, where "r" may be a location of a weight value bit from a least significant bit with r=0 to a most significant bit with r=m−1. In some embodiments, it may take $2^q \times 2^r$ cycles to output all of the single-bit MAC outputs.

In block 1108, the MAC device may weight, add, and/or store the single-bit MAC outputs. In some embodiments, the MAC device may weight, add, and/or store the single-bit MAC outputs in different orders. For example, in some embodiments, the MAC device may weight single-bit MAC outputs before adding and storing the single-bit MAC outputs. For another example, in some embodiments, the MAC device may add and store the single-bit MAC outputs before weighting the single-bit MAC outputs. For another example, in some embodiments, the MAC device may weight, add, and store the single-bit MAC outputs concurrently. For another example, in some embodiments, the MAC device may repeat weighting, adding, and/or storing the single-bit MAC outputs in various combinations and orders. For another example, in some embodiments, the MAC device may weight, add, and store the single-bit MAC outputs repeatedly in any of the different orders. In some embodiments, an analog adder (e.g., adder 128 in FIG. 1), as described herein with reference to FIGS. 3-7, 9, and 10, of the MAC device may implement weighting, adding, and/or storing the single-bit MAC outputs in block 1108. In some embodiments, the MAC device may control various switches (e.g., adder switches 504a, 504b, 504c in FIG. 5, adder switches 604a, 604b in FIGS. 6 and 7, adder switches 702 in FIG. 7, adder switches 908a, 908b, 908c, 908d, 910a, 910b, 910c, 910d, 912a, 912b, 912c, 912d in FIG. 9, adder switches 1004a, 1004b, 1004c, 1004d, 1006a, 1006b, 1006c, 1006d in FIG. 10) to implement weighting, adding, and/or storing the single-bit MAC outputs in block 1108. In some embodiments, capacitors (e.g., integrator capacitors 314 in FIGS. 3 and 4, designated capacitors 402a, 402b, 402c, 402d in FIG. 4, adder capacitors 506a, 506b, 506c in FIG. 5, adder capacitors 606a, 606b in FIGS. 6 and 7, adder capacitors 904a, 904b, 904c, 904d, 906a, 906b, 906c, 906d, 906e, 906f, 906g, 906h in FIG. 9, adder capacitors 904a, 904b, 904c, 904d, 1002a, 1002b, 1002c, 1002d in FIG. 10) of the MAC device may be used to implement weighting, adding, and/or storing the single-bit MAC outputs in block 1108.

In block 1110, the MAC device may average the single-bit MAC outputs. In some embodiments, averaging the single-bit MAC outputs may be part of weighting and adding the single-bit MAC outputs in block 1108. In some embodiments, averaging the single-bit MAC outputs may include combining multiple single-bit MAC outputs in an output to an ADC (e.g., ADC 212 in FIGS. 2-7, 9, and 10). In some embodiments, the analog adder, as described herein with reference to FIGS. 3-7, 9, and 10, of the MAC device may average the single-bit MAC outputs in block 1110. The MAC device may control various switches (e.g., adder switches 912a, 912b, 912c, 912d in FIG. 9, adder switches 1004a, 1004b, 1004c, 1004d, 1006a, 1006b, 1006c, 1006d in FIG. 10) to combine the multiple single-bit MAC outputs in the output to the ADC.

In block 1112, the MAC device may output the averaged single-bit MAC outputs, also be referred to herein as the multi-bit MAC output. The MAC device may output the averaged single-bit MAC outputs to the ADC. In some embodiments, the analog adder, as described herein with reference to FIGS. 3-7, 9, and 10, of the MAC device may output the averaged single-bit MAC outputs in block 1112. In some embodiments, the MAC device may control various switches (e.g., adder switches 504a, 504b, 504c in FIG. 5, adder switches 604a, 604b in FIGS. 6 and 7, adder switches 702 in FIG. 7, adder switches 908a, 908b, 908c, 910a, 910b, 910c, 910d, 912a, 912b, 912c, 912d in FIG. 9, output switch 1008 in FIG. 10) to output the averaged single-bit MAC outputs to the ADC.

In block 1114, the MAC device may clear the storage of the MAC device. In some embodiments, the analog adder, as described herein with reference to FIGS. 3-7, 9 and 10, of the MAC device may clear the storage of the MAC device in block 1114. In some embodiments, the MAC device may control various switches (e.g., clear switches 308, 308a, 308b in FIGS. 3-7, adder switches 504a, 504b, 504c in FIG. 5, adder switches 604a, 604b in FIGS. 6 and 7, adder switches 702 in FIG. 7, adder switches 908a, 908b, 908c, 908d, 910a, 910b, 910c, 910d, 912a, 912b, 912c, 912d in FIG. 9, adder switches 1004a, 1004b, 1004c, 1004d, 1006a, 1006b, 1006c, 1006d in FIG. 10) to electrically connect the storage (e.g., integrator capacitors 314 in FIGS. 3 and 4, designated capacitors 402a, 402b, 402c, 402d in FIG. 4, adder capacitors 506a, 506b, 506c in FIG. 5, adder capacitors 606a, 606b in FIGS. 6 and 7, adder capacitors 904a, 904b, 904c, 904d, 906a, 906b, 906c, 906d, 906e, 906f in FIG. 9, adder capacitors 904a, 904b, 904c, 904d, 1002a, 1002b, 1002c, 1002d in FIG. 10) of the MAC device to an electrical ground (e.g., electrical ground 310, 310a, 310b in FIGS. 3-7). Electrically connecting the storage of the MAC device to an electrical ground may draw down the voltage of the storage to or near to zero volts.

Figure 12:
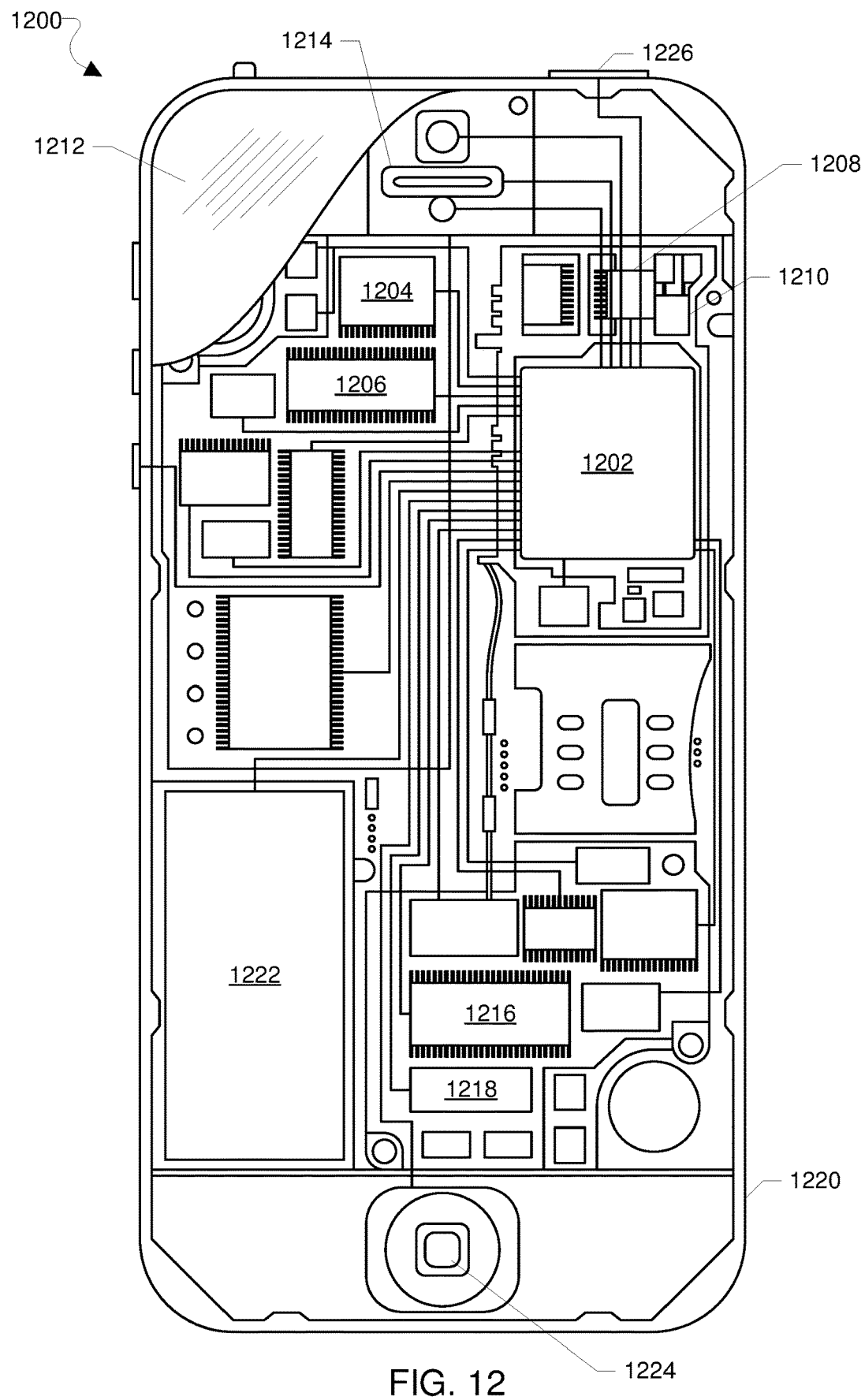
FIG. 12 is a component block diagram illustrating an example mobile computing device suitable for use with the various aspects.

The various embodiments (including, but not limited to, embodiments described above with reference to FIGS. 1-11) may be implemented in a wide variety of computing systems including mobile computing devices, an example of which suitable for use with the various embodiments is illustrated in FIG. 12. The mobile computing device 1200 may include a processor 1202 coupled to a touchscreen controller 1204 and an internal memory 1206. The processor 1202 may be one or more multicore integrated circuits designated for general or specific processing tasks. The internal memory 1206 may be volatile or non-volatile memory, and may also be secure and/or encrypted memory, or unsecure and/or unencrypted memory, or any combination thereof. Examples of memory types that can be leveraged include but are not limited to DDR, LPDDR, GDDR, WIDEIO, RAM, SRAM, DRAM, P-RAM, R-RAM, M-RAM, STT-RAM, and embedded DRAM. The touchscreen controller 1204 and the processor 1202 may also be coupled to a touchscreen panel 1212, such as a resistive-sensing touchscreen, capacitive-sensing touchscreen, infrared sensing touchscreen, etc. Additionally, the display of the mobile computing device 1200 need not have touch screen capability.

The mobile computing device 1200 may have one or more radio signal transceivers 1208 (e.g., Peanut, Bluetooth, ZigBee, Wi-Fi, RF radio) and antennae 1210, for sending and receiving communications, coupled to each other and/or to the processor 1202. The transceivers 1208 and antennae 1210 may be used with the above-mentioned circuitry to implement the various wireless transmission protocol stacks and interfaces. The mobile computing device 1200 may include a cellular network wireless modem chip 1216 that enables communication via a cellular network and is coupled to the processor.

The mobile computing device 1200 may include a peripheral device connection interface 1218 coupled to the processor 1202. The peripheral device connection interface 1218 may be singularly configured to accept one type of connection, or may be configured to accept various types of physical and communication connections, common or proprietary, such as Universal Serial Bus (USB), FireWire, Thunderbolt, or PCIe. The peripheral device connection interface 1218 may also be coupled to a similarly configured peripheral device connection port (not shown).

The mobile computing device 1200 may also include speakers 1214 for providing audio outputs. The mobile computing device 1200 may also include a housing 1220, constructed of a plastic, metal, or a combination of materials, for containing all or some of the components described herein. The mobile computing device 1200 may include a power source 1222 coupled to the processor 1202, such as a disposable or rechargeable battery. The rechargeable battery may also be coupled to the peripheral device connection port to receive a charging current from a source external to the mobile computing device 1200. The mobile computing device 1200 may also include a physical button 1224 for receiving user inputs. The mobile computing device 1200 may also include a power button 1226 for turning the mobile computing device 1200 on and off.

Figure 13:
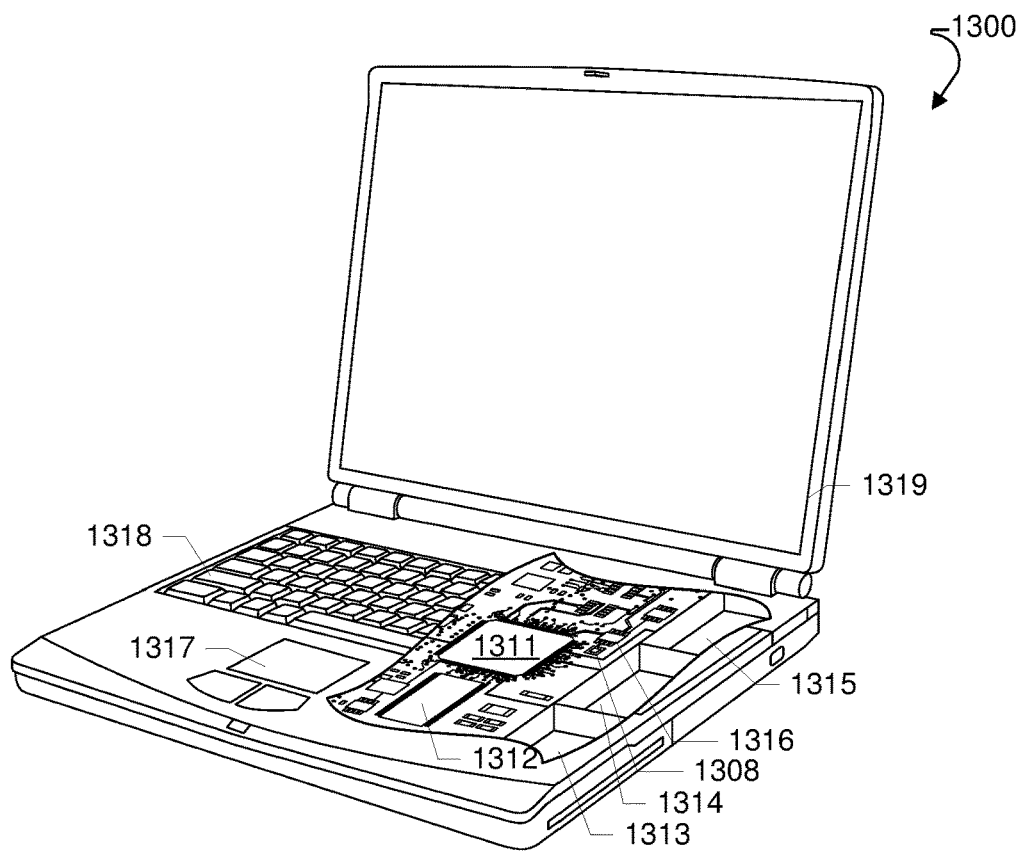
FIG. 13 is a component block diagram illustrating an example mobile computing device suitable for use with the various aspects.

The various embodiments (including, but not limited to, embodiments described above with reference to FIGS. 1-11) may be implemented in a wide variety of computing systems include a laptop computer 1300 an example of which is illustrated in FIG. 13. Many laptop computers include a touchpad touch surface 1317 that serves as the computer's pointing device, and thus may receive drag, scroll, and flick gestures similar to those implemented on computing devices equipped with a touch screen display and described above. A laptop computer 1300 will typically include a processor 1311 coupled to volatile memory 1312 and a large capacity nonvolatile memory, such as a disk drive 1313 of Flash memory. Additionally, the computer 1300 may have one or more antenna 1308 for sending and receiving electromagnetic radiation that may be connected to a wireless data link and/or cellular telephone transceiver 1316 coupled to the processor 1311. The computer 1300 may also include a floppy disc drive 1314 and a compact disc (CD) drive 1315 coupled to the processor 1311. In a notebook configuration, the computer housing includes the touchpad 1317, the keyboard 1318, and the display 1319 all coupled to the processor 1311. Other configurations of the computing device may include a computer mouse or trackball coupled to the processor (e.g., via a USB input) as are well known, which may also be used in conjunction with the various embodiments.

Figure 14:
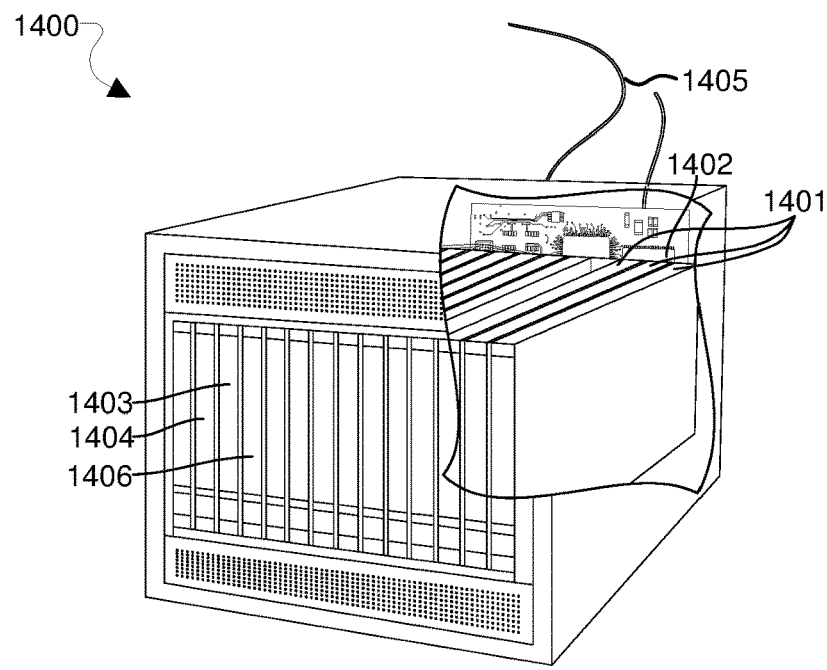
FIG. 14 is a component block diagram illustrating an example server suitable for use with the various aspects.

The various embodiments (including, but not limited to, embodiments described above with reference to FIGS. 1-11) may also be implemented in fixed computing systems, such as any of a variety of commercially available servers. An example server 1400 is illustrated in FIG. 14. Such a server 1400 typically includes one or more multicore processor assemblies 1401 coupled to volatile memory 1402 and a large capacity nonvolatile memory, such as a disk drive 1404. As illustrated in FIG. 14, multicore processor assemblies 1401 may be added to the server 1400 by inserting them into the racks of the assembly. The server 1400 may also include a floppy disc drive, compact disc (CD) or digital versatile disc (DVD) disc drive 1406 coupled to the processor 1401. The server 1400 may also include network access ports 1403 coupled to the multicore processor assemblies 1401 for establishing network interface connections with a network 1405, such as a local area network coupled to other broadcast system computers and servers, the Internet, the public switched telephone network, and/or a cellular data network (e.g., CDMA, TDMA, GSM, PCS, 3G, 4G, LTE, or any other type of cellular data network).

In the following, further embodiments are described in order to facilitate understanding of the invention.

Example 1: A multi-bit multiplier-accumulator (MAC), comprising an analog adder having a first adder capacitor, wherein the first adder capacitor is configured to add a plurality of single-bit MAC outputs by: receiving the plurality of single-bit MAC outputs from a plurality of single-bit MACs; and storing the plurality of single-bit MAC outputs; and wherein the analog adder is configured to output a multi-bit MAC output based on addition of the stored plurality of single-bit MAC outputs.

Example 2: The multi-bit MAC of example 1, wherein the plurality of single-bit MACs are each configured to sequentially multiply individual bits of a first multi-bit value and a different single bit of a second multi-bit value, wherein the first multi-bit value and the second multi-bit value are represented by digital voltages, and accumulate results of the multiplications to generate the plurality of single-bit MAC outputs, wherein the plurality of single-bit MAC outputs are analog voltages.

Example 3: The multi-bit MAC of any of examples 1 or 2, further comprising a plurality of single-bit MAC switches, wherein a first single-bit MAC switch of the plurality of single-bit MAC switches is configured to selectively electrically connect a first single-bit MAC of the plurality of single-bit MACs and the first adder capacitor as controlled by a control device; wherein: the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor; and the analog adder further comprises an operational amplifier having an input end and an output end, wherein the first adder capacitor is electrically connected between the input end and output end, and the operational amplifier is configured to: receive the plurality of single-bit MAC outputs at the input end; add the plurality of single-bit MAC outputs producing a weighted average of the plurality of single-bit MAC outputs, wherein the analog adder is configured such that: adding a plurality of single-bit MAC outputs comprises adding the plurality of single-bit MAC outputs producing the weighted average of the plurality of single-bit MAC outputs, and storing the plurality of single-bit MAC outputs comprises storing the weighted average of the plurality of single-bit MAC outputs; and output the weighted average of the plurality of single-bit MAC outputs as an analog voltage to an analog to digital converter, wherein the analog adder is configured such that outputting a multi-bit MAC output comprises outputting the weighted average of the plurality of single-bit MAC outputs.

Example 4: The multi-bit MAC of any of examples 1, 2, or 3, wherein the analog adder further comprises a plurality of designated capacitors, wherein a first designated capacitor of the plurality of designated capacitors is electrically connected between the first single-bit MAC switch and the first adder capacitor, and the first designated capacitor has a capacitor rating of $2^r$, wherein r is a location in a weight value of a bit multiplied by bits of an activation value used in producing the first single-bit MAC output, and the first designated capacitor is configured to: receive the first single-bit MAC output; weight the first single-bit MAC output; and output the weighted first single-bit MAC output, wherein the operational amplifier is further configured such that: receiving the plurality of single-bit MAC outputs comprises receiving the weighted first single-bit MAC output; and adding the plurality of single-bit MAC outputs comprises adding the weighted first single-bit MAC output.

Example 5: The multi-bit MAC of any of examples 1 or 2, further comprising a plurality of single-bit MAC switches, wherein a first single-bit MAC switch of the plurality of single-bit MAC switches is configured to selectively electrically connect a first single-bit MAC of the plurality of single-bit MACs and the first adder capacitor as controlled by a control device; and wherein the analog adder further comprises: a plurality of adder capacitors, including the first adder capacitor associated with the first single-bit MAC, wherein the first adder capacitor has a capacitor rating of $2^r$, wherein r is a location in a weight value of a bit multiplied by bits of an activation value used in producing the first single-bit MAC output by the first single-bit MAC, wherein the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor, and the first adder capacitor is further configured to: weight the first single-bit MAC output, wherein the analog adder is configured such that storing the plurality of single-bit MAC outputs comprises storing the weighted first single-bit MAC output; and output the weighted first single-bit MAC output; and a plurality of adder switches, including a first adder switch associated with the first adder capacitor, and wherein the first adder switch is configured to: selectively electrically connect the first adder capacitor to the first single-bit MAC via the first single-bit MAC switch as controlled by the control device; and selectively electrically connect the first adder capacitor to an electrical transmission bus concurrently with a second adder switch of the plurality of adder switches selectively electrically connecting a second adder capacitor of the plurality of adder capacitors to the electrical transmission bus as controlled by the control device outputting the weighted first single-bit MAC output from the first adder capacitor and producing a weighted average of a plurality of weighted single-bit MAC outputs, including the weighted first single-bit MAC output; and wherein the analog adder is configured such that outputting a multi-bit MAC output comprises outputting the weighted average of the plurality of weighted single-bit MAC outputs.

Example 6: The multi-bit MAC of example 5, further comprising a buffer electrically connected between the plurality of single-bit MAC switches and the plurality of adder switches.

Example 7: The multi-bit MAC of any of examples 1 or 2, further comprising a plurality of single-bit MAC switches, wherein a first single-bit MAC switch of the plurality of single-bit MAC switches is configured to selectively electrically connect a first single-bit MAC of the plurality of single-bit MACs and the first adder capacitor as controlled by a control device; and wherein the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor; the analog adder further comprises: a plurality of adder switches, including a first adder switch of the plurality of adder switches associated with the first adder capacitor; and a second adder capacitor, wherein the second adder capacitor is associated with a second adder switch of the plurality of adder switches, the first adder capacitor and the second adder capacitor have the same capacitance rating, and wherein: the first adder switch is configured to: selectively electrically connect the first adder capacitor to the plurality of single-bit MACs via the plurality of single-bit MAC switches as controlled by the control device; and selectively electrically connect the first adder capacitor to an electrical transmission bus as controlled by the control device; the second adder switch is configured to: selectively electrically connect the second adder capacitor to the electrical transmission bus concurrently with the first adder capacitor as controlled by the control device sharing the plurality of single-bit MAC outputs between the first adder capacitor and the second adder capacitor; and selectively electrically connect the second adder capacitor to an analog to digital converter outputting the shared plurality of single-bit MAC outputs; and the analog adder is configured such that outputting a multi-bit MAC output comprises outputting the shared plurality of single-bit MAC outputs.

Example 8: The multi-bit MAC of example 7, wherein the analog adder further comprises a buffer electrically connected between the plurality of single-bit MAC switches and the plurality of adder switches.

Example 9: The multi-bit MAC of any of examples 1 or 2, further comprising a plurality of single-bit MAC switches, wherein a first single-bit MAC switch of the plurality of single-bit MAC switches is configured to selectively electrically connect a first single-bit MAC of the plurality of single-bit MACs and the first adder capacitor as controlled by a control device; and wherein the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor; the analog adder further comprises: a second adder capacitor, wherein the first adder capacitor and the second adder capacitor have the same capacitance rating; and an adder switch configured to selectively electrically connect the first adder capacitor and the second adder capacitor as controlled by the control device sharing the plurality of single-bit MAC outputs between the first adder capacitor and the second adder capacitor, wherein the second adder capacitor is configured to output the shared plurality of single-bit MAC outputs to an analog to digital converter, wherein the analog adder is configured such that outputting a multi-bit MAC output comprises outputting the shared plurality of single-bit MAC outputs.

Further examples include methods of performing operations of the device functions summarized in any of examples 1, 2, 3, 4, 5, 6, 7, 8, or 9. Further examples include a multi-bit MAC having means for performing functions of any of the device functions summarized in any of examples 1, 2, 3, 4, 5, 6, 7, 8, or 9.

Example 10: A multi-bit multiplier-accumulator (MAC), comprising an analog adder having: a plurality of adder capacitors, including a first adder capacitor; and a plurality of single-bit MAC switches, including a first single-bit MAC switch configured to selectively electrically connect a first single-bit MAC of a plurality of single-bit MACs and the first adder capacitor as controlled by a control device; wherein the first adder capacitor is configured to add a first plurality of single-bit MAC outputs by: receiving the first plurality of single-bit MAC outputs from the first single-bit MAC in response to the first single-bit MAC switch selectively electrically connecting the first single-bit MAC and the first adder capacitor; and storing the first plurality of single-bit MAC outputs, and wherein the analog adder is configured to output a multi-bit MAC output based on addition of the stored first plurality of single-bit MAC outputs.

Example 11: The multi-bit MAC of example 10, wherein: the plurality of adder capacitors further comprises a second adder capacitor and a third adder capacitor, wherein a cumulative capacitance rating of a pair of the second adder capacitor and the third adder capacitor is the same as a capacitance rating of the first adder capacitor; and the analog adder further comprises a plurality of adder switches, including a first adder switch configured to selectively electrically connect the first adder capacitor and the second adder capacitor as controlled by the control device sharing the first plurality of single-bit MAC outputs between the first adder capacitor and the second adder capacitor; a second adder switch configured to selectively electrically connect the second adder capacitor and the third adder capacitor as controlled by the control device sharing the shared first plurality of single-bit MAC outputs between the second adder capacitor and the third adder capacitor, wherein the third adder capacitor is configured to weight the shared first plurality of single-bit MAC outputs; and a third adder switch configured to selectively electrically connect the third adder capacitor to an analog to digital converter via an electrical transmission bus as controlled by the control device outputting the weighted shared first plurality of single-bit MAC outputs to the analog to digital converter concurrently with another third adder capacitor of the plurality of adder capacitors outputting a weighted shared second plurality of single-bit MAC outputs to the analog to digital converter via the electrical transmission bus combining the weighted shared first plurality of single-bit MAC outputs and the weighted shared second plurality of single-bit MAC outputs into a weighted average of the shared pluralities of single-bit MAC outputs; and the analog adder is configured such that outputting a multi-bit MAC output comprises outputting the weighted average of the shared pluralities of single-bit MAC outputs.

Example 12: The multi-bit MAC of example 10, wherein: the plurality of adder capacitors further comprises a second adder capacitor; and the analog adder further comprises a plurality of adder switches, including: a first adder switch configured to selectively electrically connect the first adder capacitor and the second adder capacitor as controlled by the control device sharing the first plurality of single-bit MAC outputs between the first adder capacitor and the second adder capacitor, and a second adder switch configured to selectively electrically connect the second adder capacitor to another second adder capacitor as controlled by the control device via an electrical transmission bus.

Example 13: The multi-bit MAC of example 12, wherein: the first adder switch is configured such that selectively electrically connecting the first adder capacitor and the second adder capacitor as controlled by the control device sharing the first plurality of single-bit MAC outputs between the first adder capacitor and the second adder capacitor comprises dividing the first plurality of single-bit MAC outputs in half for each of the first adder capacitor and the second adder capacitor; the analog adder is further configured to clear the first adder capacitor of the half of the first plurality of single-bit MAC outputs; and the first adder switch is further configured to selectively electrically connect the first adder capacitor and the second adder capacitor as controlled by the control device sharing the half of the first plurality of single-bit MAC outputs between the first adder capacitor and the second adder capacitor dividing the half of the first plurality of single-bit MAC outputs in half for each of the first adder capacitor and the second adder capacitor producing a plurality of a quarter of the first plurality of single-bit MAC.

Example 14. The multi-bit MAC of any of examples 12 or 13, wherein the plurality of adder switches further comprises another first adder switch, wherein the another first adder switch is configured to selectively electrically connect another first adder capacitor and the another second adder capacitor as controlled by the control device while the second adder switch selectively electrically connects the second adder capacitor and the another second adder capacitor.

Example 15. The multi-bit MAC of any of example 12 or 13, wherein the plurality of adder switches further comprises another first adder switch, wherein the another first adder switch is configured to selectively electrically disconnect another first adder capacitor and the another second adder capacitor as controlled by the control device while the second adder switch selectively electrically connects the second adder capacitor and the another second adder capacitor.

Further examples include methods of performing operations of the device functions summarized in any of examples 10, 11, 12, 13, 14, or 15. Further examples include a multi-bit MAC having means for performing functions of any of the device functions summarized in any of examples.

Computer program code or "program code" for execution on a programmable processor for carrying out operations of the various embodiments may be written in a high level programming language such as C, C++, C #, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A multi-bit multiplier-accumulator (MAC), comprising an analog adder having a first adder capacitor,
   wherein the first adder capacitor is configured to add a plurality of single-bit MAC outputs by:
      receiving the plurality of single-bit MAC outputs from a plurality of single-bit MACs; and
      storing the plurality of single-bit MAC outputs;
   wherein the analog adder is configured to output a multi-bit MAC output based on addition of the stored plurality of single-bit MAC outputs, and
   wherein the plurality of single-bit MACs are each configured to:
   sequentially multiply individual bits of a first multi-bit value and a different single bit of a second multi-bit value, wherein the first multi-bit value and the second multi-bit value are represented by digital voltages; and
   accumulate results of the multiplications to generate the plurality of single-bit MAC outputs, wherein the plurality of single-bit MAC outputs are analog voltages.

2. The multi-bit MAC of claim 1, further comprising a plurality of single-bit MAC switches, wherein a first single-bit MAC switch of the plurality of single-bit MAC switches is configured to selectively electrically connect a first single-bit MAC of the plurality of single-bit MACs and the first adder capacitor as controlled by a control device; and
   wherein:
      the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor; and
      the analog adder further comprises an operational amplifier having an input end and an output end, wherein the first adder capacitor is electrically connected between the input end and output end, and the operational amplifier is configured to:
         receive the plurality of single-bit MAC outputs at the input end;
         add the plurality of single-bit MAC outputs producing a weighted average of the plurality of single-bit MAC outputs,
            wherein the analog adder is configured such that:
               adding a plurality of single-bit MAC outputs comprises adding the plurality of single-bit MAC outputs producing the weighted average of the plurality of single-bit MAC outputs, and
               storing the plurality of single-bit MAC outputs comprises storing the weighted average of the plurality of single-bit MAC outputs; and
         output the weighted average of the plurality of single-bit MAC outputs as an analog voltage to an analog to digital converter, wherein the analog adder is configured such that outputting a multi-bit MAC output comprises outputting the weighted average of the plurality of single-bit MAC outputs.

3. The multi-bit MAC of claim 2, wherein the analog adder further comprises:
   a plurality of designated capacitors, wherein a first designated capacitor of the plurality of designated capacitors is electrically connected between the first single-bit MAC switch and the first adder capacitor, and the first designated capacitor has a capacitor rating of $2^r$, wherein r is a location in a weight value of a bit multiplied by bits of an activation value used in producing the first single-bit MAC output, and the first designated capacitor is configured to:
receive the first single-bit MAC output;
weight the first single-bit MAC output; and
output the weighted first single-bit MAC output, wherein the operational amplifier is further configured such that:
receiving the plurality of single-bit MAC outputs comprises
receiving the weighted first single-bit MAC output; and
adding the plurality of single-bit MAC outputs comprises adding the weighted first single-bit MAC output.

4. The multi-bit MAC of claim 1, further comprising a plurality of single-bit MAC switches, wherein a first single-bit MAC switch of the plurality of single-bit MAC switches is configured to selectively electrically connect a first single-bit MAC of the plurality of single-bit MACs and the first adder capacitor as controlled by a control device; and
wherein the analog adder further comprises:
a plurality of adder capacitors, including the first adder capacitor associated with the first single-bit MAC, wherein the first adder capacitor has a capacitor rating of $2^r$, wherein r is a location in a weight value of a bit multiplied by bits of an activation value used in producing the first single-bit MAC output by the first single-bit MAC,
wherein the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor,
and the first adder capacitor is further configured to:
weight the first single-bit MAC output, wherein the analog adder is configured such that storing the plurality of single-bit MAC outputs comprises storing the weighted first single-bit MAC output; and
output the weighted first single-bit MAC output; and
a plurality of adder switches, including a first adder switch associated with the first adder capacitor, and wherein the first adder switch is configured to:
selectively electrically connect the first adder capacitor to the first single-bit MAC via the first single-bit MAC switch as controlled by the control device; and
selectively electrically connect the first adder capacitor to an electrical transmission bus concurrently with a second adder switch of the plurality of adder switches selectively electrically connecting a second adder capacitor of the plurality of adder capacitors to the electrical transmission bus as controlled by the control device outputting the weighted first single-bit MAC output from the first adder capacitor and producing a weighted average of a plurality of weighted single-bit MAC outputs, including the weighted first single-bit MAC output; and
wherein the analog adder is configured such that outputting a multi-bit MAC output comprises outputting the weighted average of the plurality of weighted single-bit MAC outputs.

5. The multi-bit MAC of claim 4, further comprising a buffer electrically connected between the plurality of single-bit MAC switches and the plurality of adder switches.

6. The multi-bit MAC of claim 1, further comprising a plurality of single-bit MAC switches, wherein a first single-bit MAC switch of the plurality of single-bit MAC switches is configured to selectively electrically connect a first single-bit MAC of the plurality of single-bit MACs and the first adder capacitor as controlled by a control device; and
wherein:
the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor;
the analog adder further comprises:
a plurality of adder switches, including a first adder switch of the plurality of adder switches associated with the first adder capacitor; and
a second adder capacitor, wherein the second adder capacitor is associated with a second adder switch of the plurality of adder switches, the first adder capacitor and the second adder capacitor have the same capacitance rating, and
wherein:
the first adder switch is configured to:
selectively electrically connect the first adder capacitor to the plurality of single-bit MACs via the plurality of single-bit MAC switches as controlled by the control device; and
selectively electrically connect the first adder capacitor to an electrical transmission bus as controlled by the control device;
the second adder switch is configured to:
selectively electrically connect the second adder capacitor to the electrical transmission bus concurrently with the first adder capacitor as controlled by the control device sharing the plurality of single-bit MAC outputs between the first adder capacitor and the second adder capacitor; and
selectively electrically connect the second adder capacitor to an analog to digital converter outputting the shared plurality of single-bit MAC outputs; and
the analog adder is configured such that outputting a multi-bit MAC output comprises outputting the shared plurality of single-bit MAC outputs.

7. The multi-bit MAC of claim 6, wherein the analog adder further comprises a buffer electrically connected between the plurality of single-bit MAC switches and the plurality of adder switches.

8. The multi-bit MAC of claim 1, further comprising a plurality of single-bit MAC switches, wherein a first single-bit MAC switch of the plurality of single-bit MAC switches is configured to selectively electrically connect a first single-bit MAC of the plurality of single-bit MACs and the first adder capacitor as controlled by a control device; and
wherein:
the first adder capacitor is configured such that receiving the plurality of single-bit MAC outputs from a plurality of single-bit MACs comprises receiving a first single-bit MAC output of the plurality of single-bit MAC outputs from the first single-bit MAC in response to the first single-bit MAC switch selectively electrically connecting the first single-bit MAC and the first adder capacitor;

the analog adder further comprises:
a second adder capacitor, wherein the first adder capacitor and the second adder capacitor have the same capacitance rating; and
an adder switch configured to selectively electrically connect the first adder capacitor and the second adder capacitor as controlled by the control device sharing the plurality of single-bit MAC outputs between the first adder capacitor and the second adder capacitor,
wherein the second adder capacitor is configured to output the shared plurality of single-bit MAC outputs to an analog to digital converter, wherein the analog adder is configured such that outputting a multi-bit MAC output comprises outputting the shared plurality of single-bit MAC outputs.

9. A method of multi-bit multiplication and accumulation, comprising:
adding a plurality of single-bit multiplier-accumulator (MAC) outputs by a first adder capacitor of an analog adder by:
receiving a plurality of single-bit MAC outputs from a plurality of single-bit MACs; and
storing the plurality of single-bit MAC outputs;
outputting a multi-bit MAC output based on addition of the stored plurality of single-bit MAC outputs by the analog adder;
sequentially multiplying individual bits of a first multi-bit value and a different single bit of a second multi-bit value, wherein the first multi-bit value and the second multi-bit value are represented by digital voltages; and
accumulating results of the multiplications to generate the plurality of single-bit MAC outputs, wherein the plurality of single-bit MAC outputs are analog voltages.

10. The method of claim 9, further comprising:
selectively electrically connecting a first single-bit MAC of the plurality of single-bit MACs and the first adder capacitor by a first single-bit MAC switch,
wherein receiving the plurality of single-bit MAC outputs from a plurality of single-bit MACs comprises receiving a first single-bit MAC output of the plurality of single-bit MAC outputs from the first single-bit MAC in response to selectively electrically connecting the first single-bit MAC and the first adder capacitor;
receiving the plurality of single-bit MAC outputs at an input end of an operational amplifier of the analog adder;
adding the plurality of single-bit MAC outputs producing a weighted average of the plurality of single-bit MAC outputs, wherein:
adding a plurality of single-bit MAC outputs comprises adding the plurality of single-bit MAC outputs producing the weighted average of the plurality of single-bit MAC outputs, and
storing the plurality of single-bit MAC outputs comprises storing the weighted average of the plurality of single-bit MAC outputs; and
outputting the weighted average of the plurality of single-bit MAC outputs as an analog voltage to an analog to digital converter,
wherein outputting a multi-bit MAC output comprises outputting the weighted average of the plurality of single-bit MAC outputs.

11. The method of claim 10, further comprising:
receiving the first single-bit MAC output by a first designated capacitor of the analog adder, wherein the first designated capacitor has a capacitor rating of $2^r$, wherein r is a location in a weight value of a bit multiplied by bits of an activation value used in producing the first single-bit MAC output;
weighting the first single-bit MAC output by the first designated capacitor; and
outputting the weighted first single-bit MAC output by the first designated capacitor,
wherein:
receiving the plurality of single-bit MAC outputs comprises receiving the weighted first single-bit MAC output; and
adding the plurality of single-bit MAC outputs comprises adding the weighted first single-bit MAC output.

12. The method of claim 9, further comprising:
selectively electrically connecting a first single-bit MAC of the plurality of single-bit MACs and the first adder capacitor by a first single-bit MAC switch,
wherein receiving the plurality of single-bit MAC outputs from a plurality of single-bit MACs comprises receiving a first single-bit MAC output of the plurality of single-bit MAC outputs from the first single-bit MAC in response to selectively electrically connecting the first single-bit MAC and the first adder capacitor;
selectively electrically connecting the first adder capacitor to the first single-bit MAC via the first single-bit MAC switch by a first adder switch;
weighting the first single-bit MAC output by the first adder capacitor, wherein:
the first adder capacitor has a capacitor rating of $2^r$, wherein r is a location in a weight value of a bit multiplied by bits of an activation value used in producing the first single-bit MAC output by the first single-bit MAC, and
storing the plurality of single-bit MAC outputs comprises storing the weighted first single-bit MAC output;
outputting the weighted first single-bit MAC output by the first adder capacitor; and
selectively electrically connecting the first adder capacitor to an electrical transmission bus concurrently with a second adder switch selectively electrically connecting a second adder capacitor to the electrical transmission bus outputting the weighted first single-bit MAC output by the first adder capacitor to the electrical transmission bus and producing a weighted average of a plurality of weighted single-bit MAC outputs including the weighted first single-bit MAC output,
wherein outputting a multi-bit MAC output comprises outputting the weighted average of the plurality of weighted single-bit MAC outputs.

13. The method of claim 12, further comprising a buffer electrically connected between the first single-bit MAC switch and the first adder switch.

14. The method of claim 9, further comprising:
selectively electrically connecting a first single-bit MAC of the plurality of single-bit MACs and the first adder capacitor by a first single-bit MAC switch,
wherein receiving the plurality of single-bit MAC outputs from a plurality of single-bit MACs comprises receiving a first single-bit MAC output of the plurality of single-bit MAC outputs from the first single-bit MAC in response to selectively electrically connecting the first single-bit MAC and the first adder capacitor;

selectively electrically connecting the first adder capacitor to the plurality of single-bit MACs via a plurality of single-bit MAC switches, including the first single-bit MAC switch, by a first adder switch of the analog adder;

selectively electrically connecting the first adder capacitor to an electrical transmission bus by the first adder switch;

selectively electrically connecting a second adder capacitor to the electrical transmission bus concurrently with the first adder capacitor by a second adder switch sharing the plurality of single-bit MAC outputs between the first adder capacitor and the second adder capacitor, wherein the first adder capacitor and the second adder capacitor have the same capacitance rating; and selectively electrically connecting the second adder capacitor to an analog to digital converter outputting the shared plurality of single-bit MAC outputs, wherein outputting a multi-bit MAC output comprises outputting the shared plurality of single-bit MAC outputs.

15. The method of claim 14, further comprising a buffer electrically connected between the plurality of single-bit MAC switches and the first adder switch.

16. The method of claim 9, further comprising:
selectively electrically connecting a first single-bit MAC of the plurality of single-bit MACs and the first adder capacitor by a first single-bit MAC switch,
wherein receiving the plurality of single-bit MAC outputs from a plurality of single-bit MACs comprises receiving a first single-bit MAC output of the plurality of single-bit MAC outputs from the first single-bit MAC in response to selectively electrically connecting the first single-bit MAC and the first adder capacitor;

selectively electrically connecting the first adder capacitor and a second adder capacitor by an adder switch sharing the plurality of single-bit MAC outputs between the first adder capacitor and the second adder capacitor, wherein the first adder capacitor and the second adder capacitor have the same capacitance rating; and outputting the shared plurality of single-bit MAC outputs from the second adder capacitor to an analog to digital converter, wherein outputting a multi-bit MAC output comprises outputting the shared plurality of single-bit MAC outputs.

17. A multi-bit multiplier-accumulator (MAC), comprising an analog adder having:
a plurality of adder capacitors, including a first adder capacitor; and
a plurality of single-bit MAC switches, including a first single-bit MAC switch configured to selectively electrically connect a first single-bit MAC of a plurality of single-bit MACs and the first adder capacitor as controlled by a control device;

wherein the first adder capacitor is configured to add a first plurality of single-bit MAC outputs by:
receiving the first plurality of single-bit MAC outputs from the first single-bit MAC in response to the first single-bit MAC switch selectively electrically connecting the first single-bit MAC and the first adder capacitor; and storing the first plurality of single-bit MAC outputs, and
wherein the analog adder is configured to output a multi-bit MAC output based on addition of the stored first plurality of single-bit MAC outputs.

18. The multi-bit MAC of claim 17, wherein:
the plurality of adder capacitors further comprises a second adder capacitor and a third adder capacitor, wherein a cumulative capacitance rating of a pair of the second adder capacitor and the third adder capacitor is the same as a capacitance rating of the first adder capacitor; and the analog adder further comprises a plurality of adder switches, including:
a first adder switch configured to selectively electrically connect the first adder capacitor and the second adder capacitor as controlled by the control device sharing the first plurality of single-bit MAC outputs between the first adder capacitor and the second adder capacitor;

a second adder switch configured to selectively electrically connect the second adder capacitor and the third adder capacitor as controlled by the control device sharing the shared first plurality of single-bit MAC outputs between the second adder capacitor and the third adder capacitor, wherein the third adder capacitor is configured to weight the shared first plurality of single-bit MAC outputs; and a third adder switch configured to selectively electrically connect the third adder capacitor to an analog to digital converter via an electrical transmission bus as controlled by the control device outputting the weighted shared first plurality of single-bit MAC outputs to the analog to digital converter concurrently with another third adder capacitor of the plurality of adder capacitors outputting a weighted shared second plurality of single-bit MAC outputs to the analog to digital converter via the electrical transmission bus combining the weighted shared first plurality of single-bit MAC outputs and the weighted shared second plurality of single-bit MAC outputs into a weighted average of the shared pluralities of single-bit MAC outputs; and the analog adder is configured such that outputting a multi-bit MAC output comprises outputting the weighted average of the shared pluralities of single-bit MAC outputs.

19. The multi-bit MAC of claim 17, wherein:
the plurality of adder capacitors further comprises a second adder capacitor; and
the analog adder further comprises a plurality of adder switches, including:
a first adder switch configured to selectively electrically connect the first adder capacitor and the second adder capacitor as controlled by the control device sharing the first plurality of single-bit MAC outputs between the first adder capacitor and the second adder capacitor, and
a second adder switch configured to selectively electrically connect the second adder capacitor to a third adder capacitor as controlled by the control device via an electrical transmission bus.

20. The multi-bit MAC of claim 19, wherein:
the first adder switch is configured such that selectively electrically connecting the first adder capacitor and the second adder capacitor as controlled by the control device sharing the first plurality of single-bit MAC outputs between the first adder capacitor and the second adder capacitor comprises dividing the first plurality of single-bit MAC outputs in half for each of the first adder capacitor and the second adder capacitor;
the analog adder is further configured to clear the first adder capacitor of the half of the first plurality of single-bit MAC outputs; and
the first adder switch is further configured to selectively electrically connect the first adder capacitor and the second adder capacitor as controlled by the control device sharing the half of the first plurality of single-bit MAC outputs between the first adder capacitor and the second adder capacitor dividing the half of the first plurality of single-bit MAC outputs in half for each of the first adder capacitor and the second adder capacitor producing a plurality of a quarter of the first plurality of single-bit MAC.

21. The multi-bit MAC of claim 19, wherein the plurality of adder switches further comprises a third adder switch, wherein the third adder switch is configured to selectively electrically connect a fourth adder capacitor and the third adder capacitor as controlled by the control device while the second adder switch selectively electrically connects the second adder capacitor and the third adder capacitor.

22. The multi-bit MAC of claim 19, wherein the plurality of adder switches further comprises a third adder switch, wherein the third adder switch is configured to selectively electrically disconnect a fourth adder capacitor and the third adder capacitor as controlled by the control device while the second adder switch selectively electrically connects the second adder capacitor and the third adder capacitor.

23. A method of multi-bit multiplication and accumulation, comprising:
selectively electrically connecting a first single-bit multiplier-accumulator (MAC) of a plurality of single-bit MACs and a first adder capacitor of a plurality of adder capacitors by a first single-bit MAC switch of a plurality of single-bit MAC switches;
adding a first plurality of single-bit MAC outputs by:
receiving the first plurality of single-bit MAC outputs from the first single-bit MAC in response to the first single-bit MAC switch selectively electrically connecting the first single-bit MAC and the first adder capacitor; and
storing the first plurality of single-bit MAC outputs; and
outputting a multi-bit MAC output based on addition of the stored first plurality of single-bit MAC outputs.

24. The method of claim 23, further comprising:
selectively electrically connecting the first adder capacitor and a second adder capacitor of the plurality of adder capacitors by a first adder switch of a plurality of adder switches sharing the first plurality of single-bit MAC outputs between the first adder capacitor and the second adder capacitor;
selectively electrically connecting the second adder capacitor and a third adder capacitor of the plurality of adder capacitors by a second adder switch of the plurality of adder switches sharing the shared first plurality of single-bit MAC outputs between the second adder capacitor and the third adder capacitor, wherein a cumulative capacitance rating of a pair of the second adder capacitor and the third adder capacitor is the same as a capacitance rating of the first adder capacitor;
weighting the shared first plurality of single-bit MAC outputs by the third adder capacitor; and
selectively electrically connecting the third adder capacitor to an analog to digital converter via an electrical transmission bus by a third adder switch of the plurality of adder switches outputting the weighted shared first plurality of single-bit MAC outputs to the analog to digital converter concurrently with another third adder capacitor of the plurality of adder capacitors outputting a weighted shared second plurality of single-bit MAC outputs to the analog to digital converter via the electrical transmission bus combining the weighted shared first plurality of single-bit MAC outputs and the weighted shared second plurality of single-bit MAC outputs into a weighted average of the shared pluralities of single-bit MAC outputs,
wherein outputting a multi-bit MAC output comprises outputting the weighted average of the shared pluralities of single-bit MAC outputs.

25. The method of claim 23, further comprising:
selectively electrically connecting the first adder capacitor and a second adder capacitor of the plurality of adder capacitors by a first adder switch of a plurality of adder switches sharing the first plurality of single-bit MAC outputs between the first adder capacitor and the second adder capacitor; and
selectively electrically connecting the second adder capacitor to a third adder capacitor of the plurality of adder capacitors via an electrical transmission bus by a second adder switch of the plurality of adder switches.

26. The method of claim 25, wherein selectively electrically connecting the first adder capacitor and the second adder capacitor sharing the first plurality of single-bit MAC outputs between the first adder capacitor and the second adder capacitor comprises dividing the first plurality of single-bit MAC outputs in half for each of the first adder capacitor and the second adder capacitor,
the method further comprising:
clearing the first adder capacitor of the half of the first plurality of single-bit MAC outputs; and
selectively electrically connecting the first adder capacitor and the second adder capacitor as controlled by the first adder switch sharing the half of the first plurality of single-bit MAC outputs between the first adder capacitor and the second adder capacitor dividing the half of the first plurality of single-bit MAC outputs in half for each of the first adder capacitor and the second adder capacitor producing a plurality of a quarter of the first plurality of single-bit MAC.

27. The method of claim 25, further comprising selectively electrically connecting a fourth adder capacitor of the plurality of adder capacitors and the third adder capacitor by a third adder switch of the plurality of adder switches while the second adder switch selectively electrically connects the second adder capacitor and the third adder capacitor.

28. The method of claim 25, further comprising selectively electrically disconnecting a fourth adder capacitor of the plurality of adder capacitors and the third adder capacitor by a third adder switch of the plurality of adder switches while the second adder switch selectively electrically connects the second adder capacitor and the third adder capacitor.

* * * * *